United States Patent
Hashimoto et al.

(10) Patent No.: US 7,942,619 B2
(45) Date of Patent: May 17, 2011

(54) CARRIER UNIT OF SUBSTRATE TRANSFER APPARATUS

(75) Inventors: Yasuhiko Hashimoto, Kobe (JP); Masao Takatori, Kobe (JP); Yasuo Hirooka, Akashi (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 0 days.

(21) Appl. No.: 11/808,358

(22) Filed: Jun. 8, 2007

(65) Prior Publication Data

US 2007/0286711 A1    Dec. 13, 2007

(30) Foreign Application Priority Data

Jun. 12, 2006 (JP) ................. 2006-162784

(51) Int. Cl.
*H01L 21/677* (2006.01)
(52) U.S. Cl. ...................................... 414/217; 414/411
(58) Field of Classification Search .................. 414/217, 414/411, 217.1
See application file for complete search history.

(56) References Cited

U.S. PATENT DOCUMENTS

| | | | | |
|---|---|---|---|---|
| 5,655,869 A | * | 8/1997 | Scheler et al. | 414/222.01 |
| 5,984,610 A | * | 11/1999 | Rush et al. | 414/416.01 |
| 6,138,721 A | * | 10/2000 | Bonora et al. | 141/98 |
| 6,220,808 B1 | * | 4/2001 | Bonora et al. | 414/217 |
| 6,382,895 B1 | * | 5/2002 | Konishi et al. | 414/217 |
| 6,592,318 B2 | * | 7/2003 | Aggarwal | 414/217.1 |
| 6,634,851 B1 | * | 10/2003 | Bonora et al. | 414/744.3 |
| 6,704,998 B1 | * | 3/2004 | Bonora et al. | 29/700 |
| 7,217,076 B2 | * | 5/2007 | Bonora et al. | 414/217.1 |
| 7,244,088 B2 | * | 7/2007 | Lero et al. | 414/416.08 |
| 2003/0044261 A1 | * | 3/2003 | Bonora et al. | 414/217.1 |
| 2003/0044268 A1 | | 3/2003 | Bonora et al. | |
| 2004/0144316 A1 | | 7/2004 | Lee et al. | |
| 2004/0165973 A1 | * | 8/2004 | Lee et al. | 414/217 |

(Continued)

FOREIGN PATENT DOCUMENTS

EP    1 701 378 A2    9/2006

(Continued)

OTHER PUBLICATIONS

European Search Report dated Dec. 10, 2009.

(Continued)

*Primary Examiner* — Saúl J Rodríguez
*Assistant Examiner* — Jonathan D Snelting
(74) *Attorney, Agent, or Firm* — Oliff & Berridge, PLC

(57) ABSTRACT

In the present invention, a base 43 of a robot 27 is fixed to a fixing portion 53 of a frame divided body 50. The base 43 allows force exerted from a robot main body 27A to be transmitted to the fixing portion 53 of the frame divided body 50. Contrary, the fixing portion 53 of the frame divided body 50 has rigidity which can prevent the force exerted from the base 43 of the robot 27 from being transmitted to a main body constituting member 51. Accordingly, the base 43 of the robot 27 has only to possess a function for connecting the robot main body 27A and the frame divided body 50. Therefore, even though reducing its rigidity, transmission of vibration to the wafer processing apparatus can be prevented, as well as occurrence of malfunctioning in the substrate processing work can be prevented. In addition, increasing the rigidity of the frame divided body 50 can be achieved easier with a simpler construction and more effective than increasing the rigidity of the robot. Accordingly, more secured wafer processing can be provided.

21 Claims, 29 Drawing Sheets

U.S. PATENT DOCUMENTS

2005/0063797 A1* 3/2005 Lero et al. .................... 414/217
2006/0045665 A1 3/2006 Hall et al.

FOREIGN PATENT DOCUMENTS

| JP | A-2004-200669 | 7/2004 |
|---|---|---|
| JP | A-2005-520321 | 7/2005 |
| JP | A 2005-525688 | 8/2005 |
| KR | 1020040067634 A | 7/2004 |
| WO | WO 01/24233 A1 | 4/2001 |
| WO | WO 03/009347 A2 | 1/2003 |
| WO | WO 03/019630 A2 | 3/2003 |
| WO | WO 2006/006377 A1 | 1/2006 |

OTHER PUBLICATIONS

Japanese Office Action issued Jul. 27, 2010 with English translation.

* cited by examiner

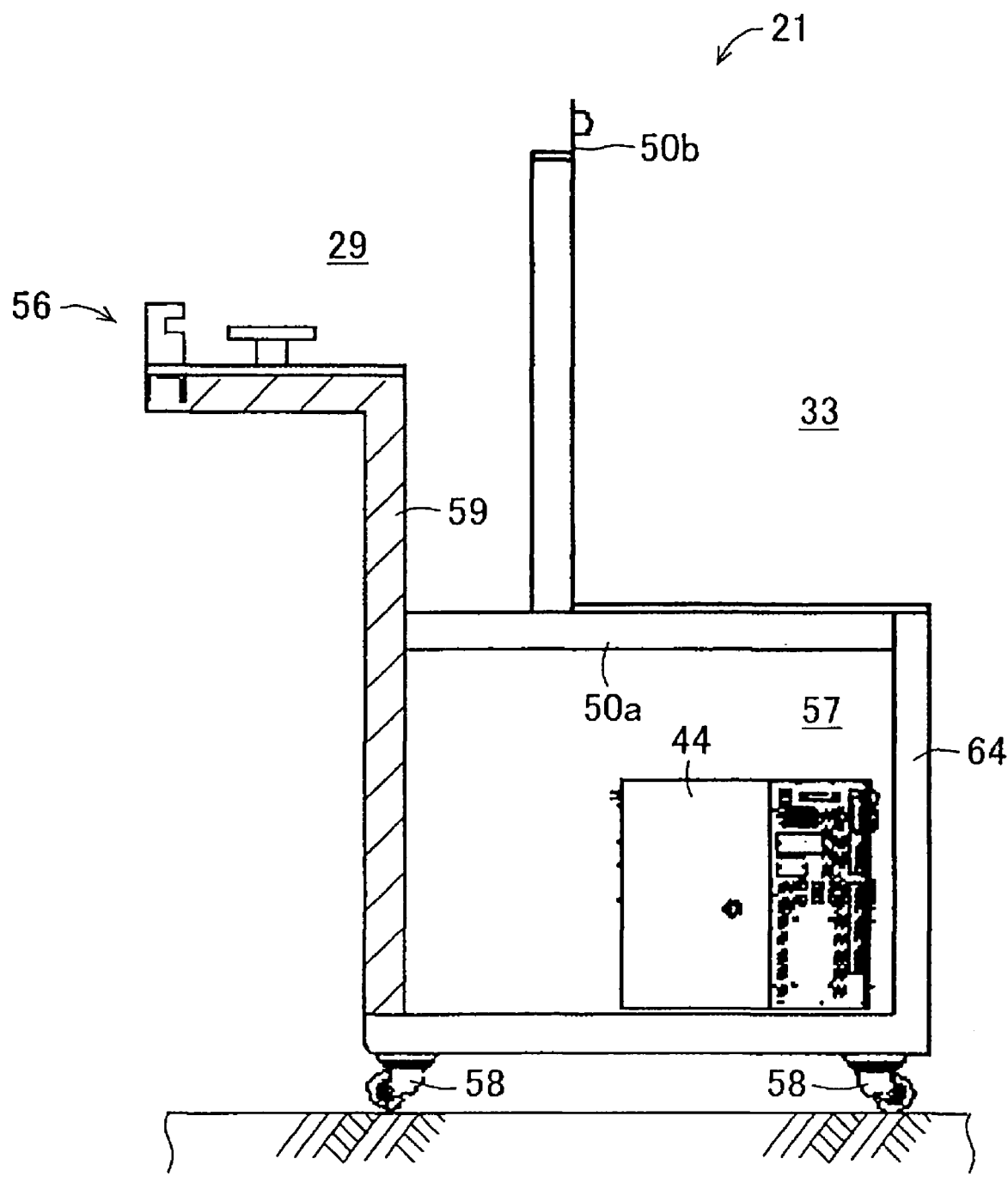
F I G. 8

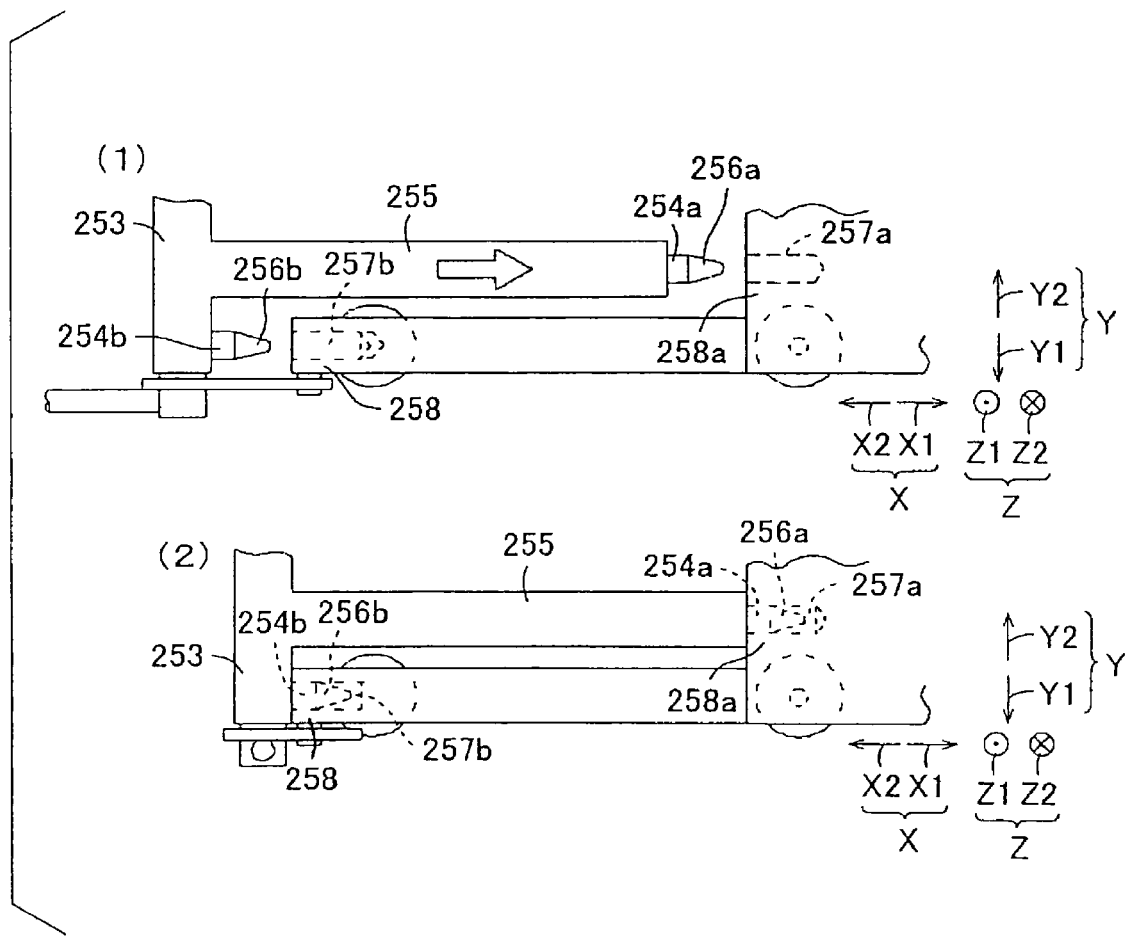
F I G . 9

CARRIER UNIT OF SUBSTRATE TRANSFER APPARATUS

CROSS REFERENCE TO RELATED APPLICATIONS

This application is based upon the prior Japanese Patent Application No. 2006-162784 filed on Jun. 12, 2006, the entire contents of which are incorporated herein by reference.

BACKGROUND OF THE INVENTION

1. Field of the Invention

The present invention relates to a carrier unit which is a part of a substrate transfer apparatus provided in a substrate processing equipment and adapted to carry in and carry out substrates. Particularly, the present invention relates to a carrier unit of an equipment front end module (EFEM) which is a substrate transfer apparatus provided in a semiconductor processing equipment.

2. Description of the Related Art

FIG. 31 is a section showing a part of semiconductor processing equipment 1 of the related art. The semiconductor processing equipment 1 is configured to include a wafer processing apparatus 2 and a wafer transfer apparatus 3. The internal space of the semiconductor processing equipment 1 is filled with an atmospheric gas which is kept at a predetermined cleanliness level. Thus, attachment of foreign matters floating in the atmosphere to wafers 4 to be processed in this system can be prevented. The semiconductor wafer 4 are carried into the semiconductor processing equipment 1 while being contained in a front opening unified pod (also merely referred to as a "FOUP") 5 which is a substrate container.

The wafer transfer apparatus 3 takes unprocessed wafers 4 out of the FOUP 5, transfers the taken-out wafers 4 through a ready space 9, and then supplies them to the wafer processing apparatus 2. In addition, the wafer transfer apparatus 3 takes processed wafers 4 out of the wafer processing apparatus 2, transfers the taken-out wafers 4 through the ready space 9, and then brings them contained again in the FOUP 5. Specifically, the wafer transfer apparatus 3 includes a FOUP opener 6 (hereinafter, referred to as an opener 6), a robot 7, and ready space forming walls forming the ready space 9. The internal space 12 of the FOUP and ready space 9 are made airtight against the external space 13 and maintained such that very few dust particles exist therein, respectively.

In the main frame 8 which constitutes a part of the ready space forming walls, a wafer-side opening is formed through which each wafer 4 can be passed. The opener 6 is secured to the main frame 8, and a FOUP supporting portion 11 is provided for supporting the FOUP 5 in the external space 13. The opener 6 has an opener-side door adapted to close the wafer-side opening to tightly shut the ready space 9 against the external space.

The opener 6 serves to make the space 12 in the FOUP be in communication with the ready space 9 by opening a FOUP-side door of the FOUP 5 and the opener-side door of the opener 6 while preventing the outside air from flowing into the spaces. In this state, the robot 7 carries each wafer 4 from the FOUP 5 into the wafer processing apparatus 2, as well as carries it from the wafer processing apparatus 2 into the FOUP 5. On the other hand, when the opener 6 closes both of the FOUP-side door and the opener-side door, the internal space 12 of the FOUP 5 and the ready space 9 are shut tightly against the outside air, thus separating the FOUP 5 from the semiconductor processing apparatus 1.

In the related art disclosed in Japanese Patent Laid-Open Publication No. 2005-525688, the main frame 8 includes a front face 8a to which parts constituting the opener 6 are secured. Also, the main frame 8 has a rear face 8b to which parts constituting the robot 7 are secured.

The robot 7 of the wafer transfer apparatus 3 according for supporting a robot hand greater, in order to prevent the reaction force associated with the force to be generated due to operation of the robot hand upon transferring each wafer from being transmitted to the main frame 8 of the wafer transfer apparatus 3. Namely, due to such configuration, the transmission of the reaction force associated with the force to be generated from the robot hand to the main frame 8 can be prevented.

In the related art described above, the base 10 of the robot 7 is designed to have higher rigidity in any given direction along which the base would be fixed in order to have the robot 7 transfer each substrate, irrespectively of the state of being fixed to the main frame 8. Consequently, the number of parts enlarged. In addition, because of the need to have greater rigidity in many directions, the production cost of the robot 7 must be increased.

Furthermore, even though making the rigidity of the base frame 8 is insufficient, the amount of deformation of the main frame 8 caused by force to be exerted from the robot 7 may tend to exceed a predetermined allowable amount of deformation, leading to undesired displacement of the robot hand, thus causing malfunctioning in the wafer conveyance. Contrary, when the rigidity of the main frame 8 is unduely high, value needed. As a result, the quality concerning the vibration control of the wafer transfer apparatus 3 tends to be excessively high, which obstructs simplification of the structure, weight reduction as well as cost reduction. Such a problem can be commonly seen in other apparatuses than the wafer transfer apparatus, for example, glass substrate transfer apparatuses for carrying glass substrates.

SUMMARY OF THE INVENTION

Accordingly, it is an object of the present invention to provide a carrier unit of a wafer transfer apparatus which can prevent occurrence of malfunctioning in the wafer conveyance and simplify the structure of the substrate transfer apparatus.

The present invention is a carrier unit which constitutes a part of a substrate transfer apparatus adapted to carry substrates relative to a substrate processing apparatus, the carrier unit being adapted to be detachably attached to a main body constituting member which is a remainder of the substrate transfer apparatus, comprising:

(a) a frame body configured to be detachably attached to the main body constituting member;

(b) a robot for carrying a substrate, including a robot main body and a robot base portion adapted to fix the robot main body to the frame body;

(c) a substrate container opener fixed to the frame body, wherein the frame body is configured such that when the frame body is attached to the main body constituting member, the robot and the substrate container opener, both fixed to the frame body, are respectively located in positions to be arranged as parts of the substrate transfer apparatus, and wherein the frame body has a rigidity to prevent the robot base portion from being deformed beyond an allowable amount of robot deformation which is allowed upon transferring a substrate, when a force is exerted on the frame body from the robot main body via the robot base portion.

According to the present invention, the robot and the substrate container opener constitute a carrier unit while respectively fixed to the frame body. Due to the force generated by the robot main body, which is required for carrying each substrate, reaction force is exerted on the robot base portion from the robot main body. The robot base portion transmits the reaction force, which is exerted from the robot main body, to the frame body. The frame body, when the force is applied thereto from the robot main body via the robot base portion, has rigidity to prevent the robot base portion from being deformed beyond an allowable amount of robot deformation so as to compensate for the rigidity of the robot base portion.

Thus, even though the robot base portion transmits the force exerted thereon from the robot main body to the frame body, undesired displacement of the robot main body can be prevented upon transfer of each substrate, thereby providing stable substrate transfer.

According to the present invention mentioned above, because the robot base portion is not needed to have rigidity so high as that of the frame body, each constitutional element for the robot base portion can be simplified, and the structure of the robot base portion can be made easier, thus reducing the production cost of the robot. The increase of rigidity of the frame body can be achieved easier with a simpler construction and more effective than the increase of rigidity of the robot. Due to the increase of rigidity of the frame body, undesired displacement of the robot can be prevented, as well as malfunctioning due to the robot upon the substrate transfer can be avoided. Accordingly, even if decreasing the rigidity of the robot base portion, deterioration of the quality concerning the vibration control for the substrate transfer apparatus can be prevented, as well as simplification of the structure, reduction of the weight and lowering of the cost can be achieved while keeping the quality at a significantly acceptable level.

Preferably, the robot base portion has a rigidity to allow a deformation beyond the allowable amount of robot deformation, when a force is exerted on the robot base portion from the robot main body in a state where the robot base portion is not fixed to the frame body.

According to the present invention, the robot base portion has only to have rigidity which required for connecting the robot main body and the frame body with each other, thus enabling to reduce the rigidity of the robot base portion.

Preferably, the substrate container opener includes an opener main body and an opener base portion adapted to fix the opener main body to the frame body, the opener base portion allowing a force exerted from the opener main body to the opener base portion to be transmitted to the frame body. The frame body has a rigidity to prevent the opener base portion from being deformed beyond an allowable amount of opener deformation which is allowed upon transferring a substrate, when a force is exerted on the frame body from the opener main body via the opener base portion.

According to this invention, due to the force generated by the opener main body, which is required for carrying each substrate, reaction force is exerted on the opener base portion from the opener main body. The opener base portion transmits the reaction force exerted from the opener main body to the frame body. The frame body, when the force is applied thereto from the opener main body via the opener base portion, has rigidity to prevent the opener base portion from being deformed beyond an allowable amount of opener deformation so as to compensate for the rigidity of the robot base portion.

Thus, even though the opener base portion transmits the force exerted thereon from the opener main body to the frame body, undesired displacement of the opener main body can be prevented upon transfer of each substrate, thereby providing secured substrate transfer.

According to the present invention, because the opener base portion is not needed to have rigidity so high as that of the frame body, each constitutional element for the opener base portion can be simplified, and the structure of the opener base portion can be made easier, thus reducing the production cost of the opener. The increase of rigidity of the frame body can be achieved easier with a simpler construction and more effective than the increase of rigidity of the opener. Due to the increase of rigidity of the frame body, undesired displacement of the opener can be prevented, as well as malfunctioning due to the opener upon the substrate transfer can be avoided. Accordingly, even if decreasing the rigidity of the opener base portion, deterioration of the quality concerning the vibration control for the substrate transfer apparatus can be prevented, as well as simplification of the structure, reduction of the weight and lowering of the cost can be achieved while keeping the quality at a significantly appropriate level.

Preferably, the opener base portion has a rigidity to allow a deformation beyond the allowable amount of opener deformation, when a force is exerted on the opener base portion from the opener main body in a state where the opener base portion is not fixed to the frame body.

Accordingly, the opener base portion has only to have rigidity which required for connecting the opener main body and the frame body with each other, thus enabling to reduce the rigidity of the opener base portion.

Preferably, the opener main body has a container supporting portion adapted to support a substrate container in which substrates are contained.

Preferably, the frame body has a side face which is flush with a side face of the container supporting portion exposed into an external space of the substrate transfer apparatus.

According to this invention, since the frame body has a side face which is flush with a side face of the container supporting portion exposed into the external space of the substrate transfer apparatus, the frame body can be projected into the external space relative to the internal space, thus enabling increase of the size of the frame body, thereby securing the rigidity required for the frame body with ease. In the case of forming the frame body in the internal space, the internal space can be enlarged, thus increasing the number of parts and units which can be contained in the internal space.

According to the present invention, the frame body has a side face which is flush with a side face of the container supporting portion, of the substrate container opener, exposed into the external space of the substrate transfer apparatus. Consequently, the frame body can be enlarged without increasing the size of the internal space of the substrate transfer apparatus, thus securing the rigidity necessary for the frame body with ease. In addition, undesired displacement of the robot due to force exerted on the frame body from the opener main body can be securely prevented, thereby providing further ensured substrate transfer due to the robot.

Preferably, the robot and the substrate container opener are configured to be detachably attached to the frame body.

According to this invention, since the modules, such as the robot and the substrate container opener are configured detachably, if they are damaged, only the damaged modules can be exchanged. Therefore, the entire carrier unit is not needed to be exchanged, as such enhancing the utility.

Preferably, the robot base portion is fixed to a vertically extending face of the frame body.

According to this invention, when the robot carries each substrate in the horizontal direction, the robot base portion receives the force exerted from the robot main body mainly in the horizontal direction, and transmits the force received to the frame body. Therefore, due to the fixation of the robot base portion to the vertical plane of the frame body, the robot can be firmly connected to the frame body, thereby preventing unstable operation of the robot. Additionally, force to be generated from the robot main body can be adequately supported by the frame body.

Preferably, the carrier unit further comprises a partitioning body adapted to separate a movable space where a movable portion of the robot, which is movable relative to the frame body, is located, from a fixing space where the robot base portion, which is fixed to the frame body, is located, when the frame body is attached to the main body constituting member.

According to this invention, due to the separation of the movable space from the fixing space by using the partitioning body, migration of dust particles from the fixing space into the movable space can be prevented, thereby maintaining the movable space adequately clean. Moreover, due to such prevention of the migration of dust particles from the fixing space into the movable space, for the constructional elements, e.g., the robot base portion, arranged in the fixing space, surface treatment or covering for preventing generation and scatter of dust particles can be omitted, thereby saving the production cost.

Preferably, the frame body has an accessing door formed therein so that an external space of the substrate processing apparatus and the fixing space are in direct communication with each other when the accessing door is opened while the frame body is attached to the main body constituting member.

According to this invention, by opening the accessing door, a worker can advance directly into the fixing space from the external space without entering the movable space and carry out maintenance for each part arranged in the fixing space, thus enhancing the workability. Due to the prevention of migration of dust particles generated in the fixing space upon maintenance into the movable space by using the partition body, deterioration of cleanliness in the movable space can be controlled. Thus, the cleanliness in the movable space can be recovered in a shorter time after maintenance, as such enhancing the working efficiency.

Preferably, in the fixing space, an adjusting means for adjusting the substrate transfer apparatus is located adjacent to an opening of the accessing door.

According to this invention, by opening the accessing door, a worker can operate the adjusting means on the front side of the fixing space without entering deeply the fixing space, thus he or she can carry out the necessary work in the fixing space with ease. Since the worker is not needed to enter the fixing space to the interior, generation of dust particles in the fixing space can be suppressed, resulting in proper control of migration of such dust particles from the fixing space into the movable space.

Preferably, in a state where the carrier unit is separated from the main body constituting member, the carrier unit can perform an operation same as an operation when the carrier unit is operated as the part of the substrate transfer apparatus.

According to this invention, after completion of the carrier unit and prior to assembling it into the substrate transfer apparatus, the operational check thereof can be carried out for the substrate conveyance. Due to completion of the substrate transfer apparatus by attaching the carrier unit, for which the operational check has been already completed, to the main body constituting member, the operational check for the carrier unit after assembled into the substrate transfer apparatus can be simplified. Consequently, the wafer transfer apparatus can be operable in a shorter time after the carrier unit is assembled as the wafer transfer apparatus, as well as the quality can be enhanced.

The present invention is a substrate transfer apparatus comprising the aforementioned carrier unit of the substrate transfer apparatus.

According to the present invention, due to the provision of the substrate transfer apparatus comprising the carrier unit described above, the rigidity of the robot base portion can be significantly reduced. The increase of the rigidity of the frame body can be achieved easier with a simpler construction and more effective than the increase of rigidity of the robot.

The present invention is a carrier unit which constitutes a part of a substrate transfer apparatus adapted to carry substrates relative to a substrate processing apparatus, the carrier unit being adapted to be detachably attached to a main body constituting member which is a remainder of the substrate transfer apparatus, comprising:

(a) a frame body configured to be detachably attached to the main body constituting member;
(b) a robot for carrying a substrate, including a robot main body and a robot base portion adapted to fix the robot main body to the frame body; and
(c) a partitioning body adapted to separate a movable space where a movable portion of the robot, which is movable relative to the frame body, is located, from a fixing space where the robot base portion, which is fixed to the frame body, is located, when the frame body is attached to the main body constituting member.

According to the present invention, by separating the movable space from the fixing space by using the partitioning body, migration of dust particles from the fixing space into the movable space can be prevented, thereby maintaining the movable space in a cleaned state. Due to the prevention of migration of dust particles from the fixing space into the movable space, surface treatment or covering for preventing scatter of dust are not required for preventing occurrence of dust particles for the constructional elements, e.g., the robot base portion, arranged in the fixing space, thereby reducing the production cost. Due to the provision of such a partitioning body, malfunctioning of substrate transfer, which can attributed to attachment of dust particles upon substrate transfer, can be prevented, as well as the structure of the substrate transfer apparatus can be simplified.

Preferably, a treatment for reducing generation of dust particles is provided more positively to a portion of the robot exposed to the movable space than a portion of the robot exposed to the fixing space.

According to this invention, the portion of the robot exposed to the movable space corresponds to a portion of the robot exposed to the movable portion upon the substrate transfer, and such provision of the treatment for reducing generation of dust particles thereto can prevent dust particles to be generated from the portion of the robot exposed to the movable space from being attached to each substrate. On the other hand, even though the portion of the robot exposed to the fixing space is not subjected to such a treatment for reducing generation of dust particles, since it is located in the fixing space separated from the movable space due to the partitioning body, attachment, to each substrate, of dust particles to be generated from the portion of the robot exposed to the fixing space can be prevented. Accordingly, in this invention, because the extent of providing the treatment for reducing generation of dust particles to the portion of the robot exposed to the fixing space is not needed to be so high as that for the portion of the robot exposed to the movable space, in addition to the prevention of attachment of dust to each substrate, the robot can be simplified and the production cost can be reduced.

Preferably, the frame body has an accessing door formed therein so that an external space of the substrate processing apparatus and the fixing space are in direct communication with each other when the accessing door is opened while the frame body is attached to the main body constituting member.

According to the present invention, by opening the accessing door, a worker can advance directly into the fixing space from the external space without entering the movable space in order to carry out maintenance for each components arranged in the fixing space, as such enhancing the workability. Due to the prevention of migration of dust particles to be generated in the fixing space upon maintenance into the movable space by using the partitioning body, deterioration of the cleanliness in the movable space can be suppressed. Consequently, the cleanliness in the movable space can be recovered in a shorter time after maintenance, thereby to enhance the working efficiency.

Preferably, in the fixing space, an adjusting means for adjusting the substrate transfer apparatus is located adjacent to an opening of the accessing door.

According to this invention, by opening the assessing door, a worker can operate the adjusting means on the front side of the fixing space without entering deeply the fixing space, thus he or she can carry out the necessary work in the fixing space with ease. Since the worker is not needed to enter the fixing space to the interior, generation of dust particles in the fixing container can be suppressed, resulting in proper control of migration of such dust particles from the fixing space into the movable space.

BRIEF DESCRIPTION OF THE DRAWINGS

The above and other objects, features and advantages of the present invention will become more apparent from the following description taken in connection with the accompanying drawings, in which:

FIG. 8 is a section of the carrier unit 21 taken along line A8-A8 shown in FIG. 3;

FIG. 9 is an enlarged view of an attaching portion of a frame divided body 50;

DESCRIPTION OF THE PREFERRED EMBODIMENTS

Figure 1:
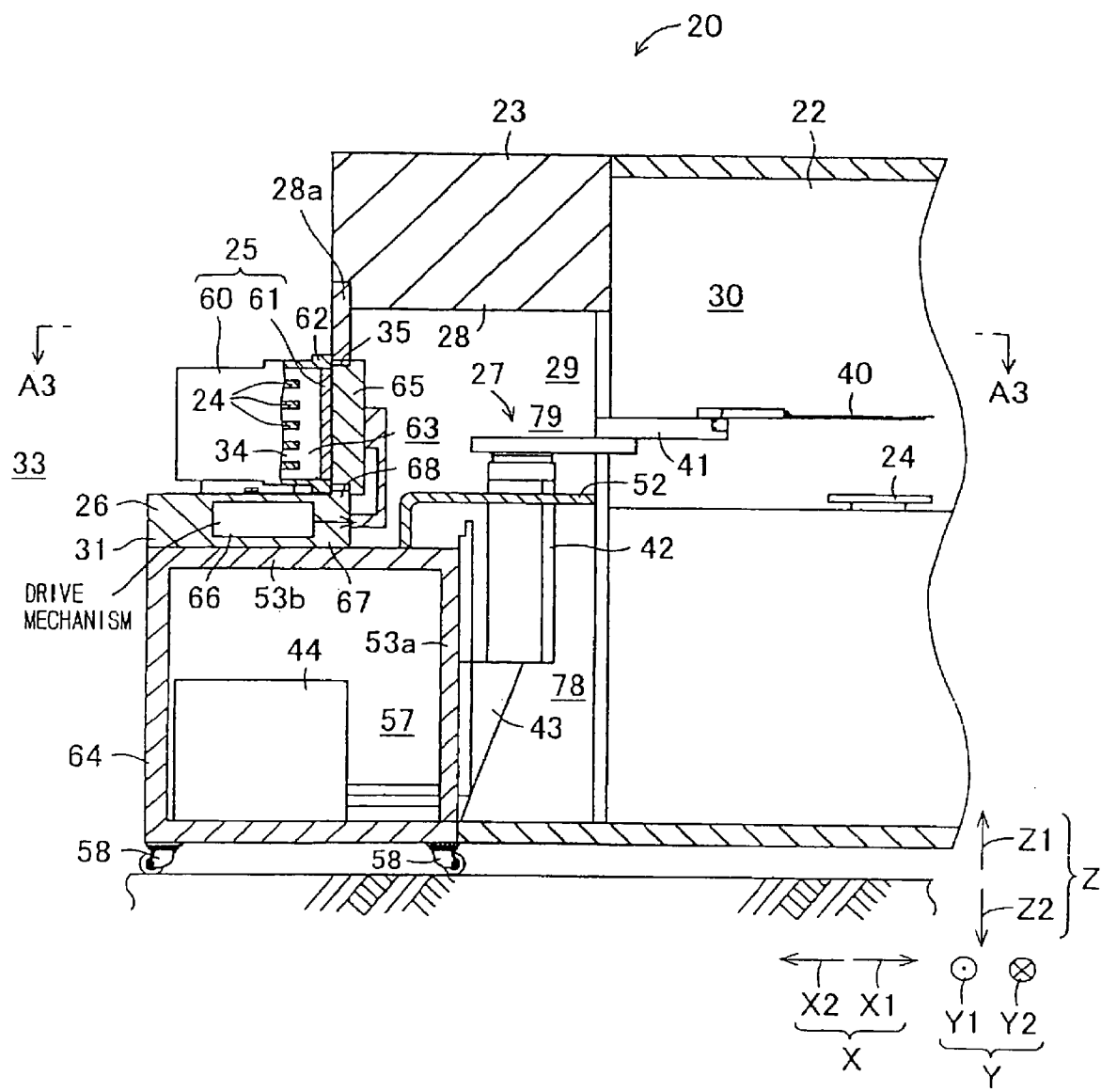
FIG. 1 is a section of semiconductor processing equipment 20 which is an embodiment of the present invention.
Figure 2:
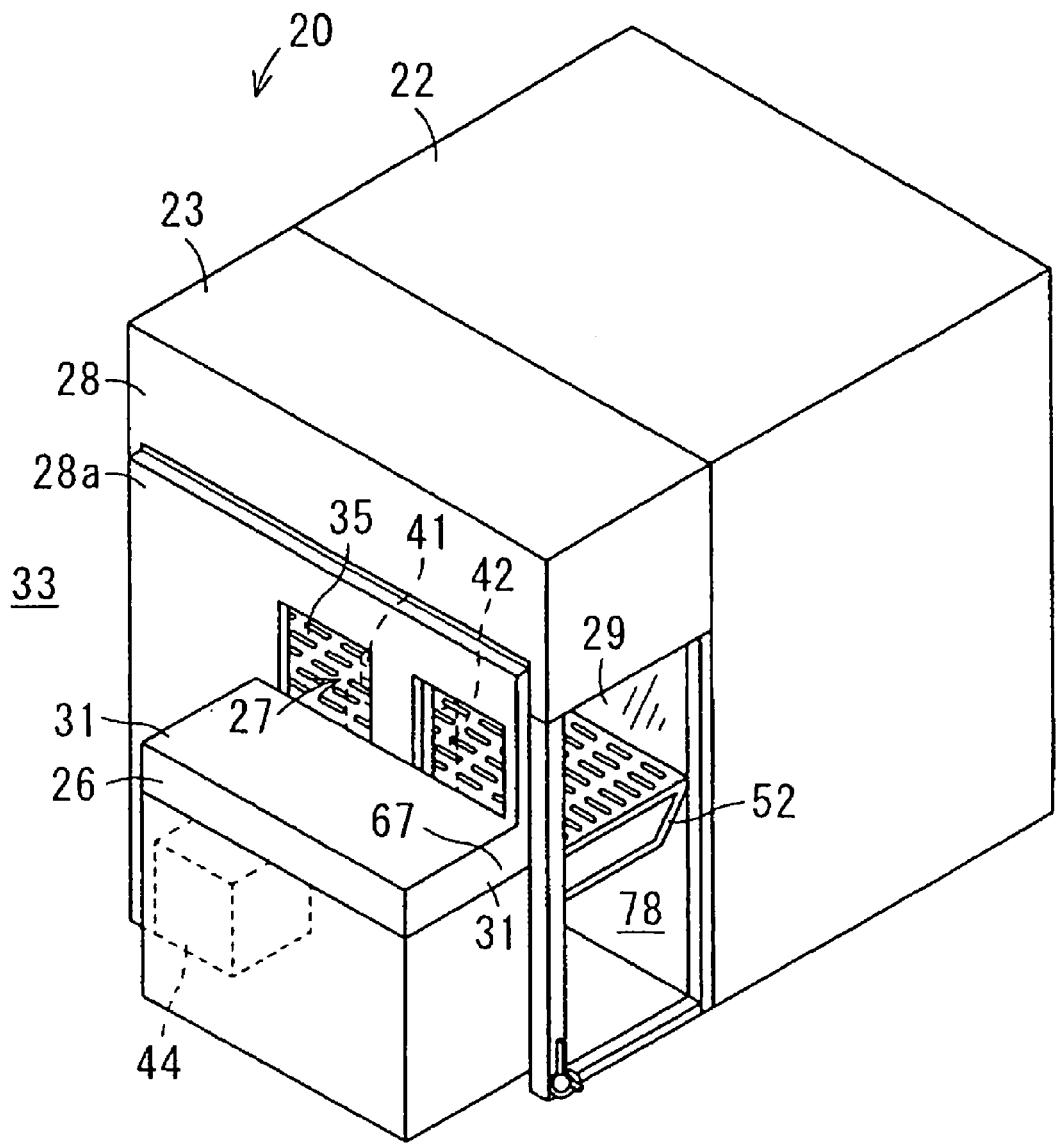
FIG. 2 is a perspective view showing the semiconductor processing equipment 20 with some simplification.
Figure 3:
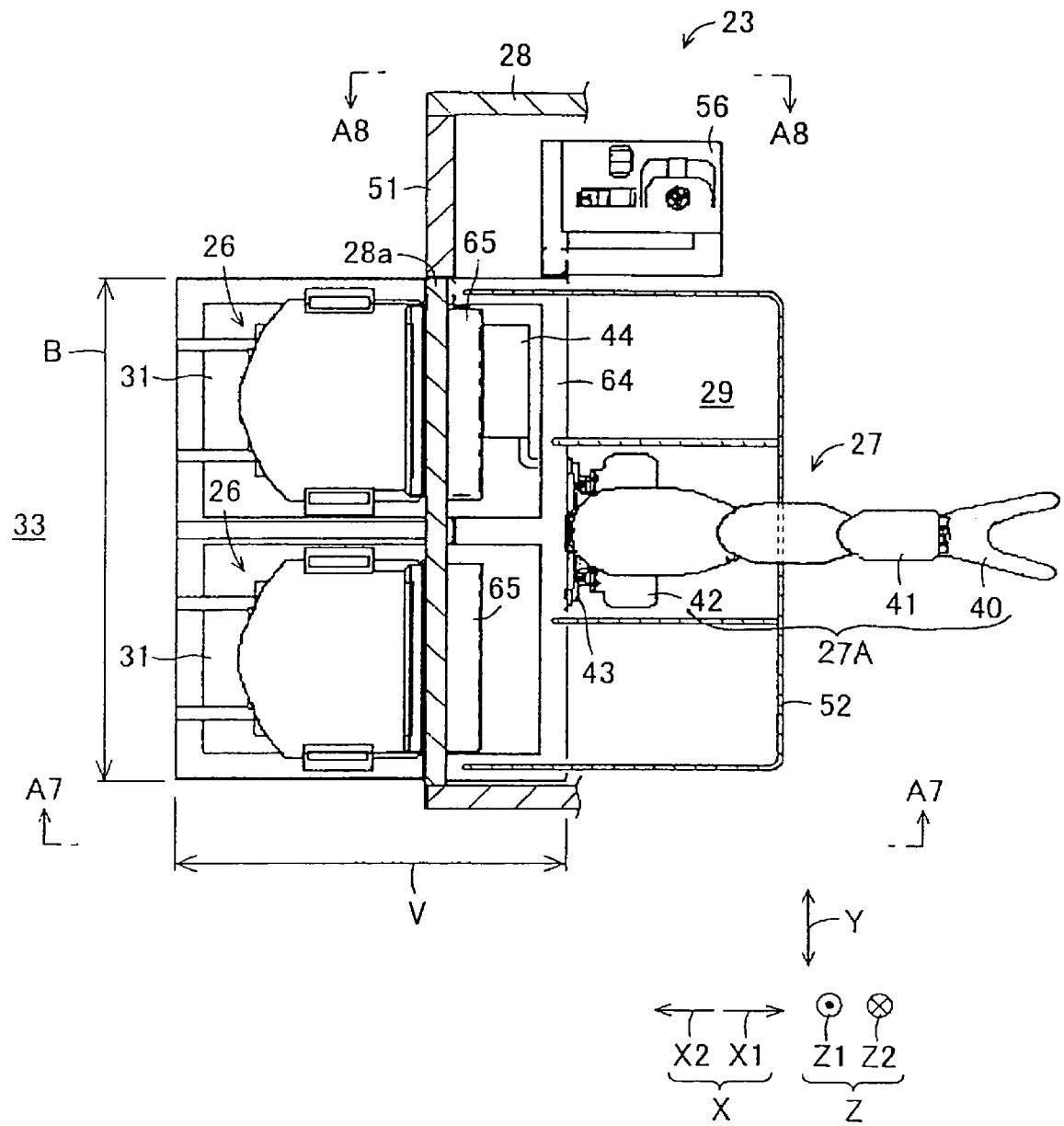
FIG. 3 is a section of the semiconductor processing equipment 20 taken along line A3-A3 shown in FIG. 1.

The semiconductor processing equipment 20 shown in FIGS. 1 to 3 as an embodiment of the present invention is configured to provide a predetermined process to each semiconductor wafer 24 which is a substrate to be processed. For example, as the process to be provided to the semiconductor wafer 24, various processes, such as heating, impurity doping, thin-film forming, lithography, cleaning or flattening, can be mentioned. However, it should be appreciated that the semiconductor processing equipment can be applied to other substrate processes than those described above.

The semiconductor processing equipment 20 performs the aforementioned process for each substrate in a processing chamber 30 filled with an atmospheric gas of a higher cleanliness. Each wafer 24 is carried into the semiconductor processing equipment 20, with multiple sheets of wafers being contained in a substrate container also referred to as a front opening unified pod (FOUP) 25.

Figure 4:
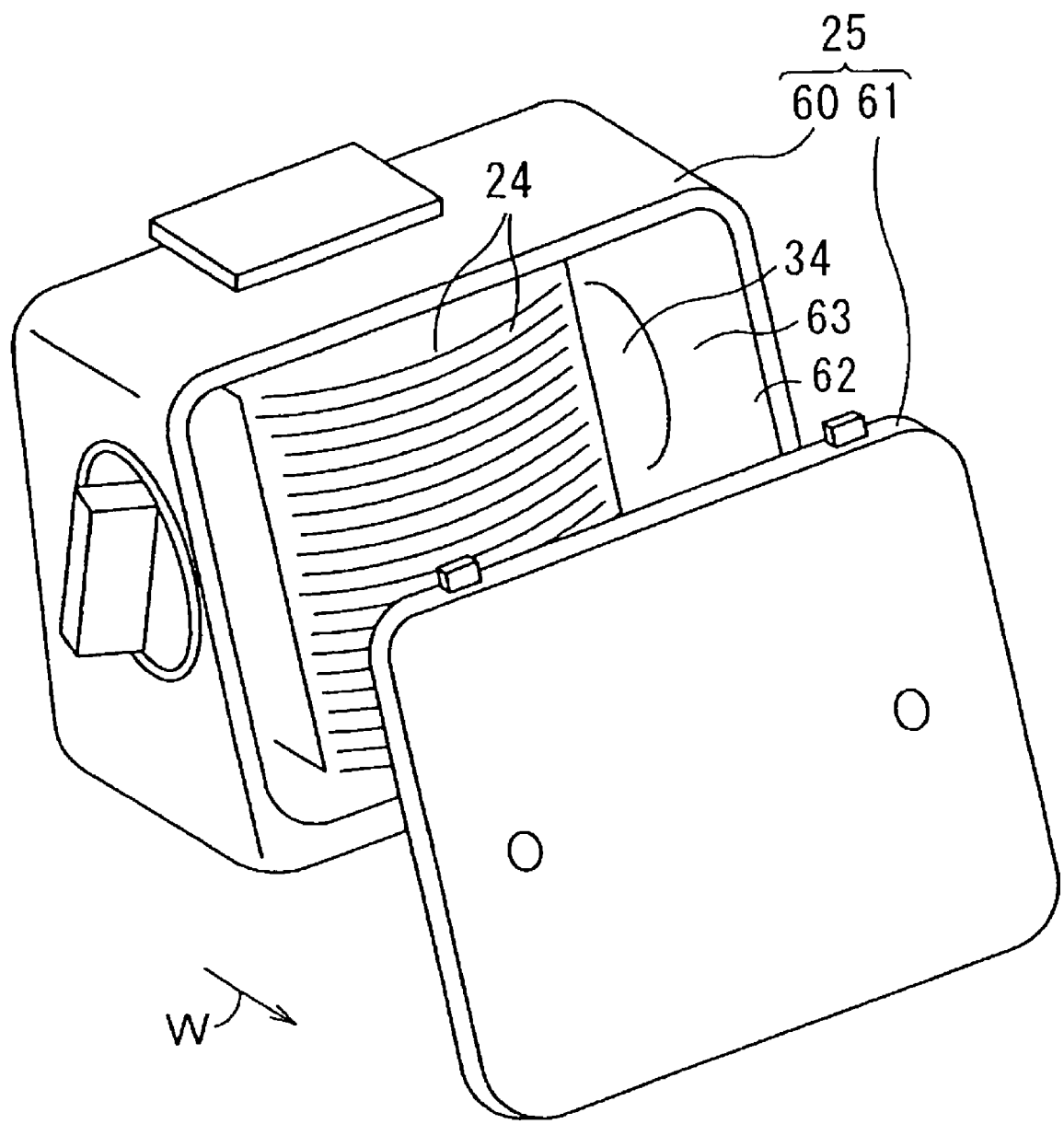
FIG. 4 is a perspective view showing a front opening unified pod (FOUP) 25.

As shown in FIG. 4, the FOUP 25 is configured to include a FOUP body 60 which is a container body in which the wafers 24 are contained, and a FOUP door 61 which is a container-side door formed detachably to the FOUP body 60. The FOUP body 60 is formed into a generally box-like shape which opens in a preset front face direction W, and a FOUP internal space 34 is defined as a wafer containing space. In the FOUP body 60, a FOUP-side opening 62 is formed to be exposed in the front face direction W. Due to the FOUP-side opening 62, a FOUP-side opening 63 is formed, defining a region on the side along the front face direction W of the FOUP internal space 34. The FOUP-side door 61 is formed into a plate-like shape, and is configured detachably relative to the FOUP body 60. The FOUP-side door 61 is attached to the FOUP body 60 to be in contact with the FOUP-side opening 62 so as to close the FOUP-side opening 62. Contrary, removal of the FOUP-side door 61 from the FOUP body 60 renders the FOUP-side opening 62 spaced away from the door 61 and opens the FOUP-side opening 62.

By attachment of the FOUP-side door 61 to the FOUP body 60, the FOUP internal space 34 to be formed in the FOUP body 60 is airtightly closed relative to the external space 33, thus preventing contaminants such as dust particles from entering the FOUP space 34. Accordingly, due to attachment of the FOUP door 61, with the FOUP internal space 34 controlled in a higher cleanliness state, the FOUP internal space 34 can be maintained in a highly cleaned state. On the other hand, by opening the FOUP body 60 using the FOUP door 61, the wafers 24 can be contained in the FOUP internal space 34 as well as can be taken out from the FOUP internal space 34.

As shown in FIGS. 1 and 2, the semiconductor processing equipment 20 is configured to include a wafer processing apparatus 22 and a wafer transfer apparatus 23. The wafer processing apparatus 22 provides a predetermined process to each wafer 24 in the processing space 30 described above. The wafer processing apparatus 22 includes, in addition to a processing apparatus main body adapted to provided a predetermined process to each wafer 24, a plurality of processing space forming walls constituting the processing space 30, a carrier unit for carrying each wafer 24 in the processing space 30, and a controlling unit for controlling the atmospheric gas filled in the processing space 30.

The wafer transfer apparatus 23 takes each unprocessed wafer 24 out of the FOUP 25 and supplied it into the wafer processing apparatus 22, while the wafer transfer apparatus 23 takes processed wafers 24 out of the wafer processing apparatus 22, and then brings them contained again in the FOUP 25. The wafer transfer apparatus 23 is also referred to as an equipment front end module (EFEM), and serves as an interface section adapted to transfer each wafer 24 between the FOUP 25 and the wafer processing apparatus 22. Each wafer 24 passes through a ready space 29 of a higher cleanliness, in which a predetermined atmospheric gas is filled, during its transfer between the wafer processing apparatus 22 and the processing space 30.

The wafer transfer apparatus 23 includes a plurality of ready space forming walls 28 constituting the ready space 29, a frame 64, a robot 27 which is located in the ready space 29 and able to carry each wafer, a FOUP opener 26 (hereinafter, referred to as an opener 26) adapted to open and close the FOUP 25, and a control unit for controlling the atmospheric gas to be filled in the ready space 29. In this embodiment, the wafer transfer apparatus 23 further includes an aligner 56 adapted to align the orientation of each wafer 24 held in a predetermined holding position.

The ready space forming walls 28 surround the ready space 29 so as to prevent the outside air from entering the ready space 29 from the external space 33. To the frame 64, respective carrying elements required for carrying each wafer 24 are secured. Specifically, in this embodiment, two openers 26, one robot 27, and one aligner 56 are secured, respectively, to the frame 64.

In such a manner, the FOUP 25 is intended to serve as a mini-environmental substrate container that can ensure to provide a clean environment for the locally cleaning technique. The opener 26 is an open and close apparatus for opening and closing the FOUP 29 and referred to as the so-called FOUP opener. A part of the construction of the FOUP 25 and opener 26 is prescribed, for example, in the SEMI (Semiconductor Equipment and Materials International) standard. In this case, for example, the FOUP 25 and opener 26 follow the specifications, including E47.1, E15.1, E57, E62, E63, E84, of the SEMI standard. It should be noted that even though the construction of the FOUP 25 and opener 26 does not fall within the SEMI standard, such construction may also be included in this embodiment.

Each opener 26 is configured to include a part of a front wall 28a, an opener-side door 65, a FOUP supporting portion 31, an opener-side door drive mechanism 66, and a base 67. The FOUP supporting portion 31 is located in the external space 33, which is outside both of the ready space 29 and the processing space 30, and adapted to support the FOUP 25 while it is carried. In this embodiment, the FOUP supporting portion 31 supports the FOUP 25 from below such that the FOUP 25 becomes horizontal when viewed in the front face direction W. The FOUP supporting portion 31 is configured to displace and drive the FOUP 25 in the front face direction W while supporting the FOUP 25, so as to position and support the FOUP 25 in a predetermined wafer transfer position. The base 67 of each opener 26 is fixed to the frame 64. Assuming that the portion other than the base 67 of each opener 26 is an opener main body, the opener main body is fixed to the frame 64 via the base 67.

Hereinafter, the direction corresponding to the front face direction to be defined by the FOUP 25 supported by the FOUP supporting portion 31 will be referred to as a forward direction X1, while the reverse direction to the forward direction X1 will be referred to as a backward direction X2. In addition, the directions including both of the forward direction X1 and backward direction X2 will be referred to as the forward and backward directions X. Furthermore, upward and downward directions will be expressed by Z, and the direction vertical to the forward and backward directions X as well as to the upward and downward directions Z will be referred to as left and right directions Y.

The front face wall 28a is a plate-like member constituting a part of the ready space forming walls 28. The space defined in the forward direction X1 from the front face wall 28a corresponds to the ready space 29, while the space defined in the backward direction X2 from the front face wall 28a corresponds to the external space 33. The front face wall 28a is located in the forward direction X1 relative to the FOUP 25 supported on the FOUP supporting portion 31, so as to face the FOUP-side opening 62. In this embodiment, the front face wall 28a extends vertically in the upward direction Z1 from a face of the FOUP supporting portion 31, on which the FOUP 25 is placed, as well as extends in the forward and backward directions X.

The robot 27 is achieved by using a horizontal articulated robot in this embodiment. The robot 27 is disposed in the ready space 29, and is configured to include a robot hand 40 which can grasp each wafer 24, a robot arm 41 adapted to displace and drive the robot hand 40, a vertical drive member 42 adapted to displace and drive the robot arm 41 in the upward and downward directions Z, a base 43 adapted to fix the vertical drive member 42 to the frame 64, and a controller 44 for controlling the robot arm 41 and the vertical drive member 42.

By controlling the robot arm 41 and the vertical drive member 42 due to the controller 44, each wafer 24 can be moved while being grasped by the robot hand 40. Now assuming that the portion other than the base 43 is a robot main body 27A, the robot main body 27A is fixed to the frame 64 via the base 43.

The robot hand 40 is advanced into the FOUP internal space 34 of the FOUP 25 while the FOUP 25 is opened by the openers 26, and grasps each wafer 24 contained in the FOUP 25. Subsequently, the robot hand 40 passes through the ready space 29, and is then advanced into the processing space 30 of the semiconductor processing apparatus 22, so as to transfer the grasped wafer 24 in a predetermined wafer locating position. Alternatively, the robot hand 40 enters the processing space 30, and grasps each wafer 24 which is held in the wafer locating position. Thereafter, the robot hand 40 passes through the ready space 29, and is then advanced into the FOUP internal space 34, so as to transfer the grasped wafer 24 to a containing position of the FOUP 25.

In this embodiment, since two openers 26 are provided, the robot hand 40 is set such that it can transfer each wafer 24 to and from each FOUP 25 supported by each FOUP supporting portion 31 of each opener 26. In addition, the robot hand 40 can locate each wafer 24 taken out of the FOUP 25 in a holding position which is set in the aligner 56, as well as can locate each wafer 24, which is pick out from the holding position of the aligner 56, in the processing apparatus 22. The vertical drive member 42 is configured to extend in the vertical direction while being fixed to the frame 64.

The aligner 56 has a holding portion for supporting each wafer 24, and is configured to rotate the wafer 24 held by the holding portion so as to align a notch or ori-flat formed in the wafer 24 with a predetermined direction. Accordingly, when the so-aligned wafer 24 is grasped by the robot hand 40, the wafer 24 can be located in the processing apparatus 22 with its orientation adjusted. In this way, the processing apparatus 22 can provide a predetermined process with the orientation of each wafer 24 being properly arranged.

Figure 5:
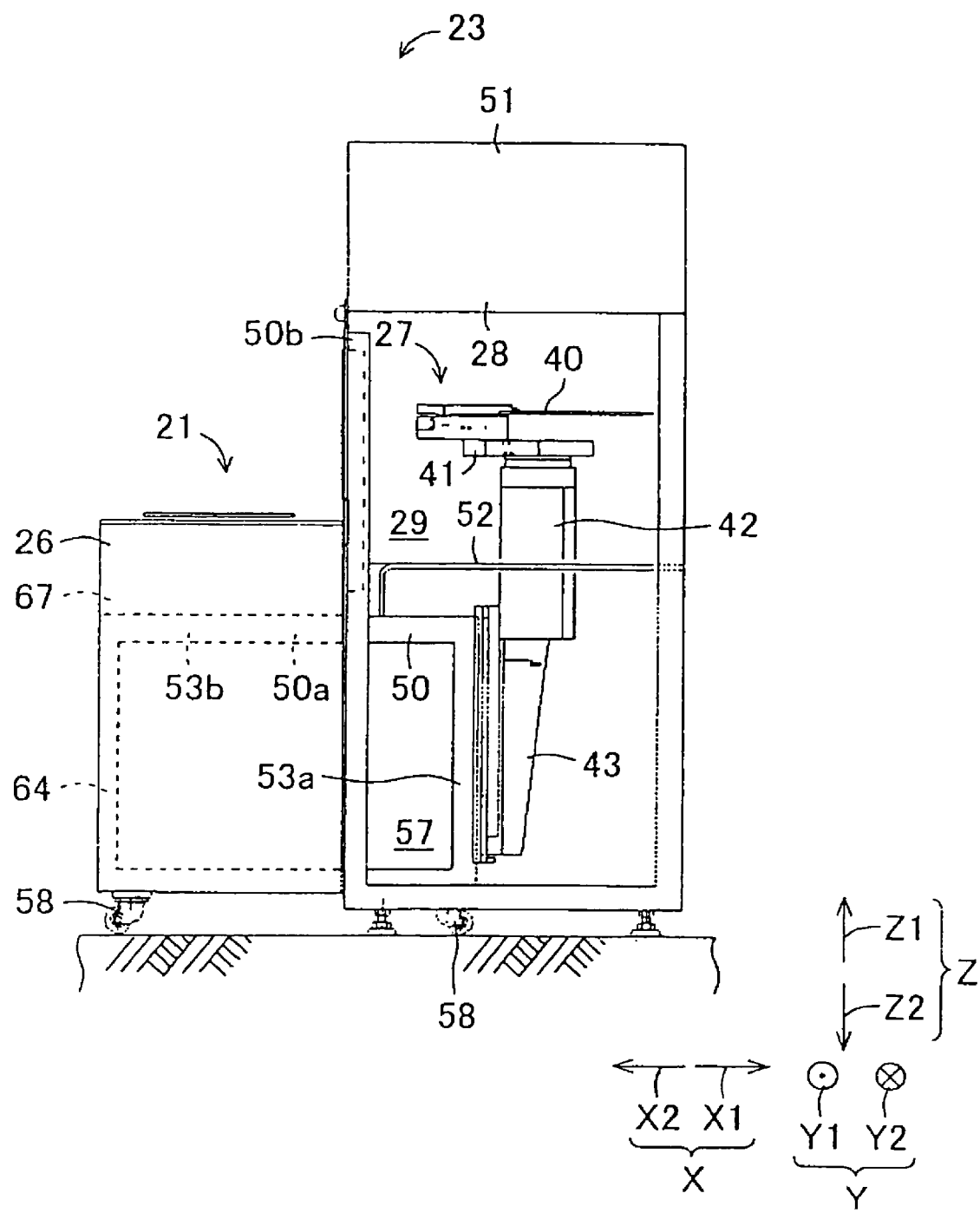
FIG. 5 is a side view showing a wafer transfer apparatus 23.
Figure 6:
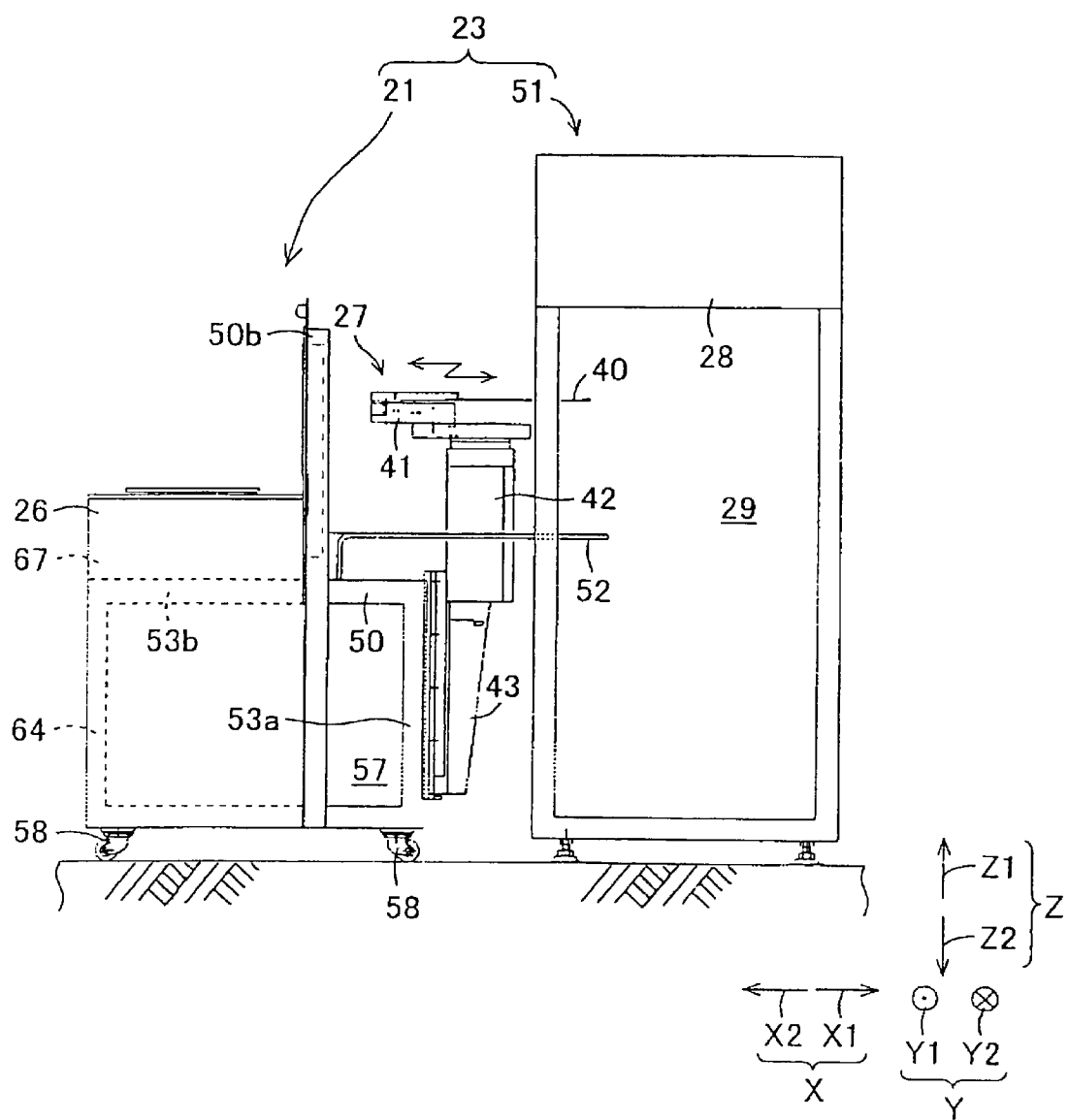
FIG. 6 is a side view of the wafer transfer apparatus 23, with a part thereof being separated from the remainder.

FIG. 5 is a side view showing the wafer transfer apparatus 23, and FIG. 6 is a side view showing a state in which a part of the wafer transfer apparatus 23 is separated from the remainder thereof. In FIGS. 5 and 6, a state in which the FOUP 25 is not mounted is depicted. In this embodiment, the wafer transfer apparatus 23 is configured such that it can be divided into a carrier unit 21 and a main body constituting member 51 which is the remainder other than the carrier unit 21. Specifically, the carrier unit 21 is formed to be detachable relative to the main body constituting member 51 of the wafer transfer apparatus 23, as such the wafer transfer apparatus 23 is completed by attaching the carrier unit 21 to the main body constituting member 51.

The main body constituting member 51 constitutes a part of the ready space forming walls 28 and is composed of a fan filter unit (FFU) and an indicating lamp. The main body constituting member 51 may be assembled not so accurately as the carrier unit 21. Contrary, the carrier unit 21 should be assembled at a higher accuracy required as all of mechanical carrying elements are incorporated therein.

The carrier unit 21 includes a frame divided body 50 which constitutes a part of the frame 64 of the wafer transfer apparatus 23, and carrier elements required for carrying each wafer 24. The carrier elements are fixed to the frame divided body 50, respectively. In this embodiment, the carrier elements may be the robot 27, the opener 26, and the aligner 56.

Each carrier element is controlled by the controller 44. The controller 44 may be extended such that it can also function, by adding functions as required, as a robot controller for controlling the robot 27, an opener driving controller for controlling the openers 26, an aligner driving controller for controlling the aligner 56, an EFEM controller for controlling the entire body of the wafer transfer apparatus, and an EFEM interlock.

As shown in FIGS. 5 and 6, the carrier unit 21 can be separated from the main body constituting member 51 even after the wafer transfer apparatus 23 is completed therewith. Specifically, the frame divided body 50 constitutes a part of the front face wall of the wafer transfer apparatus 23, and the frame divided body 50 is configured to close the front-face-side opening formed in the main body constituting member 51. The front-face-side opening is sized to be larger than the minimum contour of the robot 27 in its image to be obtained by projecting it onto the plane vertical to the wafer transfer directions X.

When the carrier unit 21 is separated from the main body constituting member 51 and moved to slide along the wafer transfer directions X, the robot 27 and openers 26 pass through the front-face-side opening of the main body constituting member 51, and the robot 27 and openers 26 are moved to the external space 33 from the ready space 29. Consequently, in the case of malfunctioning of the wafer transfer apparatus 23 or the like case, the operation of each carrier element 26, 27, 56 can be checked while each of the carrier elements 26, 27, 56 is moved in the external space 33. Namely, the operation of the robot 27 and openers 26 can be checked in a state where the carrier unit 21 is pulled in the wide external space 33 which is sufficiently wide as compared with the ready space 29. As a result, both detection and repair of a failure point can be facilitated. In addition, since assembly and maintenance of these elements can be made while they are pulled out from the ready space 29, each carrier element 26, 27, 56 included in the carrier unit 21 can be arranged closely and collectively, thus downsizing the ready space 29.

Each carrier component 26, 27, 56 is configured detachably relative to the frame divided body 50. Accordingly, when the robot 27 and/or FOUP openers 26 are damaged, only the damaged module can be exchanged. Therefore, the entire carrier unit is not needed to be exchanged, as such enhancing the utility.

Figure 7:
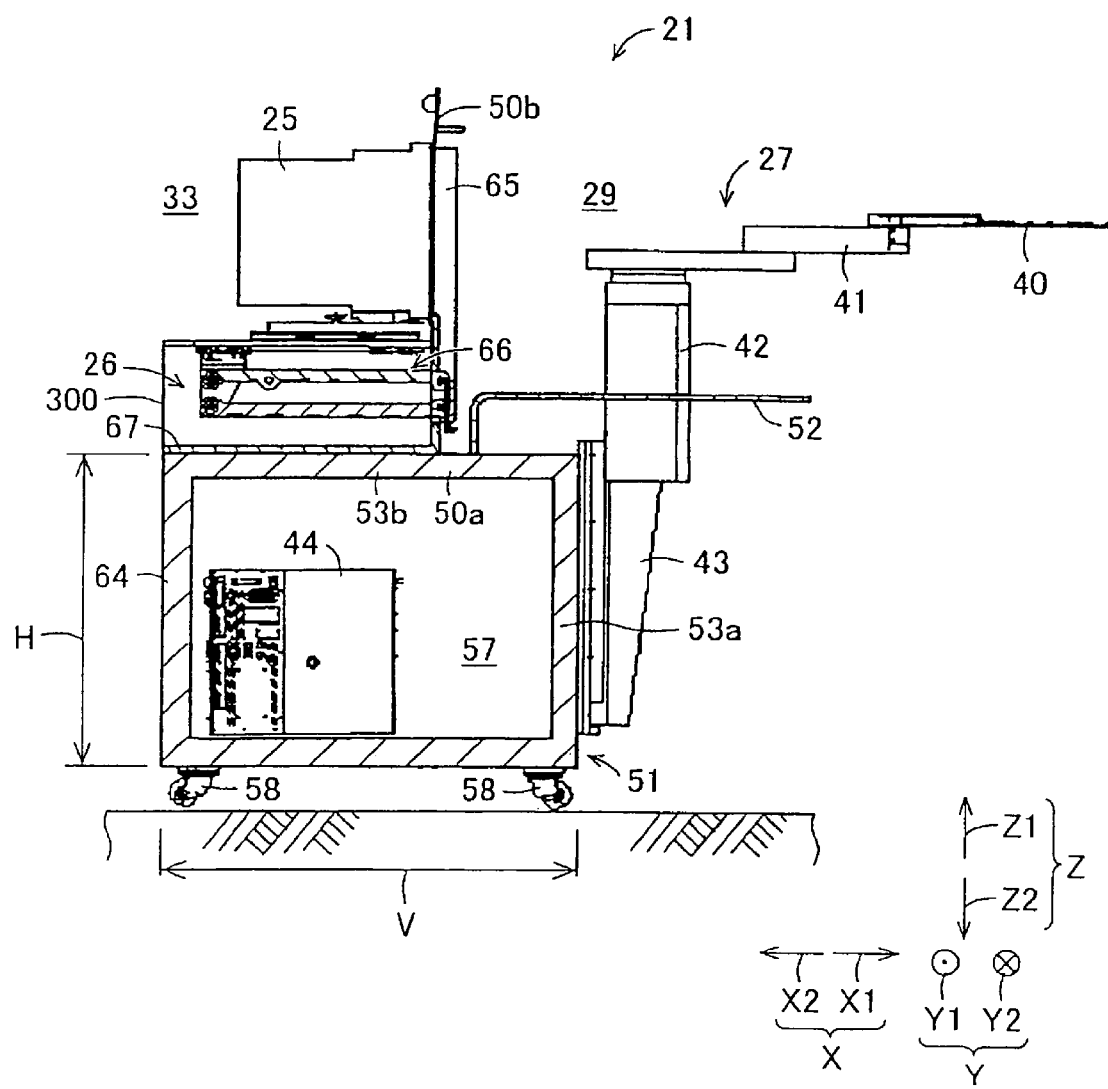
FIG. 7 is a section of a carrier unit 21 taken along line A7-A7 shown in FIG. 3.

FIG. 7 is a section showing the carrier unit 21 taken along line A7-A7 depicted in FIG. 3. In this embodiment, the frame divided body 50 includes a frame main body 50a formed into a cubic box surrounded by a plurality of plate-like members and a front face wall forming portion 50b forming a part of the front face wall 28a. In this frame divided body 50, the front face wall forming portion 50b supports a part of the front face wall formed in the openers, while constituting the front face wall. The front face wall forming portion 50b is formed to project upward from the frame main body 50a, and has an opener-side opening configured to form the opener-side aperture 35 through which the FOUP-side door 61 can be inserted.

The frame main body 50a is formed in a cubic shape. In this embodiment, the frame main body 50a is configured to include four side walls designed to define a square-frame-like section when sectioned by a plane perpendicular to the upward and downward directions Z, a top face closing the upper end of the square frame formed by the respective side walls, and a bottom face closing the lower end of the square frame. A pair of opposed side walls of the four side walls extend vertically along the left and right directions Y, while being spaced from each other with an interval, and the other pair of side walls extends vertically along the forward and backward directions X, while being spaced from each other with an interval. The frame main body 50a has an internal space 57 defined by the respective side walls, top face and bottom face. In the top face, an opening is formed, through which the opener-side door 65 can be moved out from and moved into the internal space 57.

The internal space 57 constitutes a part of a fixing space 78 included in the ready space 29 formed in the wafer transfer apparatus 23. The internal space 57 is formed at least in a region located below the openers 26. When the carrier unit 21 is attached to the main body constituting member 51, the frame main body 50a has a side face which is substantially flush with a side face 300 of the FOUP supporting portion 31 exposed to the external space 33 of the wafer transfer apparatus 23. In such a manner, in this embodiment, the frame main body 50a is formed to have a box-like structure using an H steel.

Among the four side walls, the side wall in the forward direction X1 or forward side wall serves as a robot fixing portion 53a adapted to fix the base 43 of the robot 27. The top face is designed to be an opener fixing portion 53b adapted to fix the base 67 of each opener 26. As such, the frame divided body 50 has the fixing portions 53a, 53b for respectively fixing the carrier elements, such as the robot 27 and the respective openers 26.

The base 43 of the robot 27 connects a fixing portion of the vertical drive member 42 and the robot fixing portion 53a together such that the vertical drive member 42 extends in the vertical direction and faces the frame main body 50a. Accordingly, the robot 27 is fixed to the frame main body 50a in the so-called side-mount fixing manner, i.e., it is fixed at its side portion to the frame main body 50a.

In this embodiment, the base 43 of the robot 27 is fixed to a central portion of the robot fixing portion 53a in the left and right directions Y. The base 43 of the robot 27 extends from one end to the other end of the robot fixing portion 53a in the upward and downward directions Z. The base 43 of the robot 27 is also fixed to the top end of the frame main body 50a in the upward direction Z1. Thus, the reaction force to be generated upon transfer of the robot hand 40 can be received by the frame main body 50a.

The base 67 of each opener 26 connects the bottom face of each FOUP supporting portion 31 of the opener 26 with the opener fixing portion 53b while the bottom face of the FOUP supporting portion 31 faces the top face of the frame main body 50a. Accordingly, each opener 26 is fixed to the frame main body 50a in the so-called bottom-mount fixing manner, i.e., it is fixed at its bottom portion to the frame main body 50a. In this embodiment, each FOUP supporting portion 31 is mounted onto the opener fixing portion 53b of the frame main body 50a via the base 67 of each opener 26. The opener fixing portion 53b supports the entire bottom face of each FOUP supporting portion 31.

In this embodiment, the base 43 of the robot 27 transmits force to be exerted from the robot main body 27A to the robot fixing portion 53a. Similarly, the base 67 of each opener 26 transmits force to be exerted from the opener main body to the opener fixing portion 53b. On the other hand, the frame main body 50a has rigidity sufficient to receive the external force to be exerted from the robot 27 and openers 26. In other words, the frame main body 50a is designed to sufficiently lessen deformation or impact caused by the external force to be exerted from the robot 27 and openers 26. Namely, the frame main body 50a has rigidity sufficient to prevent the robot base from being deformed beyond the amount of allowable deformation which is allowed upon transferring a substrate, in the state where the base 43 of the robot 27 and the base 67 of each opener 26 are respectively fixed to the frame main body 50a and in the case where external force is exerted to the frame main body 50a from the robot 27 and openers 26 via the respective bases 43, 67.

Accordingly, the frame divided body 50 has rigidity which can firmly support the robot and openers even when external force is exerted from the robot 27 and openers 26 via the respective fixing portions 53a, 53b. Namely, the frame main body 50a has rigidity sufficient to prevent the robot 27 from being deformed beyond the amount of allowable deformation which is allowed when a distal end of the robot hand 40 transfers the wafer 24. Similarly, the frame main body 50a has rigidity sufficient to prevent each opener 26 from being deformed beyond the amount of allowable deformation which is allowed when the opener 26 transfers the FOUP-side door 61. In this embodiment, the amount of allowable deformation for the robot and the amount of allowable deformation for the opener are set at approximately 10 μm, respectively. For example, the rigidity of the frame main body 50a is designed to exhibit an amount of deformation of several microns or less in response to the reaction force to be exerted from the robot 27 and openers 26. It should be noted that the amount of allowable deformation for the robot and the amount of allowable deformation for the opener vary with each substrate transfer apparatus and may be those other than the value described above. In this embodiment, the frame main body 50a has dimension V of approximately 750 mm in the forward and backward directions, dimension B of approximately 980 mm in the left and right directions, and dimension H of approximately 580 nm in the upward and downward directions Z.

It should be appreciated that such dimensions and plate thickness of the frame main body 50a are described for illustrating one embodiment only, and not limited thereto. For example, the dimension B in the left and right directions may be altered corresponding to the number of openers 26 to be fixed to the frame main body 50a. In order to enhance the rigidity of the frame main body 50a, a reinforcing member, such as a bridge, may be provided in the internal space 57. The frame main body 50a may be configured to have a rigid frame-like skeleton composed of a plurality of rod members, in which the internal space 57 may be formed by fixing plate-like members to the skeleton.

In this embodiment, the end face in the backward direction X2 or backward end face of the frame main body 50a is formed to be substantially flush with the end face in the backward direction X2 of the FOUP supporting portion 31 of each opener 26. The frame main body 50a supports the entire bottom face of each FOUP supporting portion 31. Therefore, the frame main body 50a can be enlarged, by making the frame main body 50a project toward the external space 33 relative to the ready space 29, without increasing the size of the ready space 29 of the wafer transfer apparatus 23, as such readily securing the rigidity required for the frame main body 50a. Additionally, the internal space 57 of the frame main body 50a can also be enlarged, thereby increasing capacity for containing equipments to be disposed in the internal space 57.

At the bottom face of the frame main body 50a, wheels 58 are provided to facilitate shifting of the frame divided body 50. In addition, legs are provided to the frame main body 50a in order to stabilize and maintain its self-support attitude. In the frame main body 50a, an attachment portion, which is configured to be detachably attached to the main body constituting member 51, is formed. This attachment portion can be achieved by screw coupling portions or concavo-convex coupling portions respectively provided in the frame main body 50a and in the main body constituting member. In this way, inadvertent or unwanted separation of the frame divided body 50 from the main body constituting member 51 can be prevented while the frame divided body 50 is attached to the main body constituting member 51.

Also to the frame main body 50a, a partition member 52 adapted to cover a portion, which is a part of the robot 27 and fixed to the frame divided body 50, is provided. As shown in FIG. 1, the partition member 52 separates a movable space, in which a movable portion of the robot 27 that can be moved relative to the frame body is located, from a fixing space, in which the fixing portion of the robot 27 fixed to the frame body is located, while the frame divided body 50 is attached to the main body constituting member 51. In this embodiment, the movable space corresponds to an operational region in which the respective movable portions of the robot hand 40, robot arm 41 and vertical drive member 42 are moved, respectively. Meanwhile, the fixing space corresponds to a region in which the respective fixing portions of the base 43 and vertical drive member 42 are located. In this embodiment, the partition member 52 separates the movable space, which extends in the upward direction Z1 from the top face of the frame main body 50a and also extends in the wafer transfer directions X to be defined as a space existing above the frame main body 50a, from the fixing space, which is a space adjacent to the frame main body 50a in the wafer transfer directions. The movable space is used as a space in which each wafer is transferred.

FIG. 8 is a section of the carrier unit 21 taken along line A8-A8 shown in FIG. 3. In this embodiment, an aligner fixing portion 59 to which the aligner is fixed is provided to the frame main body 50a. The aligner fixing portion 59 has such rigidity that can prevent transmission of force to the main body constituting member 51 even though the force is exerted from the aligner 56 upon operation of the aligner 56.

As described above, according to the present invention, the frame divided body 50 has rigidity sufficient to prevent the robot from being deformed beyond the amount of allowable deformation which is allowed upon transferring the wafer 24, even though force is exerted from the robot 27, in a state where the robot 27 is fixed to the frame divided body 50. The base 43 of the robot 27, which is fixed to the frame divided body 50, has lower rigidity such that it allows deformation beyond the aforementioned amount of allowable deformation of the robot, when force is exerted on the base 43 from the robot arm, in a state where it is not fixed to the frame divided body 50. Therefore, even though the base 43 of the robot 27 allows that the force exerted from the robot main body 27A is transmitted to the frame divided body 50, undesired displacement of the robot 27 fixed to the frame divided body 50 can be prevented. Accordingly, the rigidity and mass of the base 43 can be reduced, provided that the base 43 of the robot 27 can function properly to connect the robot main body 27A with the robot fixing member 53a. The increase of the rigidity of the robot fixing portion 53a can be achieved easier with a simpler construction and more effective than the increase of rigidity of the base 43 of the robot 27. Further, the former can lead to simplification and weight reduction of the base 43 of the robot 27. Thus, such simplification and weight reduction of the base 43 of the robot 27 can downsize the ready space 29 as well as prevent interference between the robot and the other associated components.

Similarly, according to the present invention, the frame divided body 50 has rigidity sufficient to prevent each opener 26 from being deformed beyond the amount of allowable deformation which is allowed upon opening and closing the FOUP-side door, even though force is exerted on the frame divided body 50 from the opener 26, in a state where the opener 26 is fixed to the frame divided body 50. The base 67 of each opener 26, which is fixed to the frame divided body 50, has lower rigidity such that it allows deformation beyond the aforementioned amount of allowable deformation of the opener, when force is exerted on the base 67 from the main body of the opener, in a state where it is not fixed to the frame divided body 50. Therefore, even though the base 67 of the opener 26 allows that the force exerted from the opener main body is transmitted to the frame divided body 50, undesired displacement of the opener 26 fixed to the frame divided body 50 can be prevented. Accordingly, the rigidity and mass of the base 67 can be reduced, provided that the base 67 of the opener 26 can function adequately to connect the opener main body with the opener fixing member 53b. The increase of the rigidity of the opener fixing portion 53b can be achieved easier with a simpler construction and more effective than the increase of rigidity of the base 67 of the opener 26.

In such a manner, in this embodiment, sufficient rigidity is provided to the frame main body 50a to which the carrier elements 26, 27, 56 including the robot 27 are fixed respectively such that the mechanical rigidity required for the individual carrier element 26, 27, 56 can be provided together to the frame main body 50a. In other words, the frame divided body can compensate for the rigidity of the robot 27 and openers 26. By firmly fixing the individual carrier element 26, 27, 56 to the frame main body 50a such that they can be supported adequately by the frame main body 50a, the quality and reliance of the carrier unit 21 can be maintained while the rigidity of the individual carrier element 26, 27, 56 can be significantly reduced. In such a manner, in this embodiment, by maintaining the quality of the carrier unit 21 and reducing the rigidity of the construction of the individual carrier member 26, 27, 56, the carrier unit 21 can be made at a low cost, and the production cost can be significantly reduced. In addition, since the individual carrier element 26, 27, 56 can be removed independently from the frame main body 50a, the individual carrier element 26, 27, 56 can be exchanged independently from the frame main body 50a. Thus, the maintenance properties and easiness of assembly can be enhanced.

For example, when vibration having a predetermined amplitude amount is transmitted to the robot 27 in a predetermined frequency range, malfunctioning tends to occur in the conveyance of wafer 24. In this embodiment, however, in the case where reaction force to be generated when the robot hand 41 carries the wafer 24 in the horizontal direction is exerted on the robot fixing portion 53a, the rigidity and mass can be selected for the frame main body 50a, such that the vibration due to the robot 27 of such a predetermined amplitude amount can not be transmitted in such a predetermined frequency range. By selecting the rigidity for the respective fixing portions 53a, 53b such that it can control the amount of vibration at one below an allowable value which is preset in the wafer processing apparatus 22 even though force is exerted on those portions 53a, 53b from the robot 27 and openers 26, malfunctioning to be caused by such vibration in the process performed by the wafer processing apparatus 22 can be prevented.

In this embodiment, the robot fixing portion 53a fixes the robot 27 in the so-called side-mount manner. Such a fixing manner can fix the robot 27 stably and control the moment to be transmitted to the robot fixing portion 53a when the robot hand 40 is operated in the horizontal direction. This can securely prevent the force from being transmitted to the wafer processing apparatus 22.

In this embodiment, the size of the frame main body 50*a* can be increased by locating the frame main body 50*a* below the openers 26, thereby readily achieving enhancement of the rigidity of the frame main body 50*a*. Specifically, the size of the frame main body 50*a* in the wafer transfer directions X can be increased, thus increasing the sectional secondary moment with respect to the wafer transfer directions X, and thereby controlling the amount of deformation against the force to be exerted in the wafer transfer directions X. For example, assuming that the frame main body 50*a* has a rectangular parallelepiped shape and that the dimension B in the wafer transfer directions Y is increased to twice the value, the amount of deformation with respect to the wafer transfer directions X can be reduced to $\frac{1}{8}(=1/B3)$. Additionally, the entire frame main body 50*a* can be enlarged, thus increasing the size of the internal space 57 of the frame main body 50*a*, and thereby increasing the number of parts which can be contained in the internal space 57.

As shown in FIG. 1, when the frame divided body 50 is attached to the main body constituting member 51, the partition member 52 separates a movable space 79, in which the movable portion of the robot 27 that can be moved relative to the frame body 50 is located, from a fixing space 78, in which the fixing portion of the robot 27 fixed to the frame divided body 50 is located. In the partition member 52, an opening is formed, from which the movable portion of the robot 27 can be projected. In order to prevent the gas filled in the fixing space 78 from entering the movable space 79, it is preferred that the fixing space 78 and the movable space 79 are closed airtightly to each other. In addition, down flow may be created such as by employing an FFU or the like means disposed in the ready space 78, and/or the pressure in the fixing space 78 may be controlled lower than that in the movable space 79. Also by such measures, invasion of the gas from the fixing space 78 into the movable space 79 can be securely prevented.

In this way, by separating the movable space 79 from the fixing space 78 due to the partition member 52 in the wafer transfer apparatus 23 for which a clean environment and other environmental measures are required, migration of dust particles from the fixing space 78 into the movable space 79 can be prevented, thus maintaining the movable space 79 in a cleaned state. In addition, since the base 43 of the robot or the like element located in the fixing space 78 needs no surface treatment and/or covering for preventing occurrence of dust particles, the production cost can be saved. In this case, for the robot 27, the portion exposed to the movable space 79 has been subjected to a process for generating or controlling dust into a lower amount, more positively, than the portion exposed to the fixing space 78. In other words, the portion of robot 27 exposed to the fixing space 78 is subjected to such a process for controlling dust not so positively as the portion of robot 27 exposed to the movable space 79.

For example, since the drum of the robot 27 and the most part of the openers 26 are arranged in the fixing space 78, a finish for cleaning the surface of the robot 27 and openers 26 and a cover for preventing scatter of dust are not required, thus eliminating the need for further subjecting a dust-proof treatment to the surface finished on processing, and thereby reducing the production cost. Since dust particles to be generated from the portions of the robot 27 and openers 26 arranged in the fixing space 78 are not likely to affect the wafer, the degree of freedom in arrangement of the portions to be located in the fixing space 78 can be enhanced, thus eliminating the need for placing respective components and elements together closely in the fixing space 79.

Due to the separation of the movable space 79 from the fixing space 78 by using the partitioning plate, the migration, into the movable space 79, of dust particles generated upon working can be prevented, even in the case where a worker does a work in the fixing space 78. Therefore, the movable space 79 can be cleaned to adequate cleanliness for enabling the wafer transfer, in a short time after the work, as compared with the case of not employing the partitioning plate 52. As described above, for each component arranged in the fixing space 78, since the dust particles to be generated therefrom are not likely to affect the wafer to be transferred, each component can be positioned and configured for facilitating maintenance, thus making maintenance much easier.

As described above, it is possible to create a significantly larger space by combining the fixing space 78 and the internal space of the frame main body 50*a*. Further, as described above, by arranging openers on the top face of the frame main body 50*a* and by forming the frame main body 50*a* such that it has a side face substantially flush with the side face 300 of each opener, a further greater space can be obtained, as such the number of parts can be increased, which can be arranged in the space where the dust particles to be generated are not likely to affect the wafer.

The frame divided body 50, when attached to the main body constituting member 51, is configured such that the carrier elements to be fixed to the frame divided body 50, such as the robot 27, openers 26 and aligner 56, are respectively arranged in positions and attitudes to serve as a part of the wafer transfer apparatus 23. Namely, upon actual operation of the wafer transfer apparatus 23, and when the relative positional relationship between the respective carrier elements 26, 27, 56 is set in advance, the frame divided body 50 fixes the respective carrier elements 26, 27, 56 thereto such that they have the preset relative positional relationship.

Alternatively, upon actual operation of the wafer transfer apparatus 23, and when positions of reference points and attitudes in reference planes, which are set for the robot 27 and each opener 26, are set in advance, the frame divided body 50 fixes the respective carrier elements 26, 27, 56 thereto such that the positions of the reference points and attitudes in the reference planes are in a preset state, with the frame divided body 50 being attached to the main body constituting member 51 of the wafer transfer apparatus 23. Such attachment of the respective carrier elements 26, 27, 56 to the frame divided body 50 ensures that the respective carrier elements 26, 27, 56 can take adequately controlled positions and attitudes. Thus, the amount of works for adjusting the relative positions of the robot 27, each opener 26 and aligner 56 and instructing again the shifted position of the robot, after the attachment of the carrier unit 21 to the main body constituting member 51, can be reduced.

For attachment of the respective carrier elements 26, 27, 56 to the wafer transfer apparatus 23, higher attachment accuracy is required. In this embodiment, when assembling the carrier unit 21, the positions, attitudes and relative positional relationship of the respective carrier elements 26, 27, 56 can be adjusted. Accordingly, after the carrier unit 21 is attached to the main body constituting member 51, the amount of works for adjusting the positions and attitudes of the respective carrier elements 26, 27, 56 can be reduced, thereby assembling the wafer transfer apparatus 23 in a shorter time. In addition, the respective carrier members 26, 27, 56 can be attached in a properly wider space, as such the position adjusting work can be performed easier than the case of setting those respective carrier elements 26, 27, 56 in the ready space 29 of the wafer transfer apparatus 23.

The frame divided body 50 is configured such that when the respective carrier elements 26, 27, 56 are fixed to the frame main body 50*a*, the respective carrier elements 26, 27, 56 can perform the same operations as the case in which they are operated as the wafer transfer apparatus 23. Namely, the frame divided body 50 is formed in a region, other than a region in which the opener-side aperture 35 is formed, a movable region which is required for the FOUP-side door 61 and opener-side door 65 to be moved by the openers 26, and a working region which is required for the wafer transfer due to the robot 27. Consequently, the respective carrier elements 26, 27, 56 can cooperate with one another before attached to the main body constituting element 51.

Accordingly, the operation of the robot 27, each opener 26 and aligner 56 can be checked individually while the robot 27, each opener 26 and aligner 56 are fixed to the frame divided body 50, respectively. Moreover, the cooperation of the robot 27, each opener 26 and aligner 56 can also be checked.

Specifically, the operation in which each wafer 24 contained in the FOUP 25 held by the FOUP supporting portion 31 of each opener 26 is held by the robot hand 40, as well as the operation in which the wafer 24 held by the robot hand 40 is contained in the FOUP supporting portion 31 of each opener 26 can be checked. In addition, the operation in which the wafer 24 held by the robot hand 40 is positioned on the aligner 56, as well as the operation in which the wafer 24 positioned on the aligner 56 is held by the robot hand 40 can be checked.

Accordingly, the work for checking the operation of the robot 27 and each opener 26 can be reduced after the carrier unit 21 is attached to the main body constituting element 51. Additionally, the preparation time to be spent for rendering the wafer transferring apparatus 23 operable after assembling the wafer transfer apparatus 23 can be reduced. Furthermore, the operation of the robot 27 and openers 26 can be checked in an adequately wider space than the case of setting them in the ready space 29 of the main body constituting member 51, thus facilitating the operation checking work.

In addition, since the carrier unit 21 can be maintained in its self-support attitude, there is no need to place the carrier unit 21 on a separate base frame for use in shipment upon shipping the carrier unit 21. Accordingly, the carrier unit 21 can be assembled in a different place other than the place where the wafer transfer apparatus 23 is installed, and shipped to the place of installment of the wafer transfer apparatus 23 without placing it on any base frame even after the positional adjustment and operational check.

The attitudes of the robot 27 and openers 26 are maintained in the same attitudes for being actually operated as the wafer transfer apparatus 23 while the carrier unit 21 is maintained in its self-support attitude. Specifically, when assembled as the wafer transfer apparatus, and when reference horizontal planes maintained horizontal are set for the robot 27 and openers 26, respectively, these reference horizontal planes having been set for the robot 27 and openers 26 are maintained horizontal while the carrier unit is maintained in its self-support attitude.

Thus, when the operational check for the carrier unit 21 is carried out until the components are assembled into the wafer transfer apparatus 23, the robot 27 and openers 26 can be maintained in the same attitudes as those assembled in the wafer transfer apparatus 23, as such eliminating the need for placing the carrier unit 21 on a separate testing frame. Positions instructed to the robot 27 upon the aforementioned operational check for the robot 27 and openers 26, i.e., the position of the FOUP 25 relative to the reference position of the robot 27 and the like can be registered as the shifting positions in an actual operation of the wafer transfer apparatus 23, thereby reducing works for instructing the robot shifting position which is performed after the assembly of the wafer transfer apparatus 23.

Figure 10:
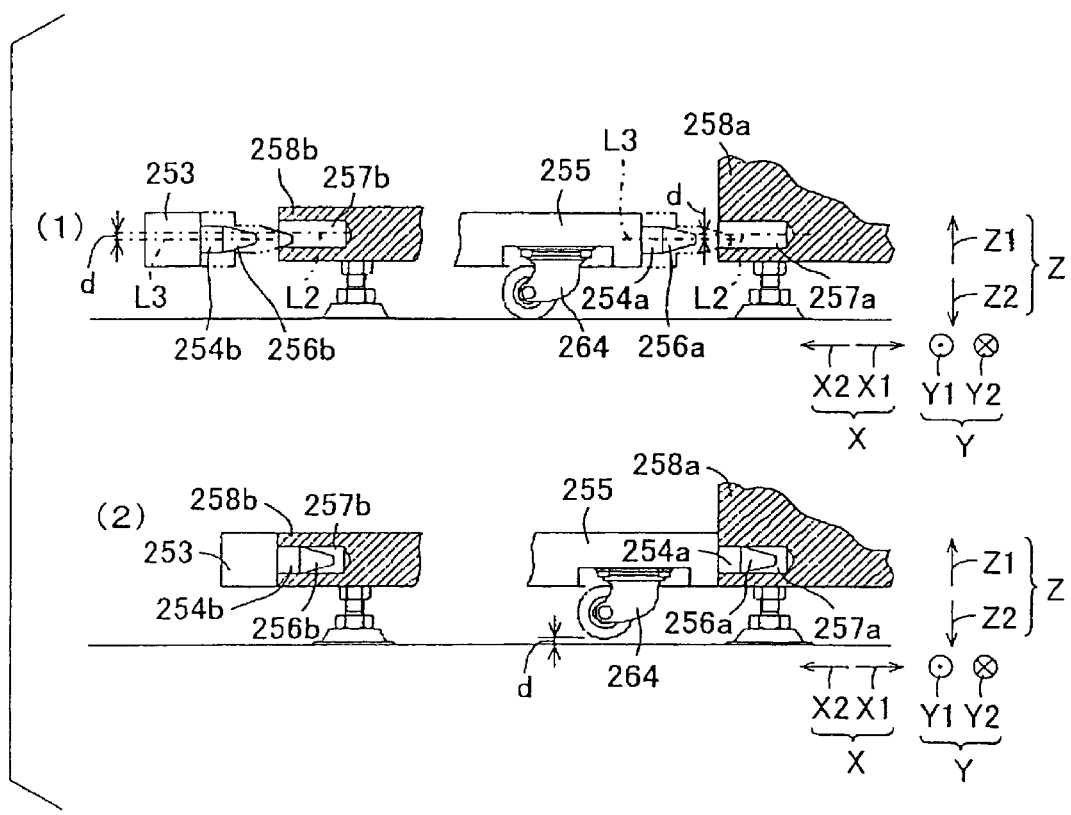
FIG. 10 is an enlarged section of the attaching portion of the frame divided body 50.

FIG. 9 is an enlarged view of an attaching portion of the frame divided body 50, and FIG. 10 is an enlarged section of the attaching portion of the frame divided body 50. FIG. 9(1) and FIG. 10(1) show states where the carrier unit 21 is separated from the main body constituting member 51, respectively, and FIG. 9(2) and FIG. 10(2) show states where the carrier unit 21 is attached into attaching positions of the main body constituting member 51, respectively.

In this embodiment, the frame divided body 50 includes attaching portions 254 which are attached into attaching positions of the main body constituting member 51, and guide portions 256 respectively adapted to guide the attaching portions 254 into the attaching positions of the main body constituting member 51. In the main body constituting member 51, mating portions 258 are formed, in which the attaching portions 254 are fitted respectively. In this embodiment, the attaching portions 254 include a first attaching portion 254a projecting in the forward direction X1 of the wafer transfer directions X from a distal end of a leg 255 and a second attaching portion 254b projecting in the forward direction X1 of the wafer transfer directions X from an opener fixing portion 253. In the main body constituting member 51, mating portions 258a, 258b are formed, in which the first attaching portion 254a and the second attaching portion 254b are fitted, respectively. Further, in the mating portions 258a, 258b, fitting apertures 257a, 257b are formed respectively, in which the attaching portions 254a, 254b are fitted, respectively. With such fitting of the respective attaching portions 254 into the respective mating portions 258, the position and attitudes of the carrier unit 21 relative to the main body constituting member 51 can be adjusted. In this embodiment, the first attaching portion 254a is provided at one end along the wafer transfer directions X of the carrier unit 21, and the second attaching portion 254b is provided at the other end along the wafer transfer directions X of the carrier unit 21. With one pair of the first attaching portion 254a and second attaching portion 254b provided on both sides along the width directions Y, the carrier unit 21 can be aligned at its lower four corners, thus achieving stable attachment of the carrier unit 21 to the main body constituting member 51.

The attaching portions 254 and fitting apertures 257 are formed to have substantially the same sectional shape vertical to the respective axes. In this embodiment, each attaching portion 254 is formed into a cylindrical shape which has an outer diameter substantially the same as the inner diameter of the fitting aperture 257 formed in each mating portion 258. In addition, at a distal end of each attaching portion 254, the guide portion 256 is formed, which is coaxial with the attaching portion 254 and formed into a generally truncated-cone-like shape. Each guide portion 256 is formed to have a diameter, which is the same as the diameter of the attaching portion 254, at the point where it is connected with the attaching portion 254, and tapers down as one moves away from the attaching portion 254. With such guide portion 256 designed to be fitted first into the fitting aperture 257, each attaching portion 254 can be securely inserted into the fitting aperture 257 even in the case where the guide portion 256 is slightly shifted from the fitting aperture 257. Due to the so-formed guide portions 256, the attaching portions 254 can be guided securely and moved readily to the attaching positions, respectively.

As shown in FIG. 10, for the two legs 255 of the carrier unit 21, wheels 264 are respectively provided. Accordingly, the carrier unit 21 can be transferred with ease. For example, upon maintenance, the carrier unit 21 can be separated from the main body constituting member 51 with sliding.

As shown in FIG. 10(1), in a naturally released state where the carrier unit 21 is separated from the main body constituting member 51, the axis L3 of the attaching portion 254 is positioned lower by a predetermined distance d than the axis L2 of the fitting aperture 257. Accordingly, as shown in FIG. 10(2), in a state where the carrier unit 21 is attached to the main body constituting member 51, and when the axis L2 of the fitting aperture 257 coincides with the axis L3 of the attaching portion 254, the carrier unit 21 is floated by the predetermined distance d as compared with the above naturally released state. Consequently, the alignment of the carrier unit 21 can be carried out without interference of the wheels 264. In this embodiment, attaching aid members 260 are provided to the frame divided body 50 as well as to the main body constituting member 51 for aiding workers upon attachment of the carrier unit 21.

Figure 11:
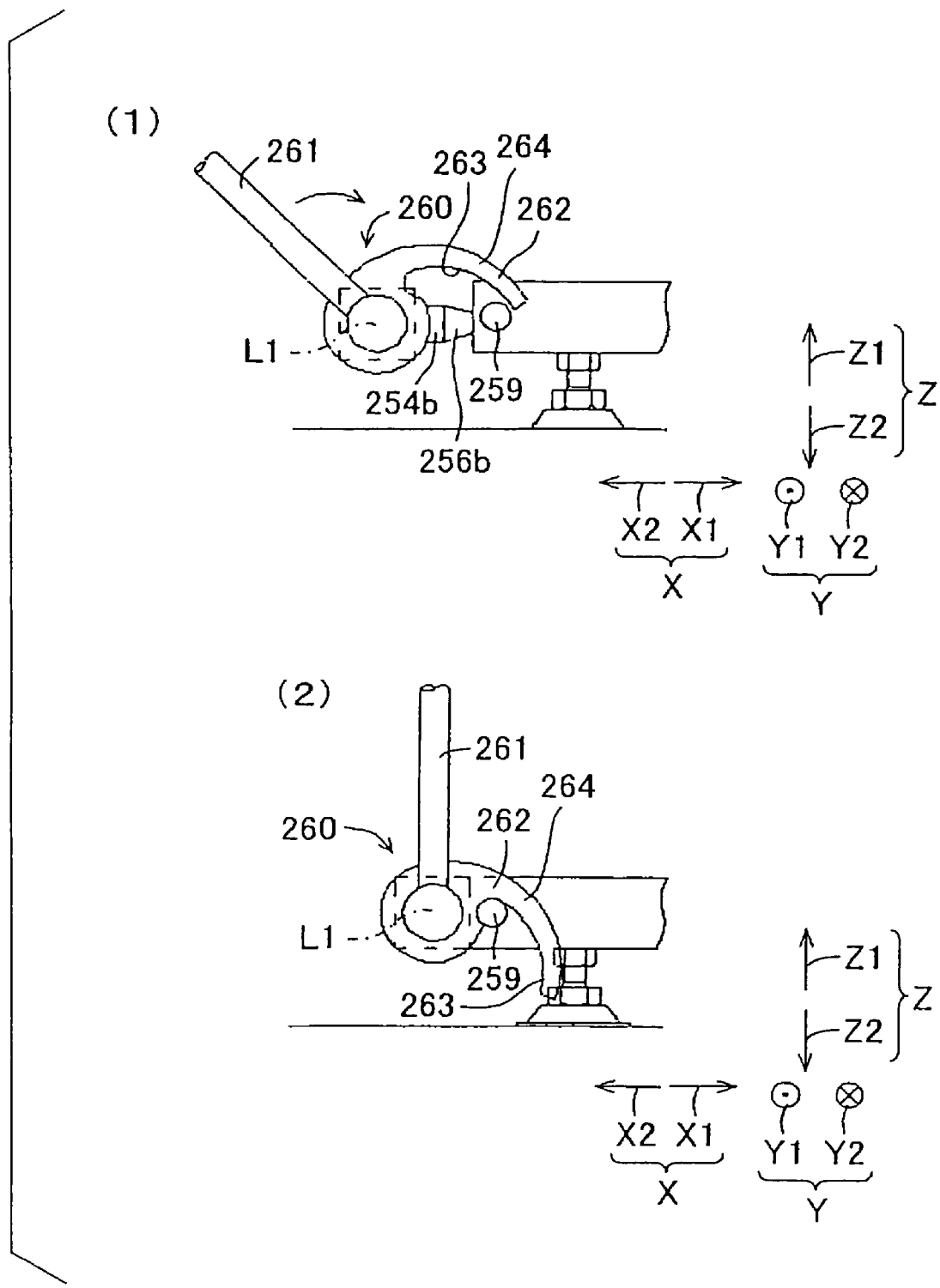
FIG. 11 is a front view showing an attaching aid member 260.

FIG. 11 is a front view showing the attaching aid member 260. FIG. 11(1) illustrates a state in which the carrier unit 21 is separated from the main body constituting member 51, and FIG. 11(2) illustrates a state in which the carrier unit 21 is attached to the main body constituting member 51. The attaching aid member 260 is configured to include a lever 261 provided to be capable of being angularly displaced about an angular displacement axis L1 relative to the frame divided body 50, an angular displacement portion 262 which is fixed to the lever 261 and adapted to be angularly displaced about the angular displacement axis L1 together with the lever 261, and a pin 259 provided to the main body constituting member 51. In the angular displacement portion 262, a stop portion 264 is formed, which can be angularly displaced about the angular displacement axis L1 and is configured such that the distance from the angular displacement axis L1 is gradually changed. The stop portion 264 includes a stop guide face 263 which faces the angular displacement axis L1 and changes smoothly in the distance from the angular displacement axis L1 as one moves about the angular displacement axis L1.

As shown in FIG. 11(1), by inserting the guide portion 256b into the fitting aperture 257, the pin 259 can be positioned inside the stop portion 264. In this state, if the lever 261 is angularly displaced as shown in FIG. 11(2), the stop guide face 263 of the stop portion 264 slides on the pin 259, as such the angular displacement portion 262 exerts force on the pin 259. On the other hand, the angular displacement portion 262 receives reaction force from the pin 259 and is urged to move toward the main body constituting member 51, thus the carrier unit 21 is displaced such that the attaching portion 254 is fitted into the fitting aperture 257.

With the angular displacement of the angular displacement portion 261 due to the lever 261, the principle of the lever can be utilized, so that the carrier unit 21 can be attached to the main body constituting member 51 by using slight force. Due to such a design, even in the case where the carrier unit 21 must be floated in order to attach the carrier unit 21 to the main body constituting member 51 as described in this embodiment, the workers can float the carrier unit 21 with ease, so that the carrier unit 21 and the main body constituting member 51 can be readily attached to each other.

Additionally, with the contact of the pin 259 to the stop guide face 263, the attaching aid member 260 can also serve as a displacement preventing means for mechanically preventing displacement of the carrier unit 21 relative to the main body constituting member 51. It should be noted that the construction including the attaching portions 254, guide portions 256, attaching aid members 260 and wheels 264, as described above, is one example of this embodiment, and suitable modifications can be made optionally. For example, a concave portion may be provided in each attaching portion 254, and a convex portion may be provided in each mating portion 258. In addition, a fitting portion may be provided in each leg 255, which is fitted in a rail formed in the main body constituting member 51. Consequently, the carrier unit 21 can be slidably displaced relative to the main body constituting member 51 while being properly aligned. Alternatively, the carrier unit 21 and the main body constituting member 51 may be detachably fixed to each other by using bolts and nuts.

Figure 12:
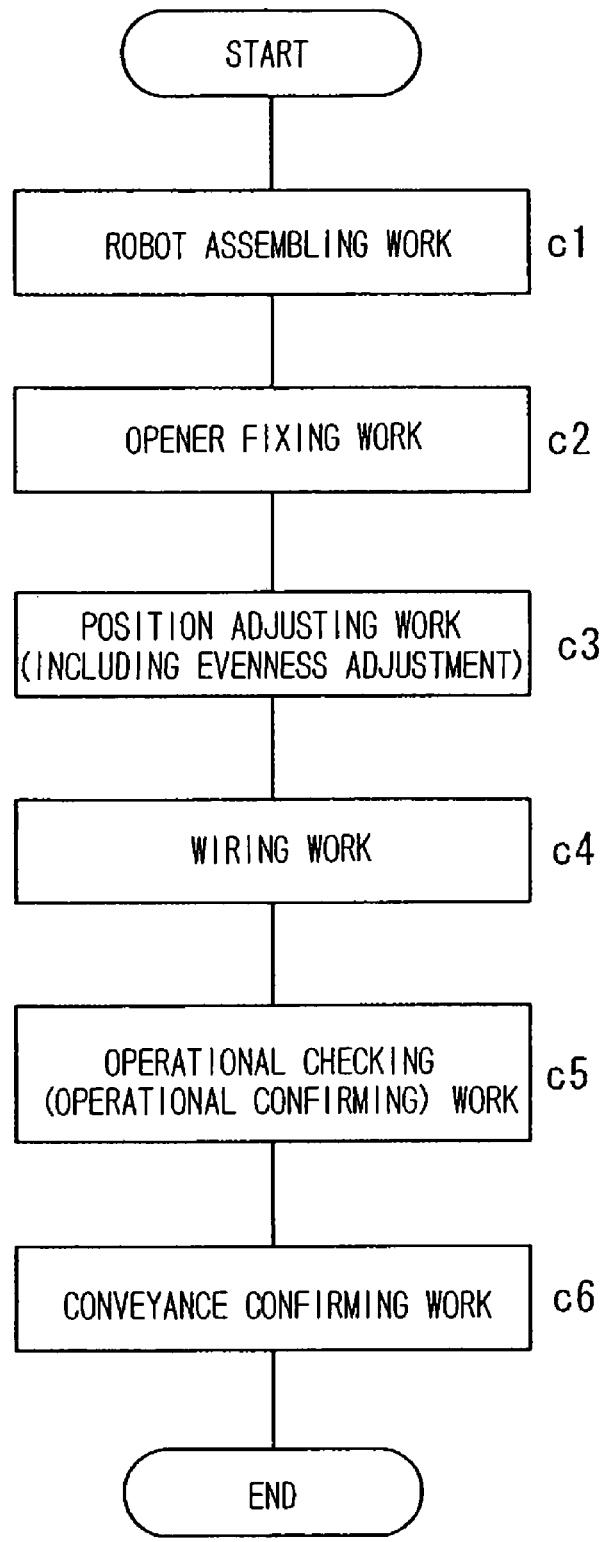
FIG. 12 is a flow chart showing a procedure of from manufacture to shipment of the carrier unit 21, which is an embodiment of the present invention.

FIG. 12 is a flow chart showing a procedure of from manufacture to shipment of the carrier unit 21, which is one embodiment of the present invention. The carrier unit 21 can be manufactured in a place different from the place in which the wafer transfer apparatus 23 is installed. In this embodiment, the carrier unit 21 is assembled by a robot manufacturer. First, when the robot manufacturer completes the preparation of a plurality of components for constituting the frame divided body 50 and the robot 27, the procedure goes to Step c1, and an assembling work is started. In the Step c1, the base 43 of the robot 27 is fixed to the frame divided body 50 so as to assembly the frame divided body 50 and the robot 27 into an integrated structure. When this assembling step is completed, the procedure advances to Step C2. In the Step C2, the openers 26 and the aligner 56 are fixed to the frame divided body 50 to which the robot 27 has been already fixed. When the carrier unit 21 is assembled in such a manner, the procedure goes to Step c3.

In the Step c3, the positions and attitudes of the robot 27, openers 26 and aligner 56 relative to the frame divided body 50 are adjusted, as well as the relative positional relationship between the robot 27, openers 26 and aligner 56 is adjusted. Specifically, by using a level, jigs for alignment and the like, the positions of the robot 27, openers 26 and aligner 56 are adjusted such that the relative positional relationship and attitudes of the robot 27 are the same as those in the case where they are operated as the wafer transfer apparatus 23. When the adjustment is completed in such a manner, the procedure advances to Step c4.

In the Step c4, each wiring is connected such that the robot 27, openers 26 and aligner 56 can be operated. Specifically, for the robot 27, openers 26 and aligner 56, an operation command cable is connected with a controller 42, and a power transmission cable is connected with a power source. Then, the procedure goes to Step c5. In the Step c5, a simulating operation which simulates the operation of the robot 27 in the case of operating as the wafer transfer apparatus 23 is performed by using the robot 27. Accordingly, the operational check for the robot 27 can also be performed as the operational confirmation work for the carrier unit 21. Specifically, the FOUP 25 is actually positioned at the FOUP supporting portion 31 of each opener 26 so as to instruct the FOUP position to the robot 27. A wafer 24 contained in the FOUP 25 is then carried by using the robot 27, and thereafter the procedure is advanced to Step c6. As the operational check in the Step c5, other tests, such as those for the speed, accuracy and function of the robot 27 may be carried out at the same time. In the Step c6, whether the carrying operation of the wafer 24 by using the robot 27 is possible or not is checked, and if possible, the carrier unit 21 is shipped to the place where the wafer transfer apparatus 23 is installed, thus the robot worker completes the procedure from assembling through shipment.

In the manufacturing step of the carrier unit 21, there is a case in which the openers 26 to be actually used for the wafer transfer apparatus 23 are not provided in the unit. In such a case, the Steps c5 and c6 are carried out with dummy openers being mounted to the frame divided body 50, which correspond to the openers 26 to be actually used as the wafer transfer apparatus 23. In this case, though the working efficiency is lowered as compared with the case of fixing the openers 26 to be actually used as the wafer transfer apparatus 23, the working efficiency of the entire procedure can be significantly enhanced as compared with the related art.

Figure 13:
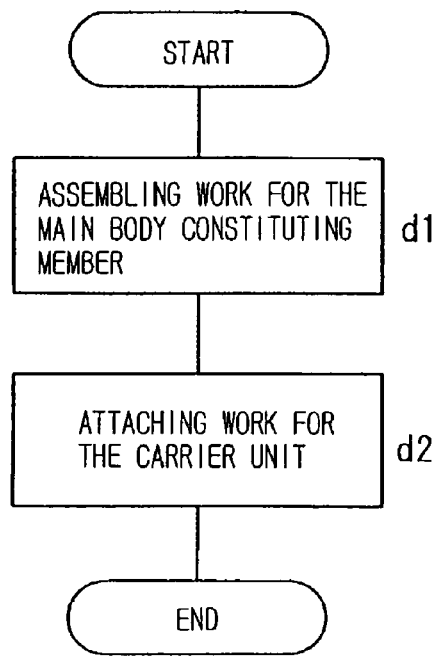
FIG. 13 is a flow chart showing a procedure of assembling the wafer transfer apparatus 23, which is an embodiment of the present invention.

FIG. 13 is a flow chart showing a procedure of assembling the wafer transfer apparatus 23, which is one embodiment of the present invention. Since the wafer transfer apparatus 23 is of a large size, it is assembled at its installing site. First, when the worker for assembling the wafer transfer apparatus 23 completes the preparation of a plurality of components for constituting the main body constituting member 51 of the wafer transfer apparatus 23, the procedure goes to Step d1, and an assembling work is started. When the main body constituting member 51 is assembled and the assembling work is completed in the Step d1, the procedure goes to Step d2. In this case, the main body constituting member 51 of the wafer transfer apparatus 23 may be assembled integrally with the wafer processing apparatus 22. Also, when such assembling of the main body constituting element 51 is completed, the procedure advances to Step d2.

In the Step d2, the carrier unit 21 pre-assembled by a robot manufacturer or the like is attached to the main body constituting member 51. Then, whether the operation having been set by the robot manufacturer is normally performed or not is checked. Thereafter, the assembling of the wafer transfer apparatus 23 is completed. When operated as the semiconductor processing equipment 20, it is necessary to instruct the wafer locating position to the robot 27 on the stage that the assembling of the wafer transfer apparatus 23 and wafer processing apparatus 22 is completed. It is also necessary to confirm the operation in order to make it possible that the wafer 24 held by the robot 27 is placed at the wafer locating position as well as to make it possible that the wafer 24 located at the wafer locating position is held by the robot 27.

As described above, according to this embodiment, the positions and attitudes of the robot 27 and openers 26 are adjusted relative to the frame divided body 50 in the Step c3. In the Step c5, the operational check of the robot concerning access to the FOUP 25 held by the openers 26 can be carried out. In this way, the positional adjustment and operational check of the robot 27 and openers 26 can be completed before the assembling of the wafer transfer apparatus 23. Thus, in the Step d2, the works for the positional adjustment and operational check of the robot 27 and openers 26 after attachment of the carrier unit 21 to the main body constituting member 51 can be reduced. Due to such preparation of the carrier unit 21 for which the positional adjustment and operational check have been provided, the work for assembling the wafer transfer apparatus 23 at an installing place can be simplified, thereby assembling the wafer transfer apparatus 23 in a shorter time.

For the robot 27 and FOUP openers 26 which are units for carrying each wafer 24 in the wafer transfer apparatus 23, higher assembling accuracy is required and severe operational check should be necessary. In this embodiment, since the required assembling accuracy and operational quality for the wafer carrying components can be confirmed before the assembling of the wafer transfer apparatus 23, there is no need for preparing particularly skilled persons and exclusive jigs for every installing place of the wafer transfer apparatus 23. In this embodiment, since the carrier unit 21 provided with wiring connection can be shipped together with the robot controller to the installing place of the wafer transfer apparatus 23, the wiring work can also be simplified.

In the operational check in the Step c5, the position of the FOUP 25 held by each opener 26 or the like data is instructed to the robot 27, and a test is carried out by moving the robot 27 to the instructed position so as to simulate the operation concerning the wafer transfer due to the robot 27. In this way, the instructed position for the robot used in the operational check in Step c5 is determined as a position for the robot 27 when it is operated as the wafer transfer apparatus 23. Consequently, the work for instructing the robot 27 after the assembling of the wafer transfer apparatus 23 can be simplified, so that the wafer transfer apparatus 23 can be operable in a shorter time after the assembling of the wafer transfer apparatus 23.

In this embodiment, as described in the Steps c1 to c5, the assembling and operational check of the carrier unit 21 are carried out in a place for manufacturing the robot. Accordingly, the quality of the carrier unit 21 can be secured in the robot manufacturing place. Thus, the test due to simulation which was carried out for securing the quality of the robot 27 in the robot manufacturing place and the operational check which was carried out in the installing place of the wafer transfer apparatus 23 can be done as a single test, as such reducing the time required for the entire work and enhancing the working efficiency. In the installing place of the wafer transfer apparatus 23, the carrier unit 21 whose assembling accuracy has been guaranteed is attached to the main body constituting member 51 after assembling of the main body constituting member 51 whose assembling accuracy required is lower than the carrier unit 21, thus significantly facilitating the assembling of the wafer transfer apparatus 23.

In this embodiment, the carrier unit 21 can maintain a self-supporting attitude as well as maintain the same attitude as that when it is attached to the main body constituting member. Thus, the robot manufacturer can use only a single divided frame as a shipping frame for maintaining the carrier unit 21 in a stable attitude, as a testing frame for testing the operation of the robot, and as an assembling frame for use in assembling the robot. Accordingly, there is no need for successively changing frames to place the robot 27 on such a plurality of frames, thus eliminating the need for using such frames, thereby reducing the cost. As described above, the time required for changing tables to place the robot 27 thereon can be saved, and hence the trouble to be experienced due to such changing of the tables can be avoided.

Due to the assembling and operational check of the carrier unit 21 carried out in the robot manufacturing site, a skilled worker for preparing the robot 27 can conduct the fixation and alignment of the robot 27 relative to the frame divided body 50 together with the instruction of the operating position and the operational check for the robot 27. Accordingly, any imperfection in each work can be avoided. Moreover, any malfunctioning that would occur in each work can be addressed in its early stages.

The wafer transfer apparatus 23 is likely to be made compatible in the semiconductor manufacturing equipment 20. Accordingly, it is often seen that a common wafer transfer 23 is provided for a plurality of semiconductor processing equipments 20 which perform different processes. In such a case, the merit of forming the carrier unit in advance is noticeable. For example, a plurality of carrier units 21, whose positional adjustment and operational check have been already carried out, may be manufactured, and the so-manufactured carrier units 21 may be stored until they are requested to be shipped. Thus, as compared with the case where the carrier unit 21 is assembled after the request for shipping is given, the carrier unit 21 can be shipped in a shorter period.

Due to such fixation of carrier elements for carrying wafers in the wafer transfer apparatus 23 to a rigid frame, due to implementation of the adjustment, piping, wiring and instruction and conveyance test, and due to the conveyance in a completely assembled state without disconnection, the works for assembling, adjustment and instruction for the carrier unit 21 at an installing place of the wafer transfer apparatus 23 can be reduced, thereby decreasing the cost as well as enhancing the manufacturing quality.

Although the wafer transfer 23 has been described to include the openers 26, robot 27 and aligner 56 as the carrier elements, the aligner may be omitted or eliminated in another embodiment. Alternatively, a plate thickness measuring apparatus for measuring the plate thickness of each wafer 24 and a buffer position for improving working efficiency may also be provided.

As described above, in the carrier unit 21, at least two of the components required for carrying each wafer 24 may be fixed to the frame divided body 50. For example, the robot 27 and aligner 56 may be fixed to the frame divided body 50. In this embodiment, due to the unified control of the robot 27, openers 26 and aligner 56 by using the single robot controller 44, the number of controllers can be reduced as well as the production cost can be decreased, as compared with the case in which the controller is provided for each component. Since a series of tests for checking the substrate carrying operation can be conducted with the carrier unit 21 assembled, the working efficiency and utility can be enhanced. It is preferred that the controller 44 is also fixed to the frame divided body 50.

It should be appreciated that the embodiment described above is for illustrative purpose only, and its construction can be modified within the scope of this invention. For example, in the embodiment described above, while a part of the frame of the wafer transfer apparatus 23 is a divided body, such a divided body may be provided in another portion than the frame. Specifically, as the divided body, a structure may be used, which is configured such that the carrier elements, such as robot 27 and openers 26, can be attached thereto and which can be detachable relative to the main body constituting member 51. The shape of the frame divided body may be any suitable one provided that it has rigidity sufficient to correspond to the external force to be mainly exerted from the robot 27.

The procedures shown in FIGS. 12 and 13 are for illustrating one example of this embodiment, and other procedures may also be employed. For example, the carrier unit 21 may be assembled until the positional adjustment work in the Step c3 is carried out. Thus, the robot 27 may be fixed after the fixation of the openers 26 to the frame divided body 50. In addition, while the carrier unit 21 is assembled in a robot manufacturing site, the carrier unit 21 may be assembled at a place near the installing site of the wafer transfer apparatus 23. Also in such a case, the main body constituting member 51 and the carrier unit 21 can be assembled in parallel, thus obtaining the same effect as described above. Furthermore, the use of the frame divided body 50 of this embodiment can provide a particular effect that the maintenance can be carried out with ease even without the aforementioned procedures.

In this embodiment, while the openers 26 fixed to the frame divided body 50 in a robot manufacturing site is actually used as a part of the wafer transfer apparatus 23, if the attachment accuracy of the openers 26 is within an allowable range, the openers 26, other than those which have been attached to the frame divided body 50 in the robot manufacturing site and experienced the operational check, may be attached to the frame divided body 50 at an installing site of the wafer transfer apparatus 23.

Figure 14:
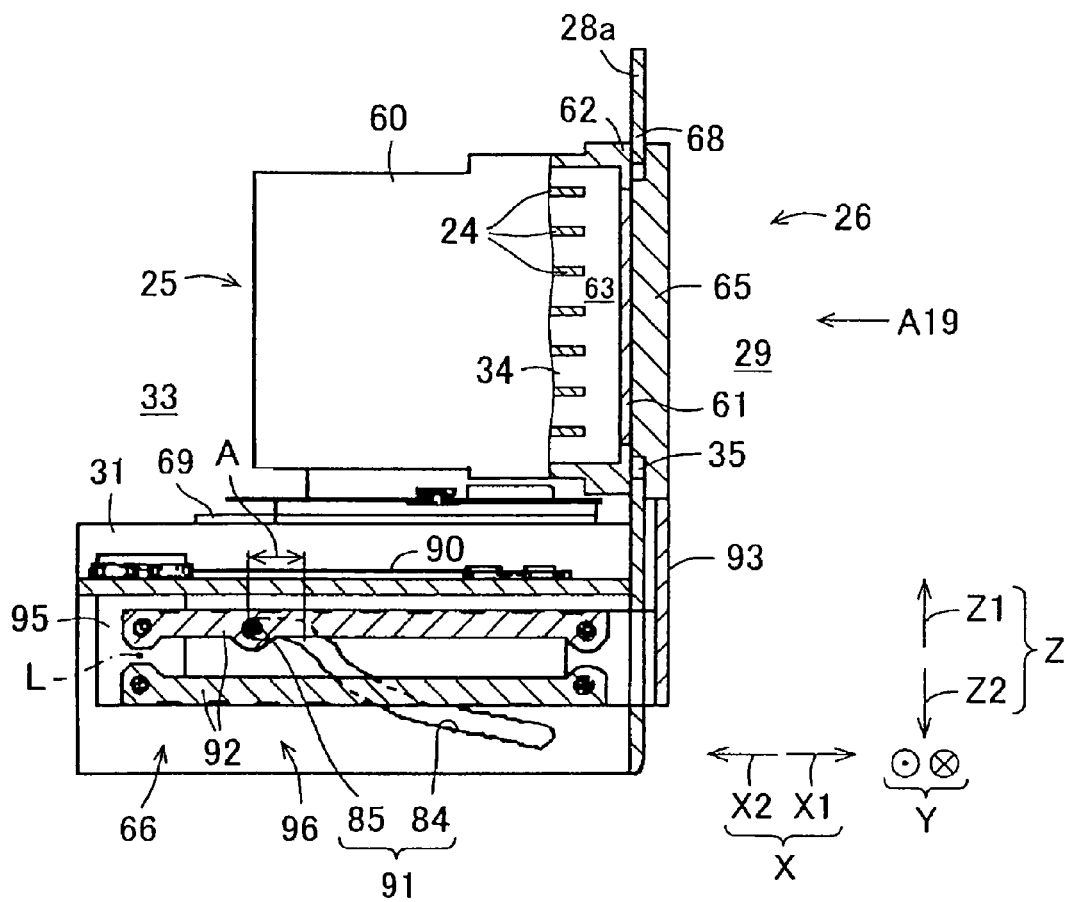
FIG. 14 is a side view showing an opener 26 which is partly sectioned.
Figure 15:
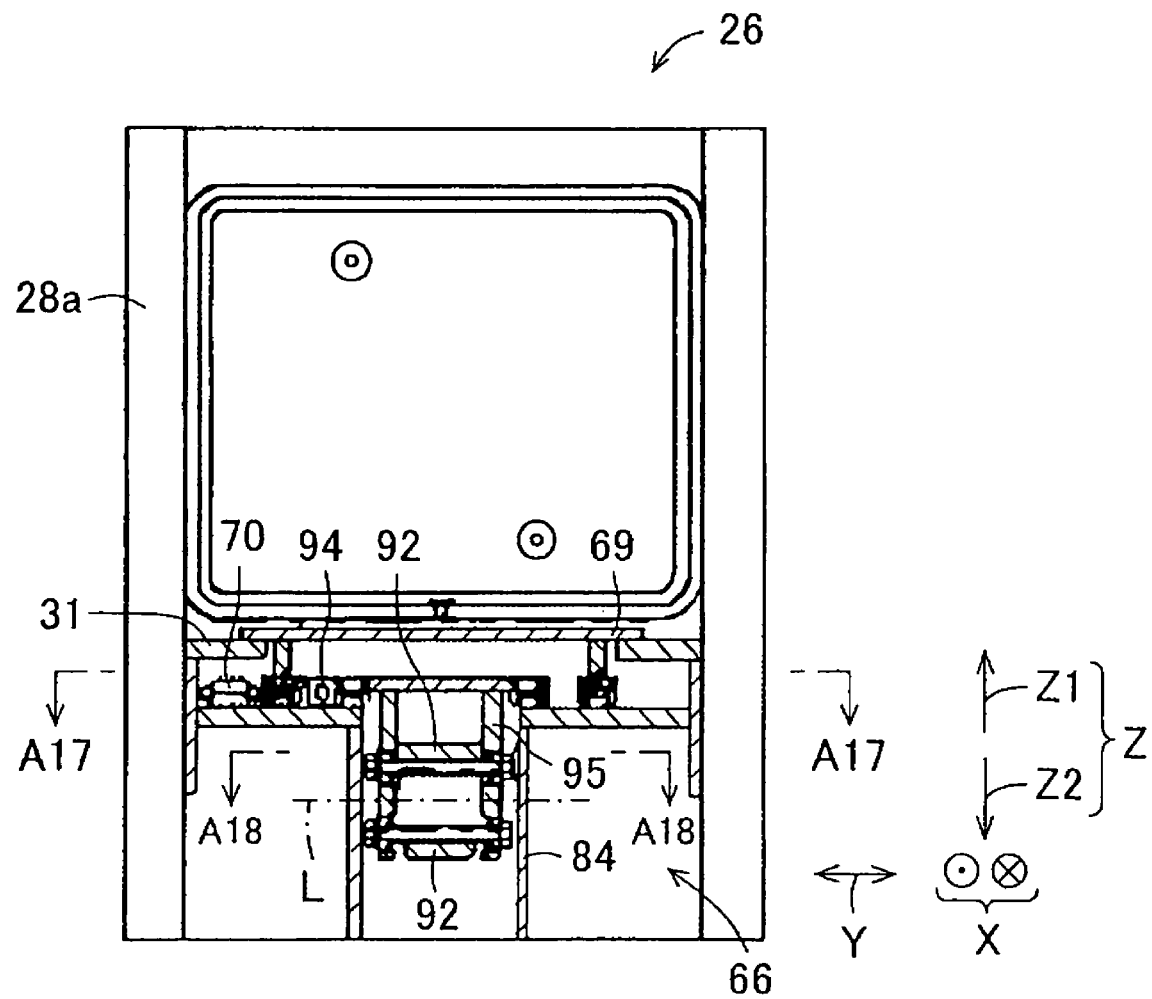
FIG. 15 is a front view showing the opener 26.
Figure 16:
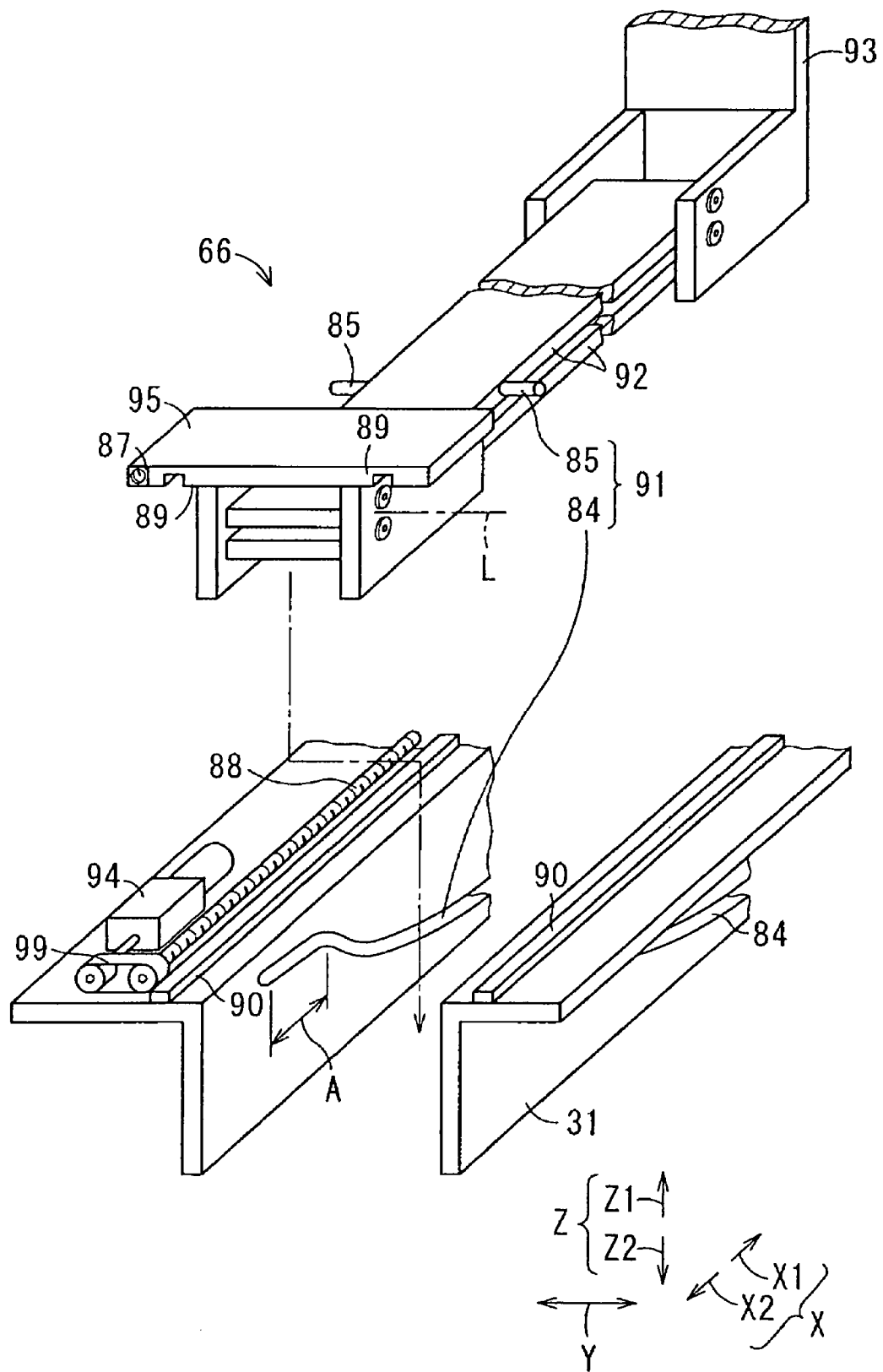
FIG. 16 is a perspective view schematically showing an opener-side door drive mechanism 66.
Figure 17:
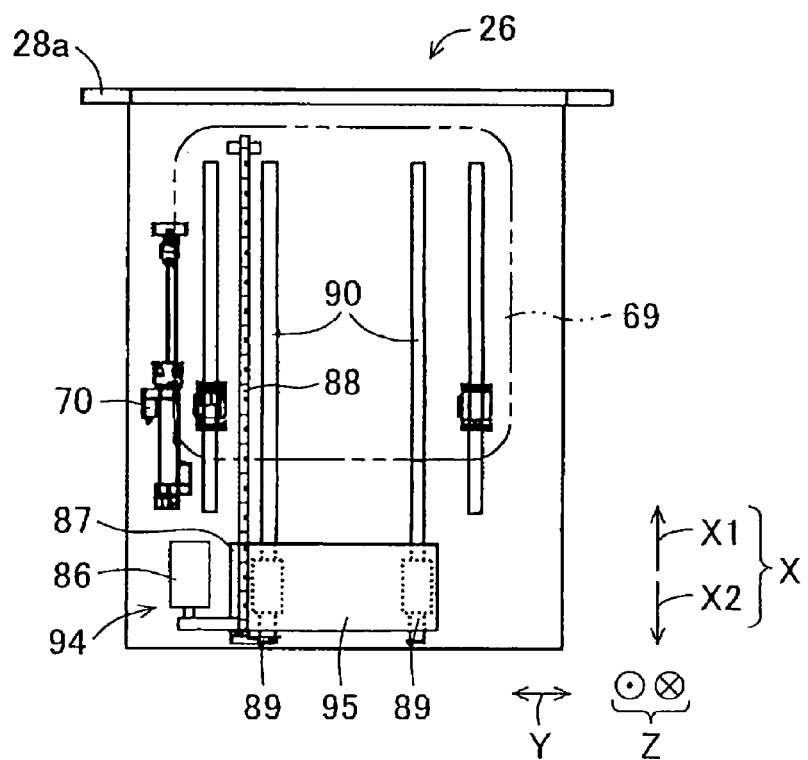
FIG. 17 is a diagram showing the opener 26 viewed along line A17-A17 of FIG. 15.
Figure 18:
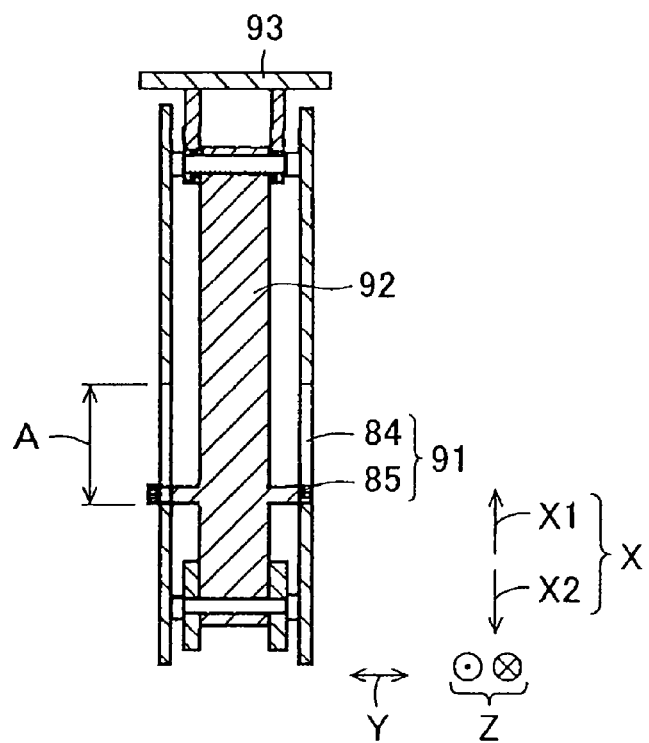
FIG. 18 is a diagram showing the opener 26 viewed along line A18-A18 of FIG. 15.
Figure 19:
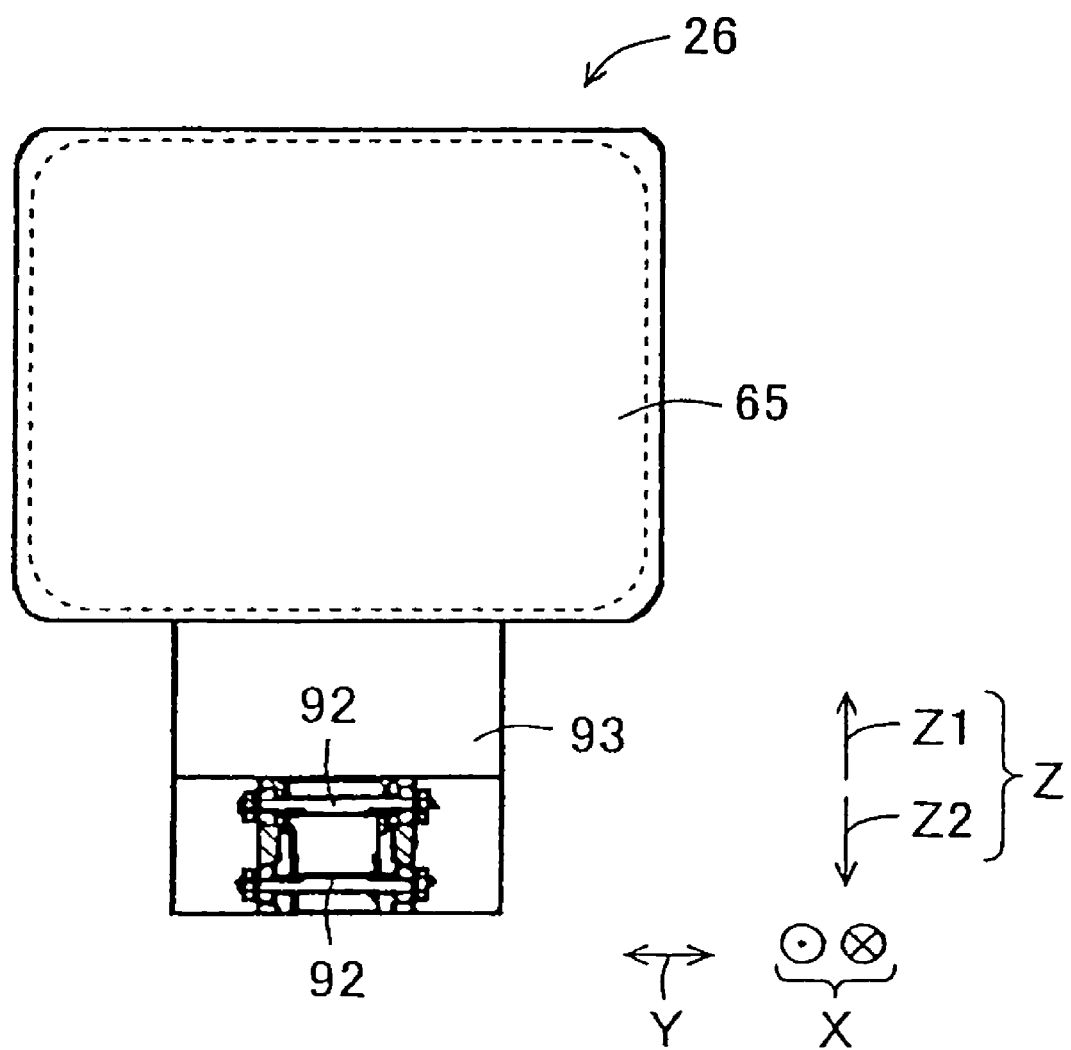
FIG. 19 is a diagram showing the opener 26 viewed along line A19.

FIG. 14 is a side view showing the opener 26 which is partly sectioned. FIG. 15 is a front view showing the opener 26. FIG. 16 is a perspective view schematically showing an opener-side door drive mechanism 66. FIG. 17 is a diagram showing the opener 26 viewed along line A17-A17 of FIG. 15. FIG. 18 is a diagram showing the opener 26 viewed along line A18-A18 of FIG. 15. FIG. 19 is a diagram showing the opener 26 viewed along line A19.

As shown in FIG. 14, in the front face wall 28a, the opener-side aperture 35 is formed, through which each wafer 24 can pass in the forward and backward directions X. The space defined on one side along the thickness direction of the front face wall 28a is the ready space 29, and the space defined on the other side along the thickness direction of the front face wall 28a is the external space 33. The opener-side door 65 is configured to open and close the opener-side opening 68 formed in the front face wall 28a. The periphery of the opener-side opening 68 is in contact with the periphery of the FOUP-side opening 62 of the FOUP 25 which is positioned and supported in the wafer transfer position. Due to such configuration, the invasion of outside air into the FOUP internal space 34 and the ready space 29 through the front face wall 28a and the FOUP-side opening 62 can be prevented, with the FOUP 25 being positioned in the wafer transfer position.

The opener-side aperture 35 is formed to have a sectional shape vertical to the forward and backward directions X, which is substantially the same as the FOUP-side door 61 and is larger than the FOUP-side door 61. Consequently, the FOUP-side door 61 removed from the FOUP main body 60 does not have any interference with the opener-side opening 68 and thus can pass through the opener-side aperture 35 in the forward and backward directions X.

The opener-side door 65 is configured such that it can attach and detach the FOUP-side door 61 relative to the FOUP main body 60 and such that it can grasp the FOUP-side door 61 removed from the FOUP main body 60. The opener-side door 65 is configured to have a plate-like shape and contact with the periphery of the opener-side opening 68 so as to close the opener-side aperture 35. The opener-side door 65 is also configured to be moved away from the opener-side opening 68 formed in the front face wall 28a so as to open the opener-side aperture 35.

The opener-side door drive mechanism 66 is configured to displace and drive the opener-side door 65 in the forward and backward directions X as well as in the upward and downward directions Z vertical to the forward and backward directions X. Due to such displacement and drive of the opener-side door 65 by the opener-side door drive mechanism 66, the FOUP-side door 61 grasped by the opener-side door 65 can also be displaced and driven together with the opener-side door 65. Thus, the FOUP-side door 61 can be moved close to and away from the FOUP main body 60, thereby opening and closing the FOUP 25 located in the wafer transfer position. The base 67 of each opener 26 is fixed to the frame 64. Assuming that the portion other than the base 67 of each opener 26 is an opener main body, the opener main body is fixed to the frame 64 via the base 67. Namely, the opener-side door drive mechanism 66 serves as a mechanism for opening and closing the FOUP 25.

Each opener 26 further includes a table portion 69 on which the opener-side opening 68 places and positions the FOUP 25, and a FOUP drive means 70 adapted to move the table portion 69 in the forward and backward directions X so as to move and position the FOUP 25 placed on the table portion 69 to the wafer transfer position. The FOUP drive means 70 serves as a substrate container drive means for displacing and driving the FOUP 70 in the forward and backward directions X. Such shifting of the table portion 69 having the FOUP 25 placed thereon due to the FOUP drive means 70 can switch a state in which the FOUP 25 is positioned in the wafer transfer position where it is closely contacted with the front face wall 28a into or from a state in which the FOUP 25 is positioned in a FOUP detaching position where it is spaced away from the front face wall 28a.

The opener-side door 65 has a detaching mechanism adapted to operate and release a latch mechanism used to detachably attach the FOUP-side door 61 to the FOUP main body 60. The detaching mechanism can be achieved by using a detaching latch key, for example. Also, the opener-side door 65 has a grasping mechanism adapted to grasp the FOUP-side door 61 which is removed from the FOUP main body 60. The grasping mechanism can be achieved by providing an adsorption pad or a fitting portion which is adapted to be fitted in the FOUP-side door 61.

The FOUP supporting portion 31 is arranged on the side of the external space 33 relative to the front face wall 28a, and is formed adjacent the front face wall 28a. The FOUP supporting portion 31 includes the horizontally extending table portion 69 and supports the FOUP 25 by placing the FOUP 25 on the table portion 69. The FOUP supporting portion 31 has an internal space formed therein, in which the FOUP drive means 70 is disposed to displace and drive the table portion 69. In the FOUP supporting portion 31, the FOUP 25 which is placed on the table portion 69 can be aligned with the wafer transfer position as well as with the FOUP detaching position, by shifting the table portion 69 in the forward and backward directions X due to the FOUP drive means 70. The forward and backward directions X refer to the thickness direction of the front face wall 28a, i.e., the carrying in and carrying out directions of the wafer 24, i.e., the horizontal or substantially the horizontal direction.

When the FOUP 25 is aligned with the wafer transfer position, the FOUP-side opening 62 formed in the FOUP 25 is closely contacted with the front face wall 28a, and is located in a position so as to face the opener-side opening 68 formed in the front face wall 28a. On the other hand, when the FOUP 25 is aligned with the FOUP detaching position, it is moved away from the front face wall 28a in the backward direction X2, thus detaching from the wafer transfer apparatus 23.

The opener-side door drive mechanism 66, when opening the opener-side opening 68, moves the opener-side door 65, which closes the opener-side opening 68, to an opening position spaced away from the opener-side aperture 35, in the forward and backward directions X and in the upper and lower directions Z. In the state where the FOUP 25 is located in the wafer transfer position of the front face wall 28a, by shifting the opener-side door 65 grasping the FOUP-side door 61 to the opening position, the FOUP internal space 34 and the ready space 29 can be in communication with each other while they are airtightly closed to the external space 33.

The opener-side door drive mechanism 66, when closing the opener-side opening 68, shifts the opener-side door 65, which is located in the opening position, toward the opener-side opening 68, in the forward and backward direction X and in the upper and lower directions Z, so as to move the opener-side door 65 to a closing position for closing the opener-side opening 68. In the state where the FOUP 25 is located in the wafer transfer position of the front face wall 28a, by moving the opener-side door 65 grasping the FOUP-side door 61 to the closing position, the communication between the FOUP internal space 34 and the ready space 29 can be released while they are maintained to be airtightly closed to the external space 33.

Upon the release of the communication between the FOUP internal space 34 and the ready space 29, the FOUP 25 can be detached from the FOUP supporting portion 31. In this manner, contact of the air to each wafer 24 can be prevented both when the wafer 24 is carried in the semiconductor processing equipment 20 and when the wafer 24 is carried out from the semiconductor processing equipment 20. Thus, attachment of dust particles present in the air to the wafer 24 to be processed can be prevented.

The opener drive mechanism 66 is configured to include a movable body 95, a movable body drive means 94, a connector 93, a link member 92 and a link member angular displacement means 91. The movable body 95 is configured such that it can pass through a space in the vicinity of the FOUP 25 which is supported by the FOUP supporting portion 31, and move both in the forward and backward directions. In this embodiment, the movable body 95 is configured to move in the forward and backward directions through a space provided below the table portion 69 of the FOUP supporting portion 31. In the state where the opener-side door 65 closes the opener-side opening 68, the movable body 95, movable body drive means 94, link member 92 and link member angular displacement means 91 are located in the internal space comprising the space below the table portion 69 of the FOUP supporting portion 31.

As shown in FIGS. 16 and 17, in the FOUP supporting portion 31, two rail-like guide members 90 extending in the forward and backward directions X are arranged with a space therebetween. In the movable body 95, fitting portions 89 are formed, each of which is adapted to be fitted in each guide member 90. The fitting of the fitting portions 89 of movable body 95 into each guide member 90 prevents displacement of the movable body 95 in directions other than the forward and backward directions X and enables the movable body 95 to be guided in the forward and backward directions X. In such a manner, the movable body 95 is supported by the FOUP supporting portion 31.

The movable body drive means 94 is supported by the FOUP supporting portion 31 and displaces and drives the movable body 95 in the forward and backward directions X for reciprocating operation. In this embodiment, the movable body drive means 94 is configured to include a screw shaft 88 which extends in the forward and backward directions X and is supported rotatably by the FOUP supporting portion 31, a thread engaging portion 87 which is engaged via threads with the screw shaft 88 and secured to the movable body 95, a motor 86 adapted to rotate the screw shaft 88, and a power transmission element 99 which is adapted to transmit the power of the motor 86 to the screw shaft 88 so as to rotate the screw shaft. In this embodiment, a ball screw mechanism is composed of the thread engaging portion 87 and the screw shaft. The power transmission element 99 is achieved by employing a belt power transmission mechanism, which includes a first pulley fixed to the output shaft of the motor, a second pulley fixed to the screw shaft 88, and a belt wound around and across the first pulley and the second pulley. In such a configuration, by rotating the screw shaft 88 due to the motor 86, the thread engaging portion 87 engaged via threads with the screw shaft 88 is moved in the forward and backward directions, and thus the movable portion 95 is moved in the forward and backward directions X together with the thread engaging portion 87.

In this embodiment, while the movable body 95 is moved by using the screw shaft 88, other designs may be employed for displacing the movable body 95 in the forward and backward directions X. For example, the movable body 95 may be moved in the forward and backward directions by using an air cylinder mechanism, a rack and pinion mechanism or the like.

As shown in FIGS. 14, 18 and 19, the connector 93 is fixed to the opener-side door 65. The connector 93 extends from the opener-side door 65 in the downward direction Z2 which is vertical to the forward and backward directions X. Specifically, the top end of the connector 93 is connected with the opener-side door 65, and the bottom end of the connector 93 is located below the top face of the FOUP supporting portion 31.

As shown in FIGS. 14 and 17, the link member 92 is provided in plural numbers, and each link member 92 links the movable body 95 and the connector 93 so as to constitute a parallel link mechanism. In this way, since the parallel link mechanism is provided by using each link member 92, movable body 95 and connector 93, the connector 93 linked to the movable body 95 can be rotated about the angular displacement axis L1 of the movable body 95 while maintaining its attitude.

In this embodiment, the angular displacement axis L extends in the horizontal left and right directions Y which are vertical to the forward and backward directions X. In this case, two link members 92 are provided. The two link members 92 extend in parallel to each other, with one ends being connected rotatably with the movable body 95 and with the other ends being connected rotatably with the connector 93. Each link member 92 is formed to have an equal length. In this embodiment, each link member 92 extends horizontally while the opener-side door 65 closes the opener-side opening 68. In this case, each link member 92 is formed in a plate-like shape which has the longitudinal direction along the forward and backward directions X and has the width direction along the left and right directions Y.

The link member angular displacement means 91 controls the angular displacement of each link member 92, relative to the movable body 95, to a predetermined angular position, corresponding to the position in the forward and backward directions of the movable body 95. As shown in FIGS. 14 and 16, the link member angular displacement means 91 is configured to include engaging portions 85 and controlling portions 84. The engaging portions 85 are provided to either one of the link member 92. Each controlling portion 84 is adapted to be engaged with each engaging portion 85 so as to control the angular position of the engaging portion 85 corresponding to the position in the forward and backward direction of the movable body 95.

The engaging portions 85 can be achieved by using pin members projecting from the middle portion along the longitudinal direction of the link member 92 and in parallel to the angular displacement axis L1. The controlling portions 84 can be realized by providing slit grooves or recesses in the FOUP supporting portion 31 such that each engaging portion 85 can be fitted therein. Each of the recesses, which are the controlling portions 84, is formed into a long hole whose position varies in the upward and downward directions as it moves in the forward and backward directions X. The recesses of the controlling portions 84 are sized to be slightly larger than the fitting portions of the engaging portions 85 to be fitted in the controlling portions 84. The engaging portions 85 extend in parallel to the angular displacement axis L. The engaging portions 85 to be fitted in the recesses of the controlling portions 84 are formed such that they can be moved in the direction along which the recesses of the controlling portion 84 extend, respectively. Thus, in the state where the transfer of the movable body 95 is stopped, angular displacement of the engaging portions 85 about the angular displacement axis L1 can be prevented due to the fitting of the engaging portion 85 in the controlling portions 84, thereby maintaining the amount of angular displacement of the link members 92 at a predetermined value.

The recesses of the controlling portions 84 extend toward the front face wall 28a, from the most spaced position relative to the front face wall 28a, in parallel to the forward and backward directions X, until they advance a preset distance A. After advancing a preset distance A, the controlling portions 84 extend in the downward direction Z2 as they further advance in the forward direction X1. In this embodiment, the distance A is set in advance at 25 mm, for example. In this embodiment, the engaging portions 85 project on both sides of the link members 92, respectively. The recesses of the controlling portions 84 are provided on both sides of the link members 92, such that the two engaging portions 85 can be fitted therein, respectively.

Figure 20:
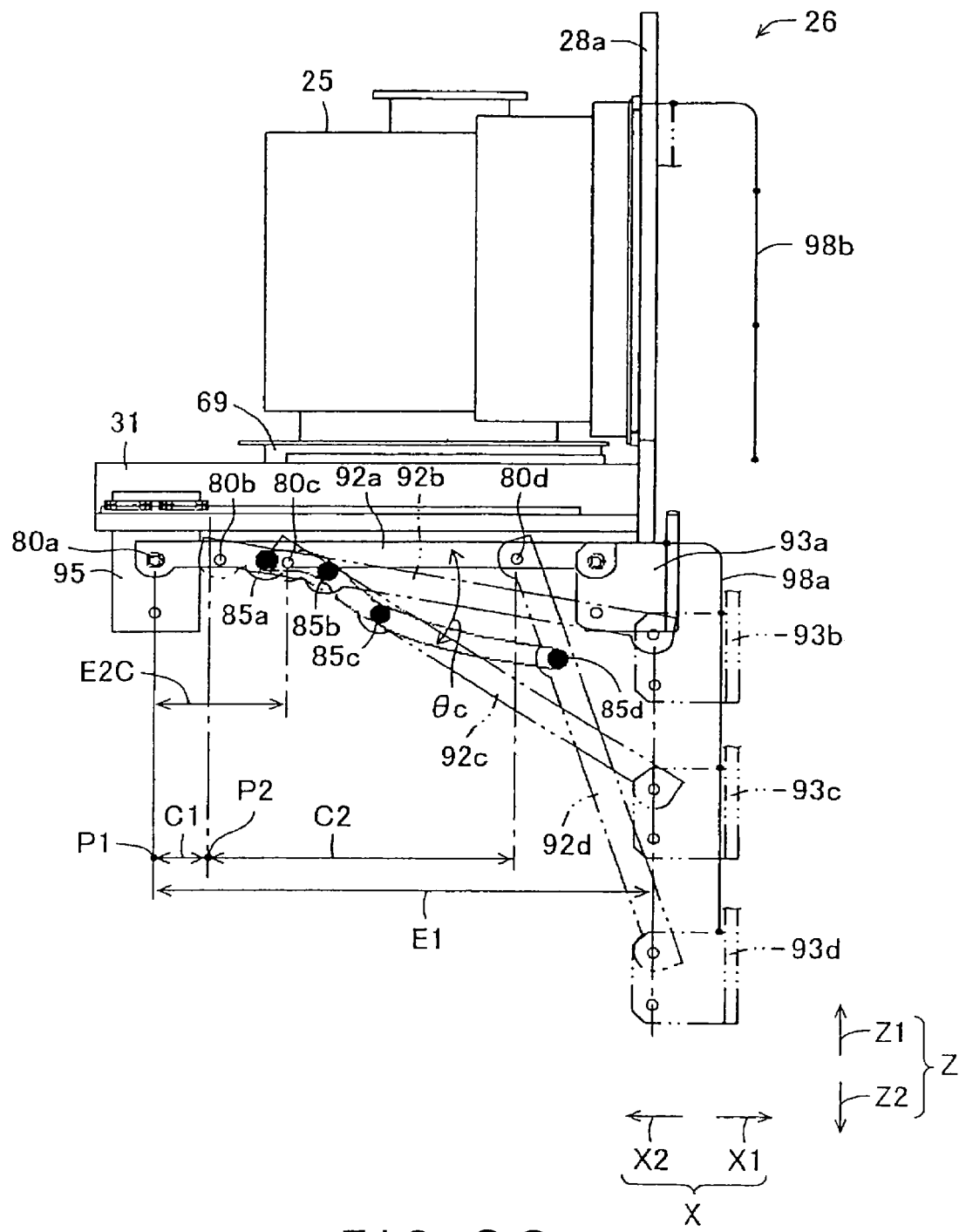
FIG. 20 is a diagram showing angular displacement of a link member 92 adapted to move forward and rearward together with a movable body 95.

FIG. 20 is a diagram showing angular displacement of one link member 92 adapted to move forward and backward together with the movable body 95. In FIG. 20, to facilitate understanding, the opener 26 is shown to be partly omitted. In FIG. 20, each element is depicted with subscripts a to d added to the reference numeral thereof, corresponding to shift positions 80a to 80d of the connecting point 80 between the movable body 95 and each link member 92. As shown in the drawing, the movable body 95 is advanced in the forward direction X1, as the subscript is changed from a to d. As described above, the connector 93 is connected with the movable body 95 which is movable in the forward and backward directions X, and is configured such that it can be angularly displaced about the angular displacement axis L1 relative to the movable body 95. Accordingly, the connector 93 can be located in any given position in the forward and backward directions X as well as in the upward and downward directions Z, by determining the position in the forward and backward directions of the movable body 95 and the angle about the angular displacement axis L1 of the link members 92 relative to the movable body 95. In this embodiment, the angular position of the link members 92 relative to the movable body 95 can be determined, with operation together with the transfer in the forward and backward directions of the movable body 95, by using the link member angular displacement means 91, such that the connector 93 can be moved along a predetermined track, corresponding to the transfer in the forward and backward directions of the movable body 95.

Assume that the connecting point at which the movable body 95 and each link member 92 are connected together is a reference position of the movable body 95. While the movable body 95 is moved in the forward and backward directions X over a distance C1 between a closing position P1 in which the movable body 95 is located, in the closed state where the FOUP-side door 61 grasping the opener-side door 65 closes the FOUP main body 60 and a detaching position P2 in which the movable body 95 is moved the preset distance A from the closing position P1 in the forward direction X1, the angular displacement of the link members 92 relative to the movable body 95 is controlled such that the connector 93 is moved in the forward and backward directions X. Furthermore, while the movable body 95 is moved in the forward and backward directions X over an evacuating region C2 defined in the forward direction X1 relative to the detaching position P2, the angular displacement of the link members 92 relative to the movable body 95 is determined such that the connector 93 is moved in the upward and downward directions Z.

In this embodiment, during the transfer over the distance C1 between the closing position P1 in which the movable body 95 is located and the detaching position P2 in which the movable body 95 is moved the preset distance A from the closing position P1 in the forward direction X1, the link member angular displacement means 91 keeps the angle θ of the link member 92 relative to the movable body 95 at a substantially constant value. Thus, the connector 93 can be moved in the forward and backward directions X. In the evacuating region C2, the link member angular displacement means 91 increases the angle of each link member 92 relative to the movable body 95, in response to the shift of the movable body 95 in the forward direction X1, while decreasing the angle of the link member 92 relative to the movable body 95, in response to the shift of the movable body 95 in the backward direction X2.

Assume that the distance in the forward and backward directions from the closing point P1 to the position of the connector 93, in which the transfer along the forward and backward directions should be stopped, is distance E1. Further, assume that the distance in the forward and backward directions from the closing point P1 to the position of the movable body 95 is distance E2, and that the length of each link member 92 is F. In this case, the angular position of the link member 92 is determined such that the angle θ of the link member 92 relative to the movable body 95 is $\cos^{-1}((E1-E2)/F)$. With such configuration, when the movable body 95 is moved in the forward and backward directions X, the connector 93 can be moved in the upward and downward directions Z while the connector 93 is maintained in the position E2 in the forward and backward directions. The term "$\cos^{-1}$" means "arc cosine", i.e., the inverse cosine trigonometric function. The angle is positive when the link member 92 is angularly displaced in the downward direction Z2 from the horizontal plane. For example, in FIG. 20, the angular position of the link member 92 is determined such that the angle θc of the link member 92 relative to the movable body 95, in the case where the connecting point 80 of the movable body 95 is located in a point E2c, is defined as $\cos^{-1}((E1-E2c)/F)$.

Initially, as the movable body 95 is moved in the forward direction X1 from the closing point P1, the connector 93 is moved in the forward direction X1. When the movable body 95 reaches the detaching position P2 after moved the preset distance A from the closing position P1, and is further moved in the forward direction X1, the connector 93 is moved horizontally while moved gradually in the vertically downward direction, and is then moved along a completely vertical or substantially vertical track, and finally moved in the downward direction Z2. Contrary, as the movable body 95 is moved in the backward direction X2 from the evacuating region C2, the connector 93 is moved in the upward direction Z1, and is further moved vertically upward while moved gradually in the horizontal direction. Thereafter, it is moved along a completely horizontal or substantially horizontal track. Furthermore, when the movable body 95 reaches the detaching position P2, and is further moved in the backward direction X2, the connector 93 is also moved in the backward direction X2. The opener-side door 65, which is integrally fixed to the connector 93, is also moved along a track of a similar shape to the connector 93. In FIG. 20, while the track of transfer of the opener-side door 65 is FIG. 21 is a diagram showing an opening and closing state in which the opener-side door 65 closes the opener-side opener-side door 65 is spaced away from the opener-side opener-side door 65 opens the opener-side opening 68.

Figure 21:
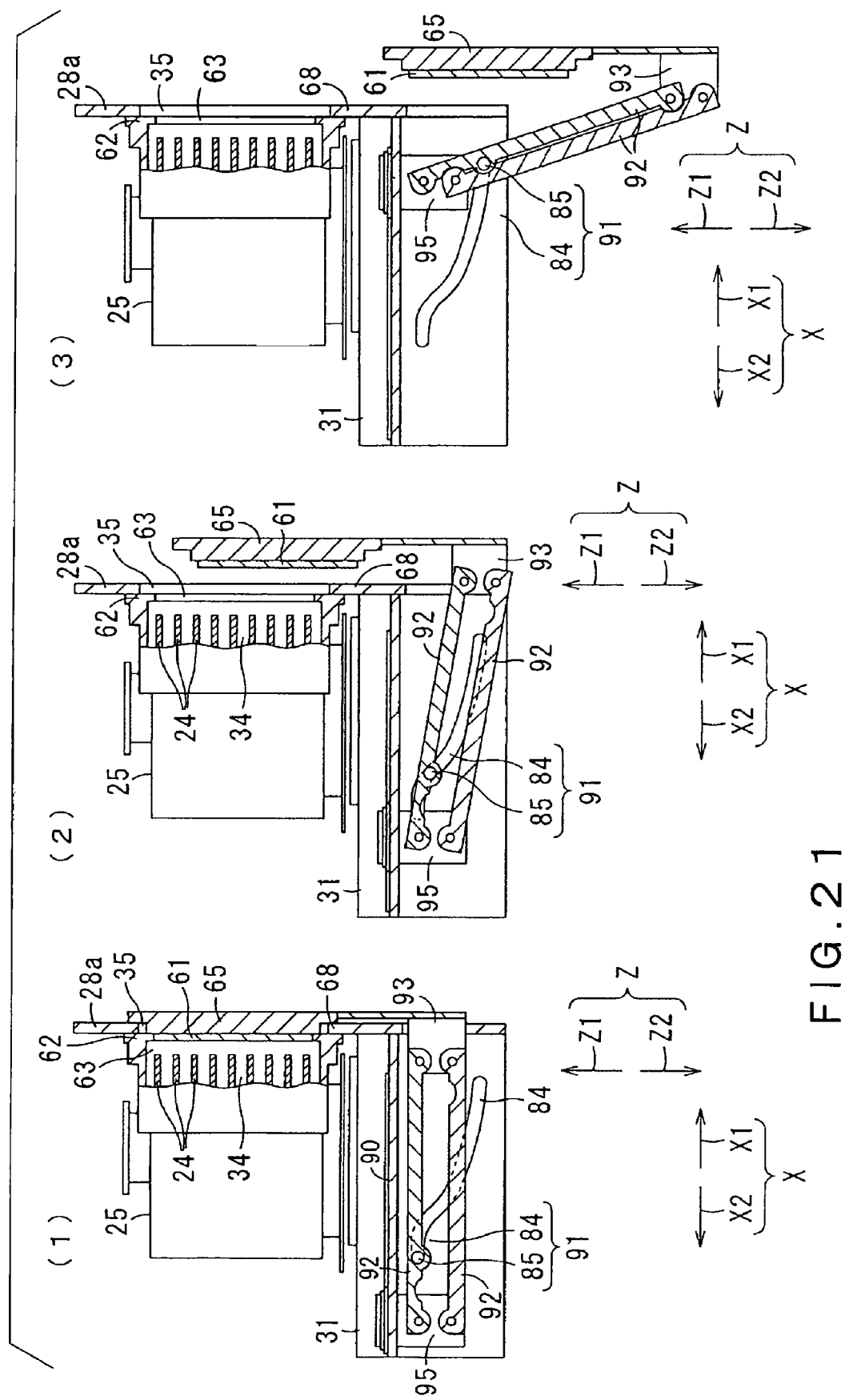
FIG. 21 is a diagram showing an opening and closing operation of an opener-side door 65.

As shown in FIG. 21 (1), in the state where the opener-side door 65 closes the opener-side opening 68, until the movable body 95 is moved the preset distance A in the forward and backward directions, the angular displacement of each link member 92 relative to the movable body 95 is prevented due to the link member angular displacement means 91. With such prevention of the angular displacement of each link member 92, the connector 93 is moved in the forward and backward directions X together with the transfer of the movable body 95. Accordingly, the opener-side door 65 is also moved in the forward and backward directions X together with the connector 93. In this manner, the opener-side door 65 is moved horizontally in the forward direction X1 from the front face wall 28a, thus being spaced away from the front face wall 28a.

As shown in FIG. 21 (2), when the movable body 95 approaches the front face wall 28a and is further moved in the forward direction X1, after passing through the detaching position at the preset distance A in the forward and backward directions, the angle of each link member 92 relative to the movable body 95 is gradually increased due to the link member angular displacement means 91, in response to the transfer of the movable body 95. With increase of the angular displacement of each link member 92, the connector 93 is angularly displaced about the angular displacement axis L relative to the movable body 95 together with the transfer of the movable body 95. In this embodiment, due to the adjustment of angle by the link member angular displacement means 91, the connector 93 can be moved in the downward direction Z2 relative to the FOUP supporting portion 31. Thus, the opener-side door 65 can also be moved in the downward direction Z2 together with the connector 93. Accordingly, as away from the front face wall 28a in the downward direction Z2 from the state where it is moved to create a gap in the forward In the state where the opener-door 65 grasps the FOUP-side door 61, by conducting the opening operation as described above, the FOUP-side door 61 removed from the FOUP main body 60 can be drawn into the ready space 29, and moved in the downward direction Z2, thus rendering the FOUP space 43 and the ready space 29 in communication with each other, thereby opening the FOUP main body 60.

On the other hand, in the case where the movable body 95 is moved away from the front face wall 28a in the backward direction X2, from the position in which the movable body 95 is closest to the front face wall 28a, the opener-side door 65 is advanced in the upward direction Z1 together with the connector 93 and approaches the front face wall 28a. When, the movable body 95 is further moved away from the front face wall 28a in the backward direction X2, the opener-side door 65 is moved in the backward direction X2 so as to close the opener-side opening 68 of the front face wall 28a. With such closing operation while the opener-side door 65 grasps the FOUP-side door 61, The FOUP-side door 61 removed from the FOUP main body 60 can be contacted again with the FOUP main body 60, thereby to close the FOUP main body 60.

Due to the connection of the movable body 95 and the connector 93 with a plurality of link members 92 so as to constitute a parallel link mechanism, the connector 93 can be advanced while keeping its attitude the same. Accordingly, with the opener-side door drive mechanism 66 in accordance with such an embodiment, the opener-side door 65 can also be moved in the forward and backward directions X as well as in the upward and downward directions Z while maintaining its attitude the same.

As described above, the link member angular displacement means 91 keeps the angle of each link member 92 relative to the movable body 95, from the closing state in which the opener-side door 65 closes the opener-side opening 68 to the state in which the movable body 95 is moved over the preset distance A in the forward direction X1. The link member angular displacement means 91 increases the angle of each link member 92 relative to the movable body 95 as the movable body 95 is further moved in the forward direction X1 from the detaching position after it has been moved over the preset distance A. With such configuration, by moving the movable body 95 in the forward and backward directions, the opener-side door 65 can be moved in the horizontal direction as well as in the vertical direction, as such the FOUP main body can be opened and closed by the FOUP-side door 61 which is grasped by the opener-side door 65. The preset distance A is set as a distance that can prevent interference of the FOUP-side door 61 or the like part with the front face wall 28a or the like element, in the case where the opener-side door 65 grasping the FOUP-side door 61 is moved in the downward direction Z2 from the front face wall 28a. For example, the preset distance A is set to be larger than a value obtained by adding the dimension measured in the thickness direction of the front face wall 28a and the dimension measured in the thickness direction of the FOUP-side door 61.

According to this embodiment, due to the connection between the movable body 95 and the connector 93 by using a plurality of link members 92 for constituting a parallel link mechanism, the opener-side door 65 fixed to the connector 93 and the FOUP-side door 61 grasped by the opener-side door 65 can be moved while keeping their attitudes the same. In this embodiment, the FOUP-side door 61 grasped by the opener-side door 65 can be displaced in the forward and backward directions X as well as angularly displaced about the angular displacement axis L of the movable body 95, thus it can be moved in two directions in the plane vertical to the angular displacement axis L in order to open and close the container body.

Due to the movable body drive means 94 for driving the movable body 95 in the forward and backward directions X, the FOUP-side door 61 grasped by the opener-side door 65 can be moved in the forward and backward directions X as well as in the upward and downward directions Z, so that the FOUP-side door 61 can be moved toward or away from the FOUP main body 60 in order to close and open the FOUP main body 60. The movable body 95 can be moved in the vicinity of the FOUP 25 supported by the FOUP supporting portion 31 even in the case of being moved in the forward and backward directions, thus there is no need for providing a mechanism for driving the movable body 95 in a position away from the FOUP supporting portion 31. Accordingly, in this embodiment, the opener-side door drive mechanism 66 can be located in the vicinity of the FOUP supporting portion 31, thereby achieving simplification and weight reduction of the openers 26. Additionally, a space away from the FOUP supporting portion 31 can be utilized effectively.

While the movable body 95 is moved over the region between the closing position P1 and the detaching position P2, the FOUP-side door 61 is moved in the direction consisting of or substantially consisting of directional components of the forward and backward directions X. Thus, when the FOUP-side door 61 is moved toward or away from the FOUP main body 60 in the forward and backward direction X, interference of the opening 62 of the FOUP main body 60 and the front face wall 28a with the FOUP-side door 61 can be prevented. Namely, the FOUP-side door 61 can be smoothly moved toward and away from the FOUP main body 60.

While the movable body 95 is moved over the evacuating region C2 in the forward and backward directions X, the FOUP-side door 61 is moved toward and away from the FOUP main body 60 in the upward and downward directions Z. Thus, the transfer in the forward and backward directions X of the FOUP-side door 61 can be controlled while it is spaced away from the FOUP main body 60 so as to lessen the movable range of the FOUP-side door 61 in the forward and backward directions X, thereby to reduce the dimension in the forward and backward directions of the movable space required for opening and closing the FOUP main body 60. With such configuration, interference of the FOUP-side door 61 and the opener-side door 65 with other elements arranged in the substrate transfer apparatus 23, for example, robots for transferring substrates, can be prevented.

In the case of opening the FOUP main body 60, the FOUP-side door 61 is moved away from the FOUP main body 60, drawing a horizontal or substantially horizontal track, and further moved away from the FOUP main body 60, drawing a vertical or substantially vertical track after the horizontal movement. In the case of closing the FOUP main body 60, the FOUP-side door 61 approaches the FOUP main body 60, while being spaced away from the FOUP main body 60 and drawing a vertical or substantially vertical track, and is then in contract with the FOUP main body 60, drawing a horizontal or substantially horizontal track, after the approach. In this way, with the opening operation of the FOUP main body 60 by moving the FOUP-side door 61 below the FOUP main body 60, air stream flowing from above to below can be created, thus reducing the tendency of dust particles to be attached to the FOUP internal space 34 and ready space 29, thereby preventing contamination of substrates upon carrying in and carrying out them.

According to this embodiment, since the FOUP supporting portion 31 supports the movable body drive means 94, link member angular displacement means 91 and movable body 95, there is no need for separately providing portions adapted to support the movable drive means 94 and movable body 95, thus reducing the number of components constituting the openers 26. Consequently, simplification and weight reduction of the openers 26 can be achieved, and their structure can be simplified, thereby reducing the production cost of the openers 26. For example, by using the FOUP supporting portion 31 to support each element for constituting the opener-side door drive mechanism 66, the need for having each constitutional element of the opener-side door drive mechanism 66 be fixed and supported to the front face wall 28a formed in the openers 26 can be eliminated, as such downsizing the front face wall 28a, and hence lowering the rigidity of the front face wall 28a, thereby to reduce the production cost of the openers 26.

According to this embodiment, with the link member angular displacement means 91 including the engaging portions 85 and controlling portions 84, adjustment of the angular displacement of each link member 92 relative to the movable body 95 can be achieved without providing any separate driving force. Thus, only by moving the movable body 95 in the forward and backward directions due to the movable body drive means 94, each link member 92 can be angularly displaced together with the transfer of the movable body 95. Therefore, the configuration of the openers 26 can be further simplified, thereby reducing the number of components.

In this embodiment, due to the arrangement of the movable body drive means 94, link member angular displacement means 91 and movable body 95 in the internal space formed in the FOUP supporting portion 31, there is no need for separately providing a cover for covering the movable body drive means 94, link member angular displacement means 91 and movable body 95, thus reducing the number of parts. Accordingly, the openers 26 can be further downsized, and the entire structure can be further simplified.

Figure 22:
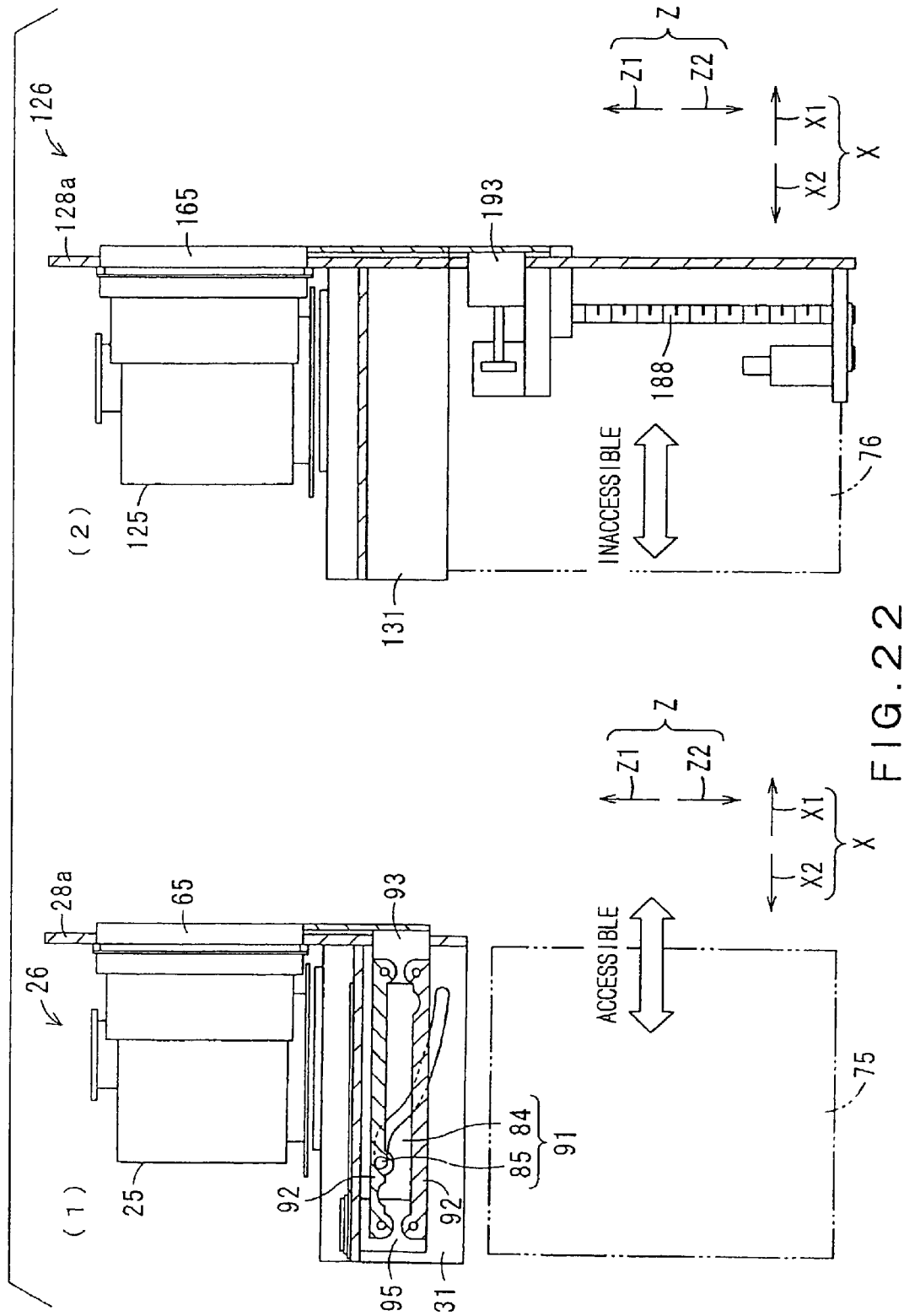
FIG. 22 is a diagram provided for comparison between the opener 26 of the present embodiment and an opener 126 of a comparative example.

FIG. 22 is a diagram provided for comparison between the opener 26 of this embodiment and an opener 126 of a comparative example. The opener 126 of the comparative example includes a screw shaft 188 extending in the upward and downward directions Z, which is adapted to move a connector 193 connected with an opener-side door 165. It is noted that like parts of the opener 126 of the comparative example, which are also included in this embodiment, are designated by reference numerals shown by adding 100 to the corresponding reference numerals shown in this embodiment, and their details are omitted here.

In the case of the opener 26 of this embodiment, the movable body 95 is housed in the internal space of the FOUP supporting portion 31. Thus, the dimension in the horizontal direction can be reduced as compared with the opener 126 of the comparative example shown in FIG. 22 (2). In this embodiment, unlike the opener 126 of the comparative example, there is no need for supporting a guide means for guiding the screw shaft 188 and connector 193, by using a front face wall 128a. Therefore, the front face wall 28a can be downsized, thereby providing it at a significantly low production cost. In this embodiment, a door can be provided, with which a worker can enter the space below the FOUP supporting portion 31, thus the provision of the door can facilitate the maintenance. In addition, since the link members 92 can extend horizontally while the movable body 93 is moved to the closing position P1, the opener 26 in the closed state can be further downsized. Furthermore, in this embodiment, because the mechanism for moving the FOUP-side door is not arranged along the upward and downward directions Z, in the case where a worker enters the fixing space 78 of the wafer transfer apparatus upon maintenance, the openers do not interfere with the entering of the worker, as such the worker can readily advance into the fixing space of the wafer transfer apparatus by using the door.

Figure 23:
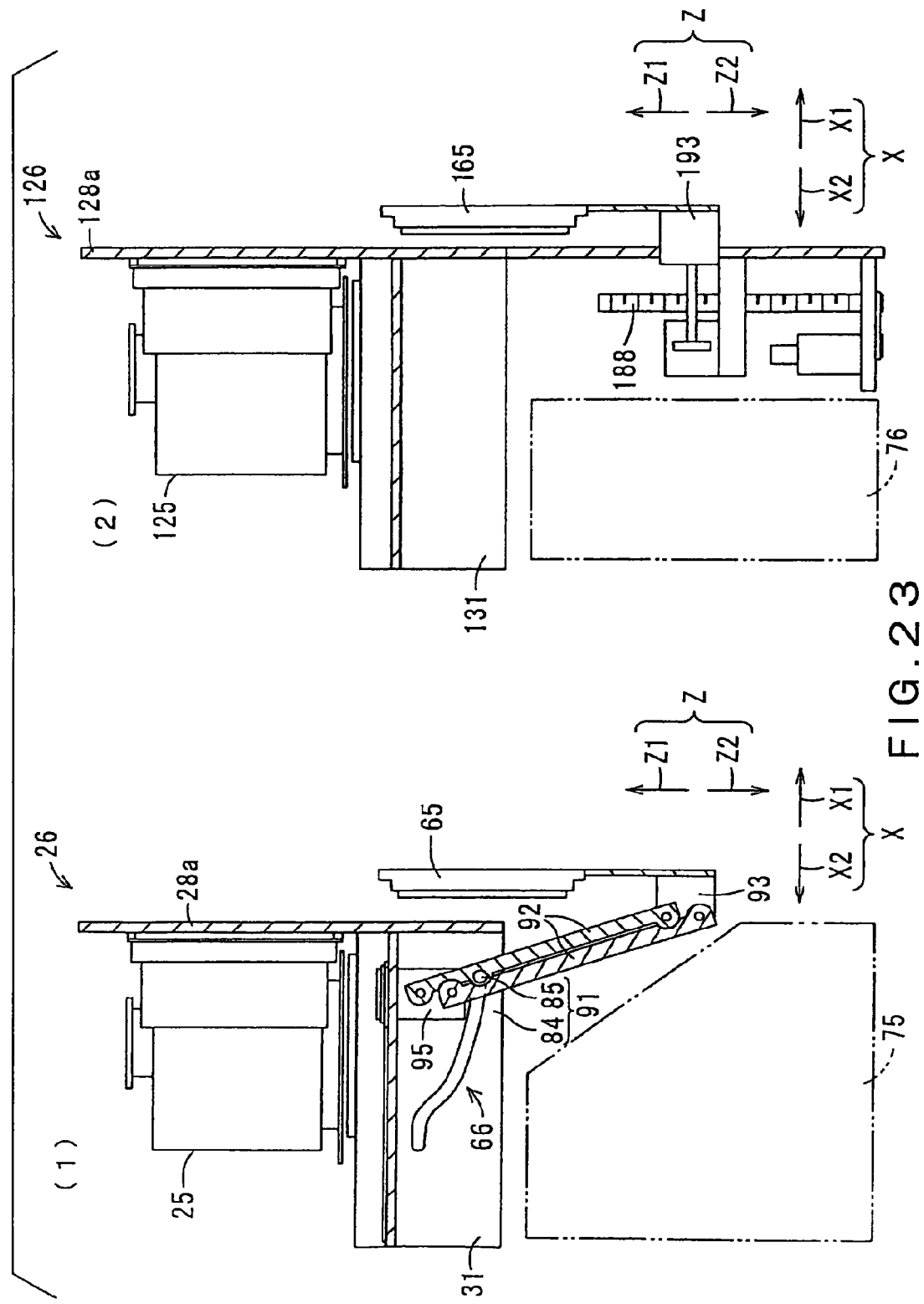
FIG. 23 is another diagram provided for comparison between the opener 26 of the present embodiment and an opener 126 of a comparative example.

FIG. 23 is a diagram provided for comparison between the opener 26 of this embodiment and another opener 126 of an the comparative example. In the opener 26 of this embodiment, the opener-side door drive mechanism 66 can be located in a position adjacent to the FOUP supporting portion 31, extending in the upward and downward directions. Thus, the space 75 provided away from the FOUP supporting portion 31 can be utilized effectively. On the other hand, in the opener 126 of the comparative example, a drive means for driving a movable body 193 and a guide means for guiding the movable body 193 should be arranged in positions spaced away from a FOUP supporting section 131. Therefore, the space 76 which is defined away from the FOUP supporting portion 131 can not be utilized effectively. In this embodiment, for example, the robot controller 44, devices necessary for an EFEM as the wafer transfer apparatus, materials 97 for maintenance and the like can be arranged in positions spaced away from the FOUP supporting portion 31.

Figure 24:
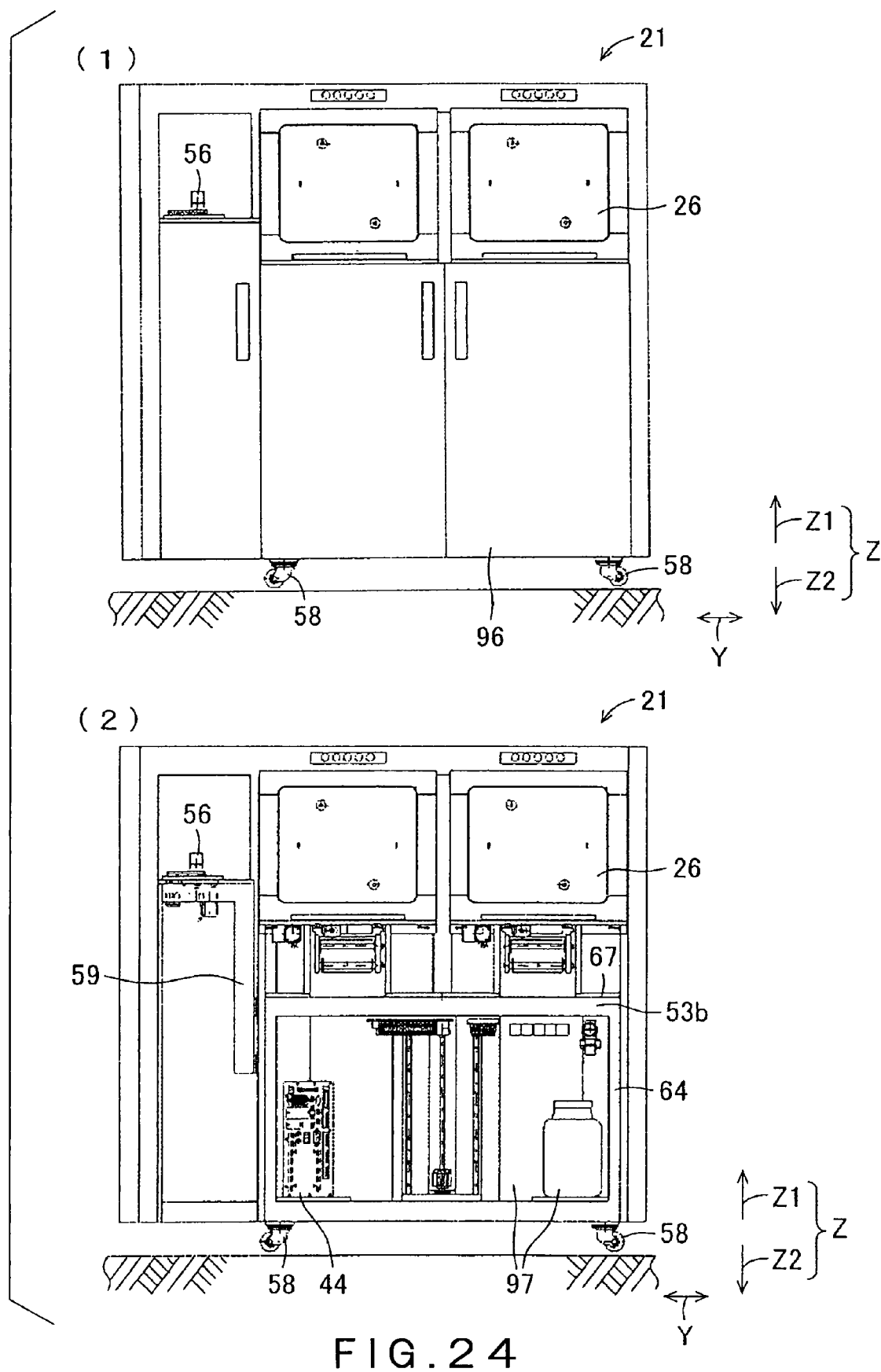
FIG. 24 is a diagram showing the carrier unit 21 including an access door 96 formed in a space below the opener 26.

FIG. 24 is a diagram showing the carrier unit 21 including an access door 96 formed in a space below the openers 26. FIG. 24 (1) shows a state in which the access door 96 is closed, opened. In this embodiment, the access door 96 is provided at the frame main body 50a. In the state where the carrier unit 21 is attached to the main body constituting member 51, the access door 96, when opened, can provide direct communication of the frame main body 50a and internal space 57 with the external space 33.

In this embodiment, in the space 75 provided below the openers 26 or the internal space 57 of the frame main body 50a, the robot controller 44, devices necessary for the wafer transfer apparatus 23 and maintenance materials 97 can be arranged. By opening the access door 96, a worker can conduct adjustment and maintenance of the wafer transfer apparatus without entering the ready space 29 to the interior. In addition, without entering the movable space 79, the worker can advance directly into the fixing space 79 from the external space 33 in order to carry out maintenance for each part arranged in the fixing space 79, thereby enhancing the workability.

Due to the partition member 52 described above, migration, into the movable space 79, of dust particles to be generated in the fixing space 78 upon maintenance can be prevented, thereby controlling deterioration of cleanliness in the movable space. Thus, cleanliness in the movable space can be recovered in a shorter time after maintenance, as such enhancing the working efficiency.

As described above, contamination which is attributed to entering of a worker in the ready space 29 can be controlled, thus reducing the time required for recovering the cleanliness in the ready space 29, thereby enhancing the working efficiency. In addition, adjusting means such as equipment for operation used for adjustment and maintenance of the wafer transfer apparatus can be arranged in the vicinity of the opening of access door 96. For example, the adjusting means may be an air valve or knob for use in adjustment. The adjusting means may include an operating section which comprises a plurality of buttons and knobs and can be operated by a worker, the operating section being disposed at an X2 end of the controller. Consequently, the worker can readily conduct the adjustment and maintenance of the wafer transfer apparatus without entering the internal space 57 to the interior. Alternatively, the adjusting means may be another unit than the controller 44, and may be a connector or connecting switch in the wiring, or an electric circuit or filter of a fan filter unit. In this embodiment, since the openers 26 downsized as describe above can be provided, the internal space 57 can be enlarged, thus increasing adjusting means which can be arranged in the internal space 57. Moreover, since such small-sized openers can be used as the openers to be supported by the frame main body 50a, the height dimension of the frame main body 50a can be reduced. Accordingly, the ready space 29 can also be downsized.

Figure 25:
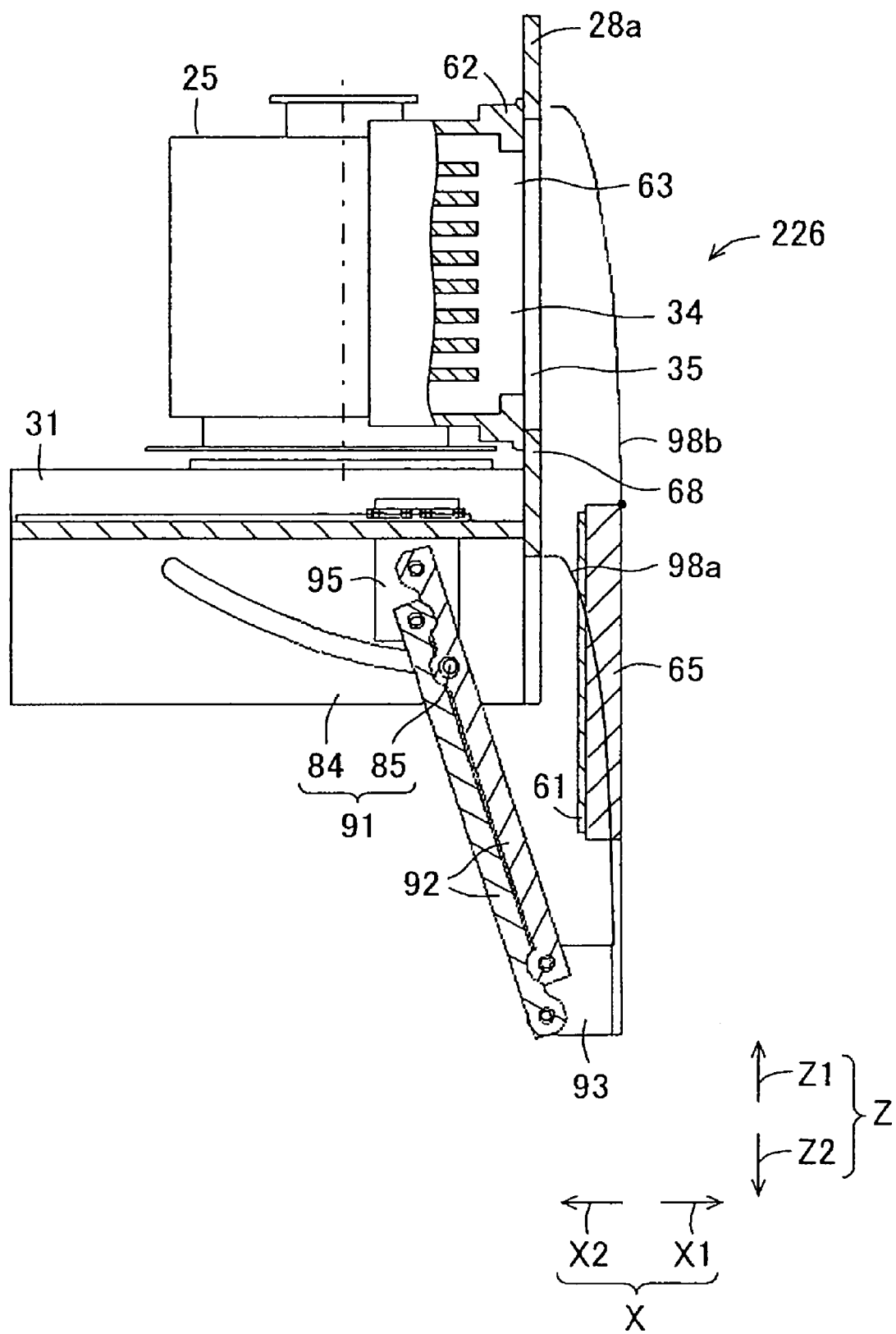
FIG. 25 is a diagram showing an opener 226 which is an embodiment of the present invention.

FIG. 25 is a diagram showing an opener 226 which is a second embodiment of the present invention. The opener 226 is the same as that of the first embodiment, except that the transfer track of the connector 93 is different. Like parts of the first embodiment in the opener 226 are designated by like reference numerals and their details are omitted here.

While the openers 26 have been described, upon opening the FOUP, to move first the connector 93 in the horizontal direction and then move it in the downward direction Z2, the operating manner is not limited to this aspect. For example, in the second embodiment, the link member angular displacement means 91 controls the angle of the link members 92 such that the connector 93 is moved along a substantially horizontal curved track while the movable body 93 is moved in the forward and backward directions X between the closing position P1 and the detaching position P2. In addition, the link member angular displacement means 91 controls the angle of the link members 92 such that the connector 93 is moved along a substantially vertical curved track while the movable body 93 is moved in the forward and backward directions X over the evacuating region located in the forward direction X1 from the detaching position P2.

Specifically, when the movable body 95 is moved over the region C1 between the closing position P1 and the detaching position P2, the connector 93 is moved in the forward direction X1 as well as in the downward direction Z2. The directional components include the component of the forward direction X1 much more than the component of the downward direction Z2. Also, when the movable body 95 is moved over the evacuating region C2 in the forward direction X1, the connector 93 is moved in the forward direction X1 as well as in the downward direction Z2. However, the directional components in this case include the component of the forward direction X1 far less than the component of the downward direction Z2. As a result, the connector 93 in the second embodiment is moved along an elliptic arc track. It can be understood that the transfer route of the connector 93 can be readily altered by setting the shape of the recess of the controlling portions 84.

Figure 26:
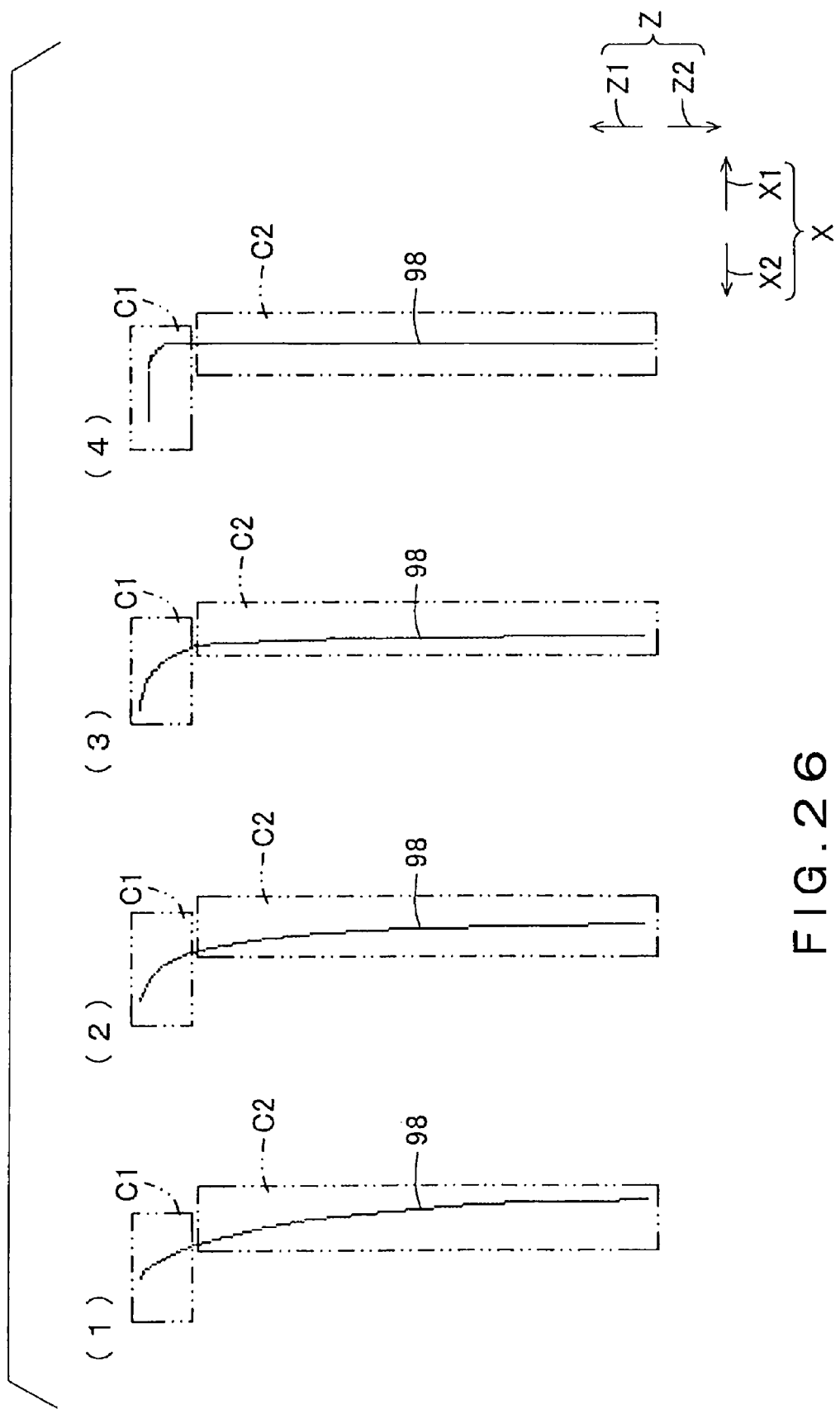
FIG. 26 is a diagram showing an example of a transfer track 98 of a connection portion 93.

FIG. 26 is a diagram showing one example of a transfer track 98 of the connector 93 of the second embodiment, and FIG. 26 (4) shows the transfer track 98 of the connector 93 of the first embodiment. The track of the connector 93 may be changed into a curved line as in these embodiments, or may be changed into a broken line, or may be changed like a wave (not shown).

The link angular displacement means 91 controls the angular displacement of the link members 92 relative to the movable body 95 such that the components of the transfer direction of the connector 93 include at least the front and forward directions X, while the movable body 95 is moved in the forward and backward directions X over the region C1 between the closing position P1 and the detaching position P2. In addition, the link angular displacement means 91 angularly displace the link members 92 relative to the movable body 95, together with the transfer of the movable body 95, such that the component of the transfer direction of the connector 93 include at least the components vertical to the forward and backward directions X, while the movable body 95 is moved in the forward and backward directions X over the evacuating region C2 located in the forward direction X1 from the detaching position P2. Consequently, interference of each door 61, 65 with the front face wall 28a can be prevented, and its undesired shift away from the front face wall 28a can also be prevented, thus providing a compact movable range of each door 61, 65 and enabling them to be arranged in the ready space 29.

Figure 27:
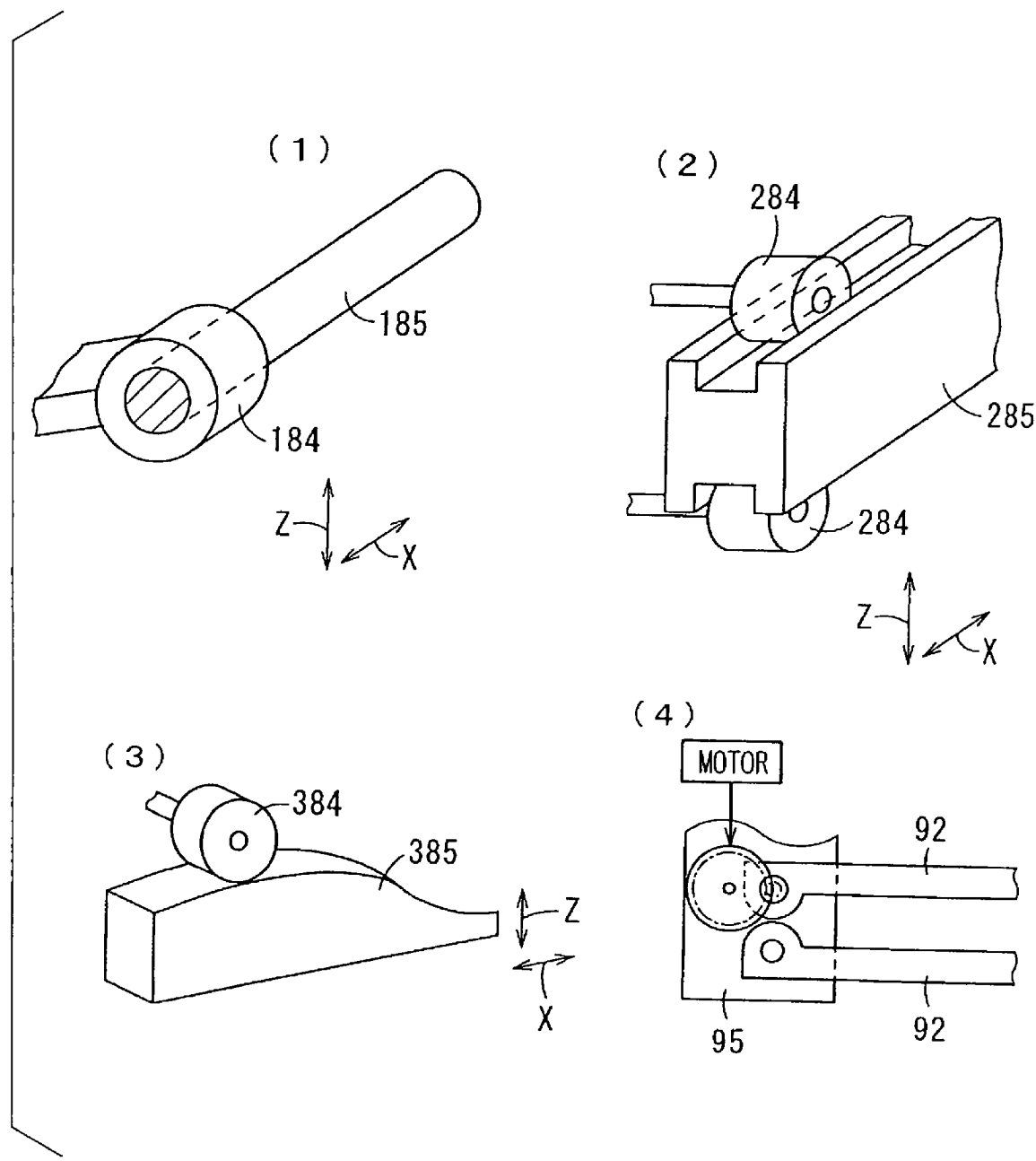
FIG. 27 is a diagram showing a part of a link member angular displacement means 91 of another embodiment of the present invention.

FIG. 27 is a diagram showing a part of the link member angular displacement means 91 of another embodiment. In the embodiment previously described above, the link member angular displacement means 91 has a structure to control the angular displacement of the link member 92 by fitting the pin members 85 into the recesses 84. The present invention, however, is not limited to such an aspect. For example, as formed of a rail member having a cylindrical shape with a uniform section, and each engaging portion 184 may be formed of a ring member surrounding the rail member about its axis.

Alternatively, as shown in FIG. 27 (2), each controlling portion 285 may be formed of a rail-like member including rail grooves formed in its opposite two faces, and each engaging portion 284 may include two members for grasping the rail grooves of the controlling portion 285 on both sides. Otherwise, formed to have a curved top face because each door 61, 65 has a self-weight. In this way, each engaging portion 84, 184, 284, 384 can be guided by each controlling portion 85, 185, 285, 385 such that the displacement in the direction vertical to the forward and backward directions X can be prevented while they can be moved in the forward and backward directions, thus achieving the link member angular displacement means 91.

In addition, as shown in FIG. 27 (4), the link member angular displacement means 91 may be configured to include a motor adapted to displace the link members 92 and a power transmission mechanism for transmitting the power of the motor to the link members 92. In this case, by angularly displacing the link members 92 in a predetermined amount using the motor in response to the transfer amount of the movable body 95, the same effect as described above can be obtained. With the angular displacement of the link members 92 due to the motor, the transfer route of the connector 93 in the case of opening the door can be made different from that in the case of closing the door.

Figure 28:
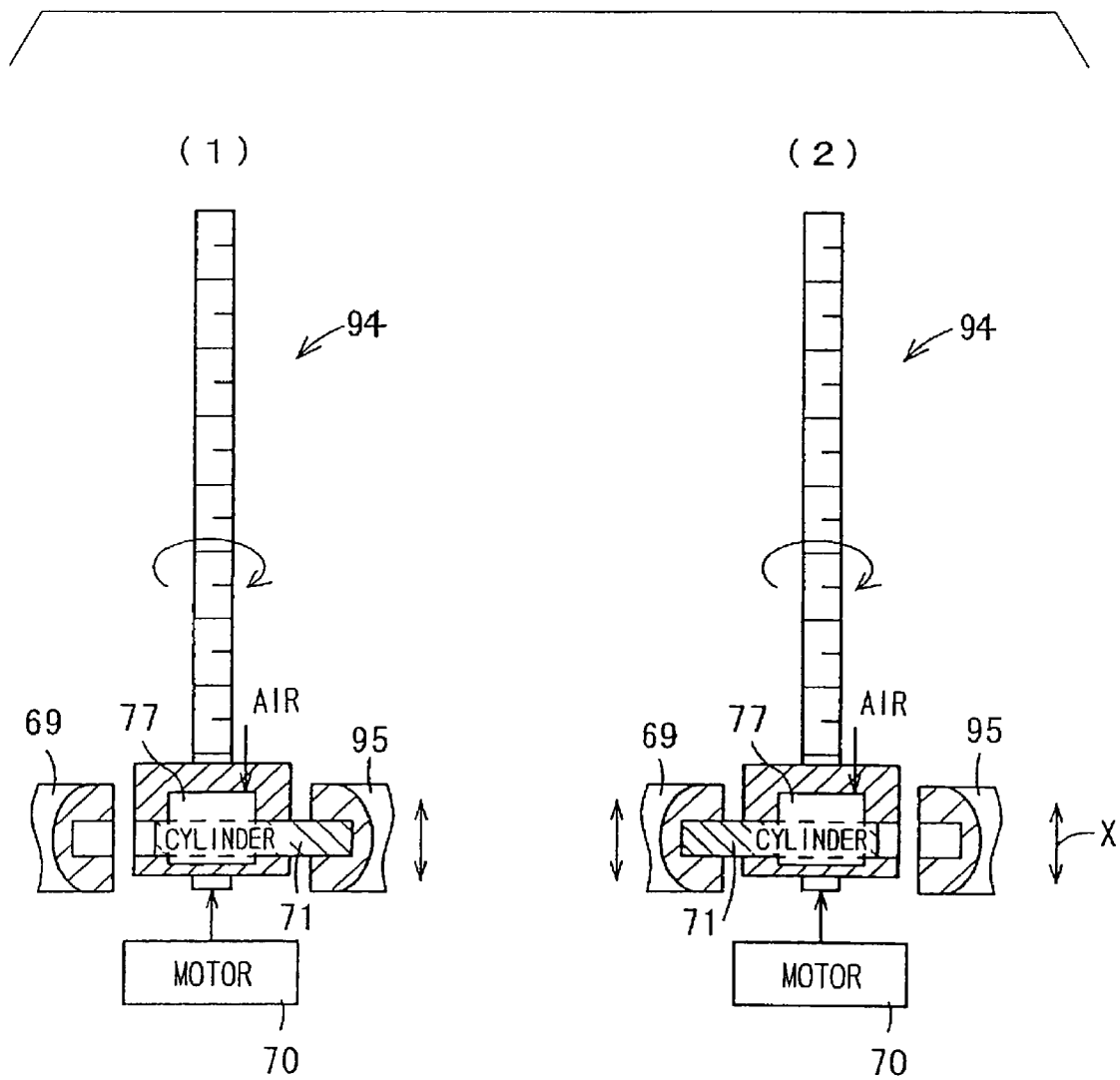
FIG. 28 is a diagram showing a simplified movable body drive means 94 of another embodiment of the present invention.

FIG. 28 is a diagram showing the simplified movable body drive means 91 of another embodiment. Each opener 26 has the FOUP drive means 70 for driving the table portion 69, on which the FOUP supporting portion 31 is placed, in the forward and backward directions X. The FOUP drive means 70 is adapted to move the table portion 69, due to a robot or worker, in the forward and backward directions X toward the front face wall 28a to make the FOUP 25 be in close contact with the front face wall 28a, while the FOUP 25 is arranged on the table portion 69 of the FOUP supporting portion 31.

Since the table portion 69 and the movable body 95 can be moved in the same forward and backward directions, in this embodiment, each opener 26 includes a switching means 77 adapted to switch either operation of the table portion 69 or movable body 95. Thus, with a single drive means, the table portion 69 and the movable body 95 can be selectively moved in the forward and backward directions X.

For example, the drive means 70 moves a movable member 73 in the forward and backward directions X. On the movable member 73, a dual type air cylinder 77 is mounted, which can selectively project a pin portion 71 in two directions substantially vertical to the forward and backward directions X. As shown in FIG. 28 (1), by projecting the pin portion 71 in a first direction due to the air cylinder 77 so as to fit the pin portion 71 into the movable body 95, the movable body 95 can be moved in the forward and backward directions X together with the movable member 73. Alternatively, as shown in FIG. 28 (2), by projecting the pin portion 71 in a second direction due to the air cylinder 77 so as to fit the pin portion 71 into the table portion 69, the table portion 69 can be moved in the forward and backward directions X together with the movable member 73.

In this embodiment, since the movable body 95 can be provided in the vicinity of the FOUP supporting portion 31, a combined structure adapted to function as the movable body drive means as well as function as another drive means provided in the FOUP supporting portion 31 can be used. By providing the movable drive means by using a substrate container drive means adapted to move the FOUP 25 in the forward and backward directions X via the table portion 69, there is no need for employing two drive sources, i.e., a drive source for displacing and driving the movable body and a drive source for displacing and driving the substrate container, thus providing the substrate container drive means and the movable body drive means by using a single drive source, thereby reducing the number of drive sources for the substrate container openers. In this manner, by employing another drive means provided in the FOUP supporting portion 31, which can also serve as the movable body drive means, the number of the drive means can be reduced, as such simplifying the structure as well as improving the degree of freedom in designing. In addition, the openers 26 can be downsized, thus also simplifying the structure.

Figure 29:
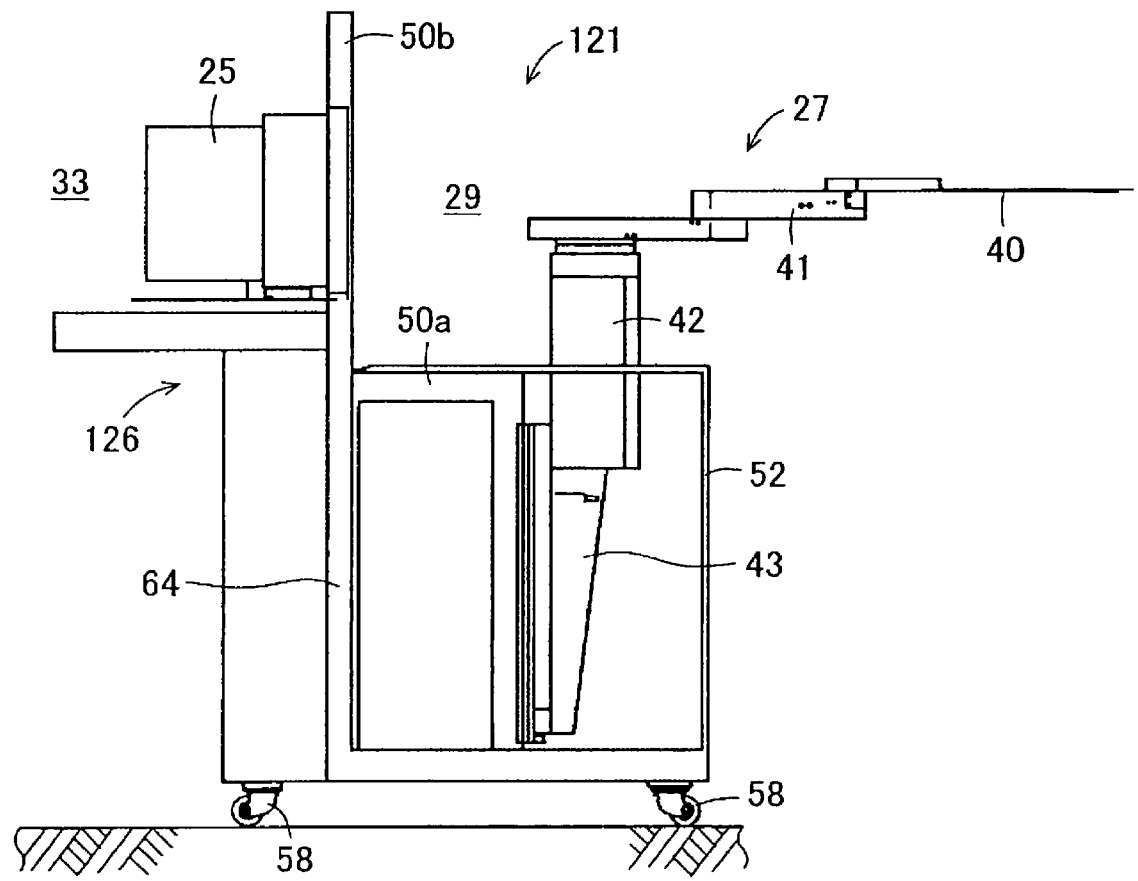
FIG. 29 is a section of a second carrier unit 121 which is still another embodiment of the present invention.

FIG. 29 is a section of a second carrier unit 121 which is still another embodiment of the present invention. The second carrier unit 121 has a structure similar to the carrier unit 21 of the first embodiment, thus like parts are designated by like reference numerals. The second carrier unit 121 is different form the carrier unit 21 of the first embodiment in the construction of openers 126, and the construction of the remainder of the second carrier unit 121 is the same as in the carrier unit 21. The second carrier unit 121 includes the Even with such a carrier unit 121, the same effect as that of the first embodiment can be obtained.

Figure 30:
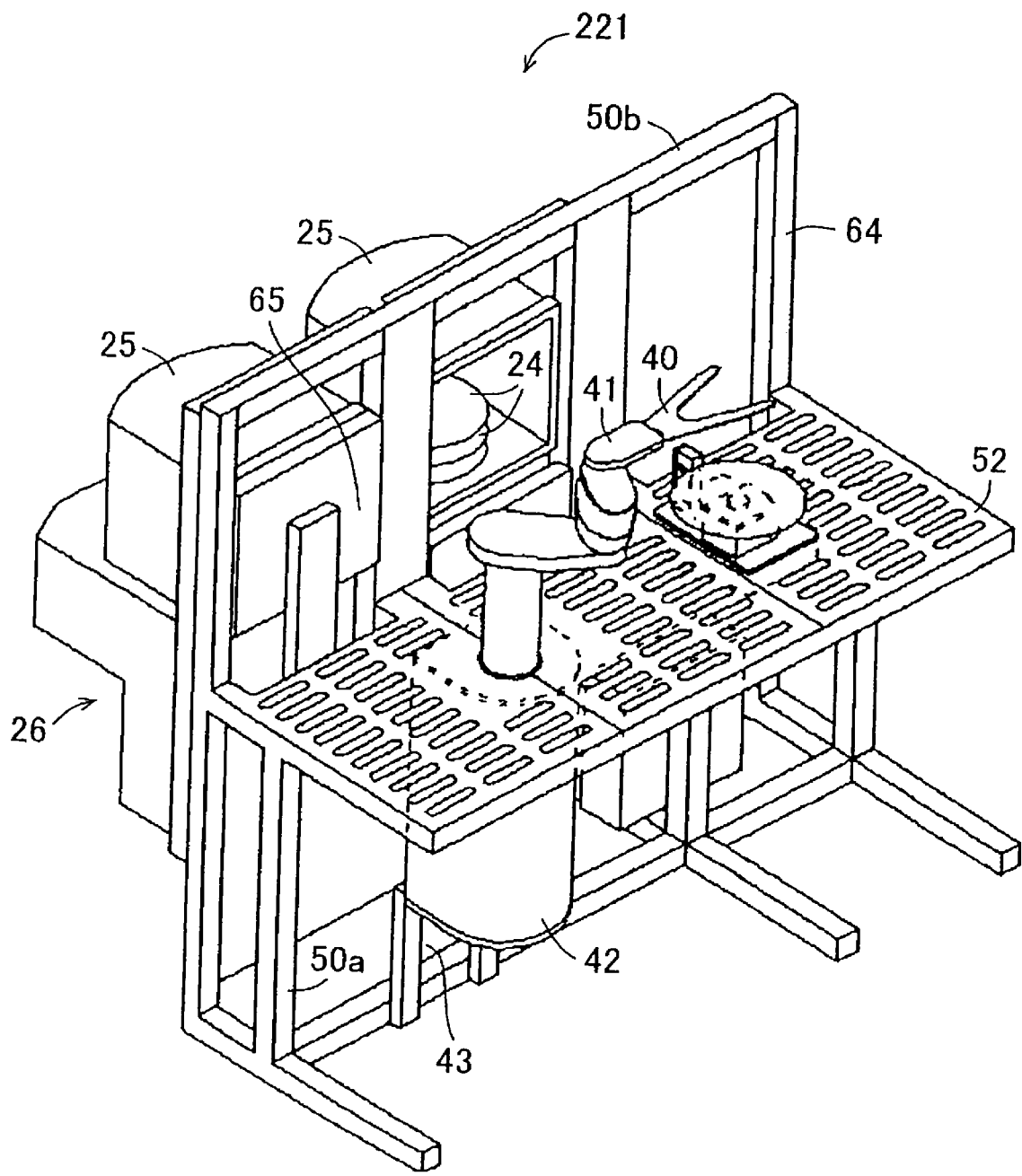
FIG. 30 is a perspective view of a third carrier unit 221 which is still another embodiment of the present invention.
Figure 31:
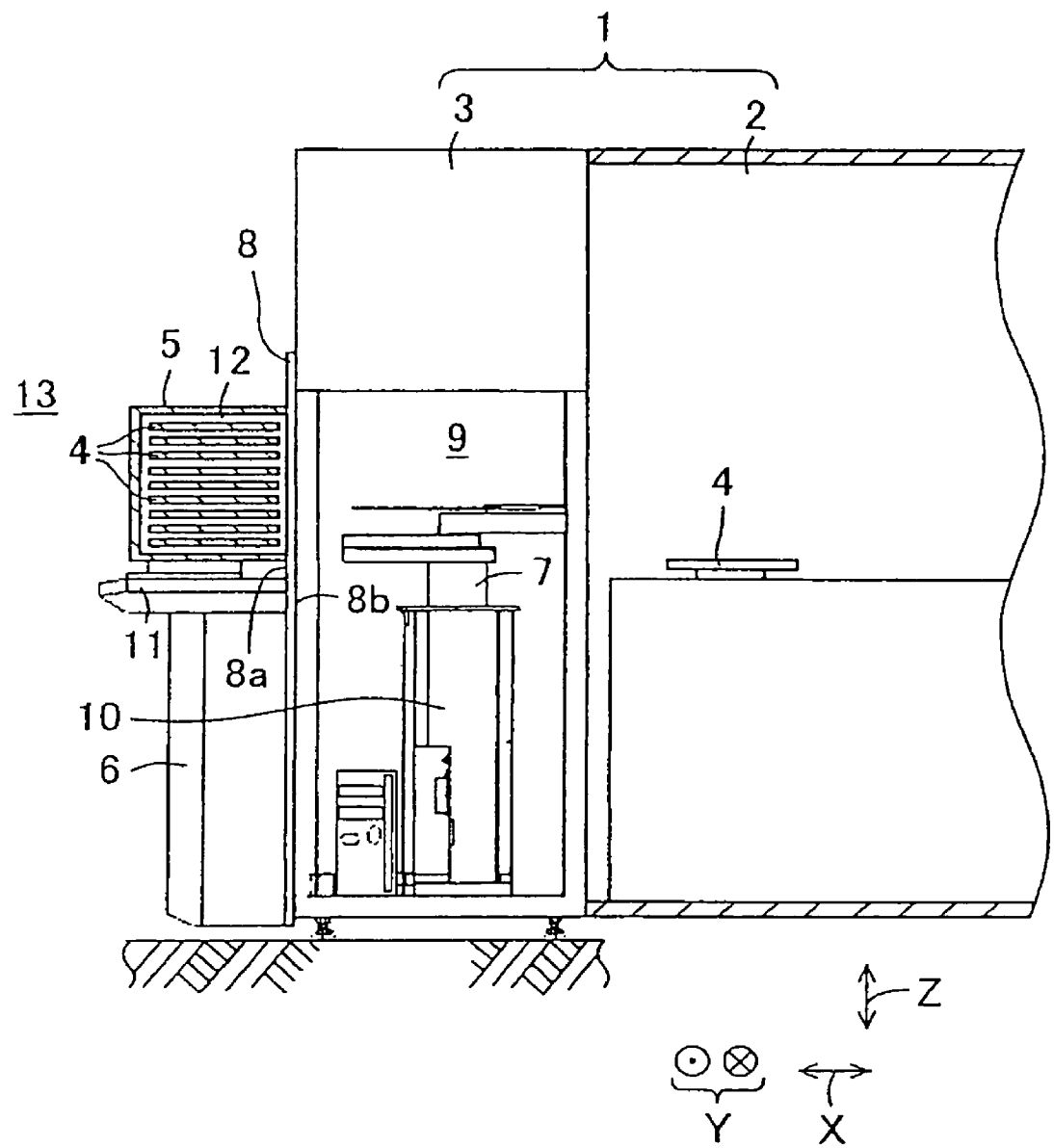
FIG. 31 is a section of a part of semiconductor processing equipment 1 of the related art.

FIG. 30 is a section of a third carrier unit 221 which is still another embodiment of the present invention. The third carrier unit 221 has a structure similar to the carrier unit 21 of the first embodiment, thus like parts are designated by like reference numerals. The third carrier unit 221 is different form the carrier unit 21 of the first embodiment in the construction of the frame divided body, and the construction of the remainder of the third carrier unit 221 is the same as in the carrier unit 21. In the frame divided body, a skeleton may be formed, which is composed of a plurality of rod-like members connected into a frame-like structure and has sufficient rigidity, and plate-like members may be fixed to the skeleton. In this case, by fixing each carrier element 26, 27, 56 to the rod-like members, the same effect as in the first embodiment can be obtained. In the case where a down flow is generated by an FFU, the partition member 52 may be formed in a plate-like shape, and openings extending through in its thickness direction may be formed therein in plural numbers. In this case, an atmospheric gas can be flowed from the movable body 79 down into the fixing space 78 of the ready space 29, thereby to maintain the degree of cleanliness of the movable space 79.

The embodiment described above is illustrative only, and many modifications can be made without departing from the scope of this invention. For example, in this embodiment, while the semiconductor wafer 24 has been described as the substrate to be processed, the present invention can be applied to substrates other than semiconductor wafers, for example, glass substrates for use in the flat panel displays (FPD) to obtain the same effect. With respect to the shape of the frame structure, it is not limited to those exemplified in the embodiments described above, provided that it can exhibit proper rigidity. In addition, while the FOUP 25 has been employed as the substrate container, it may be an open cassette or front opening shipping box (FOSB). In the embodiment described above, the movable body does not have to be moved horizontally, provided that the connector 93 can be moved in the horizontal or substantially horizontal direction. In the case of using an open cassette, instead of using the FOUP openers 26, a holding portion, for holding the open cassette while aligning it, is fixed to the fixing portion of the frame divided body 50.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

In the present invention, the following aspects can be applied.

(1) An opener-side door drive mechanism adapted to displace and drive an opener-side door, wherein the opener-side door constitutes a part of a substrate container opener adapted to open and close a substrate container and is adapted to grasp an container-side door removed from a container body, and wherein the substrate container includes the container body which is adapted to be opened in a preset direction and in which a space for containing substrates is formed, and the substrate container further includes the container-side door which is formed detachably to the container body and is adapted to close the opening of the space while its is attached to the container body, the opener-side door drive mechanism comprising:

(a) a movable body which can be moved in the forward and backward directions X, including a forward direction X1 corresponding to the front face direction relative to the container body which is positioned and supported by a container supporting portion constituting a part of the substrate container opener, and a backward direction X2 which is opposite to the forward direction X1;

(b) a movable body drive means adapted to displace and drive the movable body in the forward and backward directions X;

(c) a connector which is fixed to the opener-side door;

(d) a plurality of link members which connect the connector with the movable body so as to constitute a parallel link mechanism wherein the connector is connected with the movable body such that it can be angularly displaced relative to the movable body about the angular displacement axis L extending vertically or substantially vertically to the forward and backward directions X;

(e) a link member angular displacement means which can angularly displace each link member relative to the movable body at a predetermined angular position in response to a position in the forward and backward directions of the movable body, (e1) wherein the angular displacement of the link members relative to the movable body is controlled such that the components of the transfer direction of the connector include at least the components of the forward and backward directions X, while the movable body is moved in the forward and backward directions X between a closing position in which the movable body is located while the container-side door grasped by the opener-side door closes the opening of the container body and a detaching position which the movable body reaches after moved a preset distance A in the forward direction X1 from the closing position; and (e2) wherein the link members are further angularly displaced relative to the movable body, together with the transfer of the movable body, such that the components of the transfer direction of the connector include at least the components vertical to the forward and backward directions X, while the movable body is moved in the forward and backward directions X over an evacuating region which is further shifted in the forward direction X1 relative to the detaching position.

Due to the connection of the movable body and the connector via the plurality of link members so as to constitute a parallel link mechanism, the opener-side door which is fixed to the connector can be moved while keeping its attitude the same.

Due to the control of the angular displacement provided by the link member angular displacement means to the link members relative to the movable body together with the transfer of the movable body in the forward and backward directions while the movable body is moved between the closing position and the detaching position, the transfer direction of the connector can include at least the components of the forward and backward directions X. Consequently, the opener-side door fixed to the connector is moved in the forward and backward directions X together with the container-side door which is grasped by the opener-side door. When the movable body is moved in the forward direction X1 from the closing position to the detaching position, the container-side door grasped by the opener-side door is moved in the forward direction X1 from the container body so as to be detached from the container body. Contrary, when the movable body is moved in the backward direction X2 from the detaching position to the closing position, the container-side door grasped by the opener-side door is moved in the backward direction X2 toward the container body so as to close the opening of the container body.

Due to the angular displacement provided by the link member angular displacement means to the link members relative to the movable body together with the transfer of the movable body in the forward and backward directions X while the movable body is moved over the evacuating region, the transfer direction of the connector can include at least the components vertical to the forward and backward directions X. Consequently, the opener-side door fixed to the connector is moved in the vertical direction together with the container-side door which is grasped by the opener-side door. When the movable body is moved in the forward direction X1 over the evacuating region, the container-side door grasped by the opener-side door is moved away from the container body in the direction vertical to the forward and backward directions X so as to open the container body. Contrary, when the movable body is moved in the backward direction X2 over the evacuating region, the container-side door grasped by the opener-side door is moved to approach the container body in the direction vertical to the forward and backward directions X so as to face the container body.

In this way, the container-side door grasped by the opener-side door can be displaced and moved in the forward and backward directions as well as angularly displaced about the angular displacement axis L of the movable body, as such it can be moved in the two directions in the plane vertical to the angular displacement axis L so as to open and close the container body.

Due to the drive provided by the movable body drive means to the movable body in the forward and backward directions, the container-side door grasped by the opener-side door can be moved in the forward and backward directions X as well as in the directions vertical to the forward and backward directions X. Thus, the container-side door can be moved to approach as well as moved away from the container body so as to open and close the container body. The forward and backward directions X in which the movable body is moved are parallel to the front face direction in which the space for containing substrates is opened relative to the container body supported by the container supporting portion. With such configuration, even through the movable body is moved in the forward and backward directions, it can be moved in the vicinity of the substrate container supported by the container supporting portion, as such there is no need for providing an additional mechanism for driving the movable body to a position spaced away from the container supporting portion. Accordingly, the opener-side door drive mechanism can be located near the container supporting portion, thereby downsizing the substrate container openers. Additionally, the space defined away from the container supporting portion for supporting the substrate container in the substrate container openers can be utilized effectively.

(2) The opener-side door drive mechanism described above, wherein the link member angular displacement keeps the angle of the link members relative to the movable body constant or substantially constant, while the movable body is moved between the closing position and the detaching position, and wherein while the movable body is moved over the evacuating region, the angle of the link members relative to the movable body is increased in response to the transfer of the movable body in the forward direction X1, but the angle of the link members relative to the movable body is decreased in response to the transfer of the movable body in the backward direction X2.

While the movable body is moved between the closing position and the detaching position, the angular displacement of the link members relative to the movable body is controlled by the link member angular displacement means. Due to the control of the angular displacement of each link member, the connector, when moved in response to the movable body, is moved in the direction comprising components, all or almost all of which are those of the forward and backward directions X. Accordingly, the container-side door grasped by the opener-side door is also moved in the direction comprising components, all or almost all of which are those of the forward and backward directions X.

While the movable body is moved over the evacuating region in the forward direction X, the angle of the link members relative to the movable body is increased in response to the transfer of the movable body, thus the components of the forward and backward directions X can be reduced in the components of the transfer direction of the container-side door. Contrary, while the movable body is moved over the evacuating region in the backward direction X2, the angle of the link members relative to the movable body is decreased in response to the transfer of the movable body, thus the components of the forward and backward directions X can be reduced in the components of the transfer direction of the container-side door. Consequently, while the movable body is moved over the evacuating region in the forward and backward directions X, the container-side door can be moved to approach or moved away from the container body in the vertical or substantially vertical direction.

While the movable body is moved between the closing position and the detaching position, the container-side door is moved in the direction comprising components, all or almost all of which are those of the forward and backward directions X. Thus, when the container-side door is moved to approach or moved away from the container body in the forward and backward directions X, interference of the container-side door with the opening of the container body and the front face wall formed in the substrate container opener can be prevented, as such the container-side door can be smoothly moved to approach and moved away from the container body.

While the movable body is moved over the evacuating region in the forward and backward directions X, the container-side door is moved to approach or moved away from in the vertical or substantially vertical direction relative to the container body. In this way, undesired movement of the container-side door in the forward and backward directions X can be suppressed, thus reducing the operational region of the container-side door extending in the forward and backward directions X, thereby decreasing the size in the forward and backward directions X of the movable space required for opening and closing the container body. With such configuration, interference of the container-side door and the opener-side door with other units arranged in the substrate transfer apparatus, for example, a robot for carrying a substrate, can be prevented.

(3) The opener-side door drive mechanism described above, wherein the forward and backward directions X and the angular displacement axis L extend in the horizontal or substantially horizontal direction, and wherein the link member angular displacement means angularly displaces the link members downward relative to the movable body in response to the transfer of the movable body over the evacuating region in the forward direction X1, and angularly displaces the link members upward relative to the movable body in response to the transfer of the movable body over the evacuating region in the backward direction X2.

Due to the horizontal or substantially horizontal extension of the forward and backward directions, the connector can be moved along a track extending in the horizontal or substantially horizontal direction while the movable body is moved between the closing position and the detaching position. Due to the downward angular displacement of the link members relative to the movable body in response to the transfer of the movable body over the evacuating region in the forward direction X1, when the movable body is moved over the evacuating region in the forward direction X1, the connector is moved downward along a track extending in the vertical or substantially vertical direction. Due to the upward angular displacement of the link members relative to the movable body in response to the transfer of the movable body over the evacuating region in the backward direction X2, when the movable body is moved over the evacuating region in the backward direction X2, the connector is moved upward along a track extending in the vertical or substantially vertical direction.

In this manner, when the container body is opened, the container-side door is moved in the forward direction X1 along a horizontal or substantially horizontal track, and is then moved downward along a vertical or substantially vertical track. When the container body is closed, the container-side door is moved upward along a vertical or substantially vertical track, and is then moved in the backward direction X2 along a horizontal or substantially horizontal track.

When the container body is opened, the container-side door is detached from the container body while drawing a horizontal or substantially horizontal track, and is then moved away form the container body while drawing a vertical or substantially vertical track. When the container body is closed, the container-side door is moved to approach the container body while drawing a vertical or substantially vertical track and being spaced away from the container body, and after the approach, the container-side door is in contact with the container body while drawing a horizontal or substantially horizontal track. In this way, due to the opening of the container body by moving the container-side door below the container body, the air flow can be controlled to flow from above to below even when the air flow is disturbed upon opening and closing the container, thus the possibility of dust particles to be attached to the substrate, container body and robot can be reduced, thereby preventing contamination of the substrate upon carrying in and carrying out of the substrate.

(4) The opener-side door drive mechanism described above, wherein the movable body drive means, link member angular displacement means and movable body are supported by the container supporting portion.

Due to the support of the movable body drive means, link member angular displacement means and movable body by using the container supporting portion which constitutes a part of the substrate container opener, the container supporting portion can also be used as a supporting portion of the opener-side door drive mechanism, for supporting the movable body drive means, link member angular displacement means and movable body, thus there is no need for separately providing a portion for supporting each constructional elements constituting the opener-side door drive mechanism, thereby reducing the number of parts.

Due to the support of the movable body drive means, link member angular displacement means and movable body by using the container supporting portion, there is no need for separately providing a portion for supporting the movable body drive means and the movable body, as such reducing the number of parts for constituting the substrate container opener. Consequently, the substrate container opener can be further downsized, and the structure can be simplified, thereby reducing the production cost of the substrate container opener. For example, with the container supporting portion which supports each constructional element for constituting the opener-side door drive mechanism, it is not necessary for the front face wall formed in the substrate container opener to fix and support each constitutional element of the opener-side door drive mechanism, as such the front face wall can be downsized and the rigidity of the front face wall can be lowered, thereby reducing the production cost of the substrate container opener.

(5) The opener-side door drive mechanism described above,
wherein the link member angular displacement means comprises:
engaging portions provided in either of the link members; and
controlling portions adapted to control the angular position of the engaging portions relative to the movable body in response to the position in the forward and backward directions of the movable body.

Due to the engagement of the engaging portions with the controlling portions, the angular displacement of each link member about the angular displacement axis L set at the movable body can be prevented for each position in the forward and backward directions of the movable body. For example, when the movable body is in a first position in the forward and backward directions, the angular displacement is controlled at an angular position about the angular displacement axis, corresponding to the first position in the forward and backward directions, while the engaging portions are guided by the controlling portions. For example, when the movable body is in a second position in the forward and backward directions, the angular displacement is controlled at another angular position about the angular displacement axis, corresponding to the second position in the forward and backward directions, while the engaging portions are guided by the controlling portions. In this way, with the link member angular displacement means including the engaging portions and the controlling portions, the angular displacement of the link members relative to the movable body can be set at a desired value, together with the transfer in the forward and backward directions of the movable body, without need for an additional drive source.

With the link member angular displacement means including the engaging portions and the controlling portions, the angular displacement of the link members relative to the movable body can be controlled, without need for a separate drive source. Consequently, only by moving the movable body in the forward and backward directions due to the movable body drive means, the link members can be angularly displaced together with the transfer of the movable body. Thus, the construction of the substrate container opener can be further simplified.

(6) The opener-side door drive mechanism described above,
wherein the movable body drive means is adapted to displace and drive the movable body in the forward and backward directions X by using the power of the substrate container drive means for displacing and driving the substrate container in the forward and backward directions X, the substrate container constituting a part of the substrate container opener and being supported by the container supporting portion.

The substrate container drive means drives the substrate container in the forward and backward directions X via a table portion or the like means. The movable body drive means drives the movable body in the forward and backward directions X. The substrate container drive means and the movable body drive means are common in driving an object in the forward and backward directions X. Accordingly, by providing a switching means for transmitting or switching power to drive an object in the forward and backward directions X to either of the table portion or movable body, the movable body drive means can be provided by using the substrate container drive means.

By providing the movable body drive means by using the substrate container drive means adapted to move the substrate container in the forward and backward directions X via a table portion or the like means, there is no need for use of two drive source: i.e., the drive source for displacing and driving the movable body and the drive source for displacing and driving the substrate container, as such the substrate container drive means and the movable body drive means can be realized by using a single drive source, thereby reducing the number of drive sources for the substrate container opener. Consequently, the substrate container opener can be downsized and the structure can be simplified.

(7) A substrate container opener, comprising:
a front face wall in which an opener opening is formed extending through the front face wall in the thickness direction;
a container supporting portion adapted to position and support a container body in an attaching position where an opening of the container body contacts with the opener opening of the front face wall along the circumferential direction;
an opener-side door which includes an attaching and detaching mechanism which can attach or detach a container-side door to or from the container body positioned and supported in the attaching position by the container supporting portion, and includes a grasping mechanism which can grasp the removed container-side door, so as to close the opener-side opening; and
an opener-side door drive mechanism which can displace and drive the opener-side door grasping the container-side door.

The provision of the configuration described above to the opener-side door drive mechanism of the substrate container opener can achieve such a substrate container opener that can open end close the container body, by moving the movable body in the forward and backward directions X.

The incorporation of the opener-side door drive mechanism described above into the substrate container opener can achieve downsizing. A space positioned away from the container supporting portion in the direction vertical to the forward and backward directions X can be effectively utilized. The front face wall which is closely contacted with the substrate container positioned and supported in the substrate container opener can be downsized, thereby reducing the production cost of the substrate transfer apparatus.

(8) A substrate transfer apparatus which constitutes a part of a substrate transfer apparatus adapted to carry in and carry out substrates relative to a substrate manufacturing apparatus for processing substrates in a predetermined atmosphere, comprising a substrate container opener.

The provision of this configuration of the opener-side door drive mechanism to the substrate container opener can achieve such a substrate transfer apparatus including the substrate container opener that can open end close the container body by moving the movable body in the forward and backward directions X.

The incorporation of such a substrate container opener including the opener-side door drive mechanism described above into the substrate transfer apparatus can achieve downsizing associated with the downsizing of the substrate container opener. In addition, a space positioned away from the container supporting portion in the direction vertical to the forward and backward directions X can be effectively utilized.

In the present invention, the following aspects can be applied.

(9) A method for assembling a substrate transfer apparatus which is configured to include a robot and a substrate container holding portion, and adapted to carry in and carry out substrates relative to a substrate processing apparatus for processing substrates in a predetermined atmosphere, comprising the steps of:
forming a carrier unit by fixing the robot and the substrate container holding portion, which constitute the substrate transfer apparatus, integrally, to a divided body, which constitutes a part of the substrate transfer apparatus and is formed detachably to a main body constituting member which is the remainder of the substrate transfer apparatus except for the divided body;
checking whether the robot fixed to the carrier unit can be operated as a part of the substrate transfer apparatus; and
attaching the carrier unit to the main body constituting member of the substrate transfer apparatus after the step of checking the operation.

In the step of forming the carrier unit, the carrier unit is formed by fixing at least the robot and the substrate container holding portion, integrally, to the divided body which is separated from the main body constituting member. Before assembling them into the substrate transfer apparatus, whether the robot fixed to the carrier unit can be operated as a part of the substrate transfer apparatus is checked in the step of checking the operation. When abilities required as a part of the substrate transfer apparatus can be found, the procedure goes to the attaching step. In the attaching step, the carrier unit having passed through the step of checking the operation is attached integrally to the main body constituting member so as to complete the substrate transfer apparatus.

In the step of forming the carrier unit, the mutual positional relationships between the robot and the substrate container holding portion can be adjusted, before assembling them into the substrate transfer apparatus, by aligning the robot and the substrate container holding portion with the divided body. In addition, before assembling them into the substrate transfer apparatus, the check of operation of the robot concerning access to the substrate container held by the substrate container holding portion can be performed.

For the units or elements constituting the substrate carrier system of the substrate transfer apparatus, i.e., the robot and the substrate container holding portion, a higher assembling accuracy is required, as well as a sever operational check should be carried out. In the present invention, as described above, the assembling accuracy required for the substrate carrier system and the quality of operation of the substrate carrier system can be confirmed before assembling. Therefore, there is no need for preparing particularly skilled persons and exclusive jigs for the alignment and operational check, at every installing site of the substrate transfer apparatus. In addition, as compared with the case where the alignment and operational check are carried out with the robot and the substrate container holding portion seated on the main body constituting member, a wider space can be ensured for carrying out these works.

Since the carrier unit and the main body constituting member are assembled into a single system with the positional adjustment and operational check for the robot and the substrate container holding portion being already carried out, the positional adjustment such as the evenness adjustment and the operational check after assembling can be simplified. In this manner, with the provision of the carrier unit already subjected to the positional adjustment and the operational check, assembling at the installing site of the substrate transfer apparatus can be simplified, thus the substrate transfer apparatus can be completed in a shorter time.

(10) The method for assembling a substrate transfer apparatus described above, wherein in the step of forming the carrier unit, the carrier unit is formed by further fixing a substrate waiting portion integrally to the divided body, at which substrate waiting portion each substrate being temporarily located by the robot.

With the further incorporation of such a substrate waiting portion into the divided body, after completion of the relative positional adjustment between the robot and the substrate waiting portion and the operational check for the robot concerning access to the substrate relative to the substrate waiting portion, the carrier unit can be attached integrally to the main body constituting member. In this way, due to the fixation of the substrate waiting portion to the divided body, the assembling work of the substrate transfer apparatus at its installing site can be further facilitated, thereby shortening the time for completing the substrate transfer apparatus. For example, the substrate waiting portion may be an aligner device for adjusting the orientation of each substrate, a measuring device for measuring the thickness of the substrate, or a buffer portion adapted for enhancing the working efficiency of carrying the substrate.

(11) The method for assembling a substrate transfer apparatus described above, wherein in the step of the operational check, the robot performs simulation for simulating the operation of the robot that is operated as a substrate transfer apparatus.

In the step of the operational check, positions of the substrate container held by the substrate container holding portion are instructed to the robot in order to perform the simulating operation. The operational check is carried out by making the robot move to each instructed position and carry out the simulating operation concerning the substrate transfer due to the robot. In this way, by performing such a simulating operation in the step of the operational check, the operational positions for a robot to be actually operated can be set by using the instructed positions for the robot used in the simulating operation, as such simplifying the work of instructing the operational positions to the robot.

(12) The method for assembling a substrate transfer apparatus described above,
wherein the step of forming the carrier unit and the step of the operational check are carried out in a robot manufacturing site in which the robot is manufactured; and
wherein the method further comprises a step of carrying the carrier unit, after the step of the operational check, to an installing site of the substrate transfer apparatus.

By carrying out the step of forming the carrier unit and the step of the operational check in a robot manufacturing site, the quality of the robot can be secured in the robot manufacturing site. Consequently, the check due to a simulating operation carried out for securing the quality of the robot in a robot manufacturing site and the operational check carried out in an installing site of the substrate transfer apparatus, which were conventionally carried out, can be gathered into a single operational check, thus reducing the time required for the entire work, thereby enhancing the working properties. In addition, the working time in the installing site for setting the substrate transfer apparatus can be reduced.

Further, by carrying out the step of forming the carrier unit and the step of the operational check in a robot manufacturing site, a skilled person in the art of the robot can carry out fixation of the robot to the divided body, alignment, instruction of operational positions to the robot and operational check for the robot. Accordingly, imperfection of each work can be prevented. Moreover, malfunctioning that may occur in each work can be addressed in its early stages.

(13) A carrier unit which constitutes a part of a substrate transfer apparatus adapted to carry in and carry out substrates relative to a substrate manufacturing apparatus for processing substrates in a predetermined atmosphere and is formed such that it can be attached to and detached from a main body constituting member which is the remainder of the substrate transfer apparatus, comprising:
a divided body formed such that it can be attached to and detached from the main body constituting member;
a robot fixed to the divided body; and
a substrate container holding portion fixed to the divided body,
wherein when the divided body is attached to the main body constituting member, the robot and the substrate container holding portion fixed to the divided body are formed such that they are located in positions to be arranged as a part of the substrate transfer apparatus, respectively.

When the divided body to which the robot and the substrate container holding portion are fixed is attached to the main body constituting member, the robot and the substrate container holding portion are located in positions to be arranged as the substrate transfer apparatus, respectively. With such configuration, alignment for the mutual positional relationship between the robot and the substrate container holding portion can be carried out before the assembling work of the substrate transfer apparatus.

The robot and the substrate container holding portion constitute together a substrate carrier system of the substrate transfer apparatus, for which a higher assembling accuracy is required. Since whether the assembling accuracy required for the substrate carrier system can be confirmed on the stage of forming the carrier unit, the work for positional adjustment after assembling the carrier unit and the main body constituting member into an integral body can be facilitated, thus the substrate transfer apparatus can be completed in a shorter time.

With the configuration enabling the carrier unit to be attached to and detached from the substrate transfer apparatus, when the substrate transfer apparatus malfunctions, the carrier unit can be separated from the main body constituting member in order to check the operation of the robot fixed to the carrier unit. Therefore, the operation can be checked with the robot and the substrate container holding portion being transferred in a wider space, thus providing easier detection and repair for the malfunctioning point.

(14) The carrier unit described above, wherein it can maintain a self-supporting attitude while being separated from the main body constituting member.

With such configuration that the carrier unit can maintain a self-supporting attitude, there is no need for providing a separate frame for stably supporting the carrier unit. Accordingly, the need for providing the frame and the labor for mounting and removing the carrier unit relative to the frame can be eliminated. Thus, the cost for providing the frame and the time required for placing and removing the carrier unit relative to the frame can be saved, thereby enhancing the working properties.

(15) The carrier unit described above, wherein the carrier unit can perform the same operation as the case in which it is operated as the substrate transfer apparatus, while being separated from the main body constituting member.

The carrier unit can perform the same operation as the case in which it is operated as the substrate transfer apparatus. Accordingly, in the case where the carrier unit is completed, the operational check for the robot concerning access to the substrate in the substrate container held by the substrate container holding portion can be carried out before assembling carrier unit as the substrate transfer apparatus. Due to the completion of the substrate transfer apparatus by attaching the carrier unit, whose operational check has been already completed, to the main body constituting member, the operational check after assembling the substrate transfer apparatus can be simplified. Consequently, the wafer transfer apparatus can be operable in a shorter time after the carrier unit is assembled as the wafer transfer apparatus.

(16) The carrier unit described above, wherein it can maintain the same attitude as the case in which the robot and the substrate container holding portion are operated as a part of the substrate transfer apparatus, while the carrier unit is separated from the main body constituting member.

The carrier unit maintains the same attitude as the case when the robot and the substrate container holding portion are operated as the substrate transfer apparatus. The term "the same attitude" is based on the attitudes of reference planes of the robot and the substrate container holding portion relative to the horizontal plane and the vertical plane. Accordingly, in the case of carrying out the operational check, there is no need for an additional frame for maintaining the carrier unit in the same attitude as the case in which it is operated as the substrate transfer apparatus. Therefore, the need for providing the frame for use in the operational check and the labor for mounting and removing the carrier unit relative to the frame can be eliminated. Thus, the cost for providing the frame for the operational check and the time required for placing and removing the carrier unit relative to the frame can be saved, thereby enhancing the working properties.

(17) The carrier unit described above, wherein attaching portions to be attached to attaching positions formed in the main body constituting member and guiding portions adapted to guide the attaching portions to the attaching positions are formed in the divided body.

Upon attaching the divided body to the main body constituting member, the divided body is guided by the guiding portions such that its attaching portions are attached to the attaching positions. Thus, the divided body and the main body constituting member can be aligned and assembled together with ease.

(18) A divided body which constitutes a part of a substrate transfer apparatus adapted to carry in and carry out substrates relative to a substrate manufacturing apparatus for processing substrates in a predetermined atmosphere and is formed such that it can be attached to and detached from a main body constituting member which is the remainder of the substrate transfer apparatus, comprising:

fixing portions to which a plurality of carrier elements are fixed, the carrier elements being included in a plurality of constitutional elements for constituting the substrate transfer apparatus, and related to the conveyance of substrates; and attaching portions which can be attached to and detached from the main body constituting member, wherein when the fixing portions are fixed to the main body constituting member, the carrier elements fixed to the fixing portions are located in positions to be arranged as the substrate transfer apparatus, respectively.

The carrier elements can be fixed to the divided body while the divided body is separated from the main body constituting element. When the divided body, to which the respective carrier elements are fixed, is attached to the main body constituting member, the carrier elements are located in positions to be arranged as the substrate transfer apparatus. For example, the carrier elements can be provided by employing a robot, FOUP openers and an aligner.

By fixing the respective carrier elements to the fixing portions of the divided body, alignment for the mutual positional relationship between the respective carrier elements can be carried out before assembling them into the substrate transfer apparatus. Accordingly, the divided body in which the respective carrier elements have been already aligned is attached to the main body constituting member so as to assemble them into the substrate transfer apparatus. Consequently, the work for adjusting the positional relationship between the respective carrier elements, after assembling the substrate transfer apparatus, can be simplified, thus the substrate transfer apparatus can be assembled in a shorter time.

What is claimed is:

1. A substrate transfer apparatus adapted to carry substrates in support of and separate from a substrate processing apparatus, the substrate transfer apparatus comprising:

a main body constituting member; and a carrier unit, the carrier unit being a separate unit from, and adapted to be detachably attached to, the main body constituting member, the carrier unit comprising:

(a) a frame body configured to be detachably attached to the main body constituting member;

(b) a robot for carrying a substrate, including a robot main body and a robot base portion to fixedly attach the robot main body to the frame body; and (c) a substrate container opener fixed to the frame body, the substrate container opener including an opener main body, and an opener base portion to fixedly attach the opener main body to the frame body, wherein the substrate transfer apparatus is an Equipment Front End Module (EFEM) comprising both the main body constituting member and the carrier unit, wherein the frame body includes a frame main body having a horizontal top face and a vertical side wall, the frame body being configured such that, when the frame body is attached to the main body constituting member, the robot and the substrate container opener, both fixed to the frame body, are respectively located in positions to be arranged as parts of the substrate transfer apparatus, the frame main body includes a robot fixing portion formed in the vertical side wall and an opener fixing portion formed in the horizontal top face, the robot base portion being fixed to the robot fixing portion, the opener base portion being fixed to the opener fixing portion, and the frame main body having a rigidity to prevent the robot base portion, in combination with a rigidity of the robot base portion itself, from being deformed beyond an allowable amount of robot deformation which is allowed upon transferring a substrate, when a force is exerted on the frame body from the robot main body via the robot base portion, the frame main body having a rigidity to prevent the opener base portion, in combination with a rigidity of the opener base portion itself, from being deformed beyond an allowable amount of opener deformation, which amount is allowed upon transferring a substrate, when a force is exerted on the frame main body from the opener main body via the opener base portion, and in a state where the carrier unit is separated from the main body constituting member, the carrier unit can perform an operation that is the same as an operation when the carrier unit is attached to the main body constituting member as a part of the substrate transfer apparatus.

2. A substrate transfer apparatus according to claim 1, wherein the robot base portion has a rigidity to allow a deformation beyond the allowable amount of robot deformation, when a force is exerted on the robot base portion from the robot main body in a state where the robot base portion is not fixed to the frame body.

3. A substrate transfer apparatus according to claim 1, wherein the substrate container opener includes an opener main body and an opener base portion adapted to fix the opener main body to the frame body, the opener base portion allowing a force exerted from the opener main body to the opener base portion to be transmitted to the frame body, and wherein the frame body has a rigidity to prevent the opener base portion from being deformed beyond an allowable amount of opener deformation which is allowed upon transferring a substrate, when a force is exerted on the frame body from the opener main body via the opener base portion.

4. A substrate transfer apparatus according to claim 3, wherein the opener base portion has a rigidity to allow a deformation beyond the allowable amount of opener deformation, when a force is exerted on the opener base portion from the opener main body in a state where the opener base portion is not fixed to the frame body.

5. A substrate transfer apparatus according to claim 3, wherein the opener main body has a container supporting portion adapted to support a substrate container in which substrates are contained.

6. A substrate transfer apparatus according to claim 5, wherein the frame body has a side face which is flush with a side face of the container supporting portion exposed into an external space of the substrate transfer apparatus.

7. A substrate transfer apparatus according to claim 1, wherein the robot and the substrate container opener are configured to be detachably attached to the frame body.

8. A substrate transfer apparatus according to claim 1, wherein the robot base portion is fixed to a vertically extending face of the frame body.

9. A substrate transfer apparatus according to claim 1, further comprising a partitioning body adapted to separate a movable space where a movable portion of the robot, which is movable relative to the frame body, is located, from a fixing space where the robot base portion, which is fixed to the frame body, is located, when the frame body is attached to the main body constituting member.

10. A substrate transfer apparatus according to claim 9, wherein the frame body has an accessing door formed therein so that an external space of the substrate processing apparatus and the fixing space are in direct communication with each other when the accessing door is opened while the frame body is attached to the main body constituting member.

11. A substrate transfer apparatus according to claim 10, wherein in the fixing space, an adjusting means for adjusting the substrate transfer apparatus is located adjacent to an opening of the accessing door.

12. A substrate transfer apparatus according to claim 1, further comprising a support means attached to the frame main body for permitting the carrier unit to be self-supported.

13. A substrate transfer apparatus according to claim 1, wherein the main body constituting member is not adapted to perform wafer processing.

14. A substrate transfer apparatus according to claim 1, wherein the main body constituting member is sandwiched between the carrier unit and the substrate processing apparatus when the carrier unit is in an attached state.

15. A substrate transfer apparatus according to claim 1, wherein the main body constituting member is attached to the substrate processing apparatus, the main body constituting member providing a ready space separate from an outside air.

16. A substrate transfer apparatus according to claim 1, wherein the frame main body is formed into a cubic box.

17. A substrate transfer apparatus according to claim 1, wherein the robot base portion extends from an upper end of the robot fixing portion to a lower end of the robot fixing portion.

18. A substrate transfer apparatus according to claim 1, wherein the opener base portion has a rigidity to allow a deformation beyond the allowable amount of opener deformation, when a force is exerted on the opener base portion from the opener main body in a state where the opener base portion is not fixed to the frame body.

19. A substrate transfer apparatus adapted to carry substrates in support of and separate from a substrate processing apparatus, the substrate transfer apparatus comprising:

a main body constituting member; and a carrier unit, the carrier unit being a separate unit from, and adapted to be detachably attached to, the main body constituting member, the carrier unit comprising:

(a) a frame body configured to be detachably attached to the main body constituting member;

(b) a robot for carrying a substrate, including a robot main body and a robot base portion to fixedly attach the robot main body to a side surface of the frame body; and (c) a substrate container opener fixed to the frame body, wherein the substrate transfer apparatus is an Equipment Front End Module (EFEM) comprising both the main body constituting member and the carrier unit, the frame body is configured such that, when the frame body is attached to the main body constituting member, the robot and the substrate container opener, both fixed to the frame body, are respectively located in positions to be arranged as parts of the substrate transfer apparatus, the frame body has a rigidity to prevent the robot base portion, in combination with a rigidity of the robot base portion itself, from being deformed beyond an allowable amount of robot deformation which is allowed upon transferring a substrate, when a force is exerted on the frame body from the robot main body via the robot base portion, and in a state where the carrier unit is separated from the main body constituting member, the carrier unit is self-supporting, and the carrier unit can perform an operation that is the same as an operation when the carrier unit is attached to the main body constituting member as a part of the substrate transfer apparatus.

20. The substrate transfer apparatus according to claim 19, the frame divided body comprising a skeleton including a plurality of rod-like members connected into a frame-like structure.

21. A substrate transfer apparatus according to claim 19, the frame body further comprising a frame main body, the frame main body being formed to have a box-like structure.

* * * * *